US012804287B2

(12) United States Patent
Kale

(10) Patent No.: US 12,804,287 B2
(45) **Date of Patent: *Nov. 17, 2026**

(54) MONITORING OF USER-SELECTED CONDITIONS

(71) Applicant: Micron Technology, Inc., Boise, ID (US)

(72) Inventor: Poorna Kale, Folsom, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/756,369

(22) Filed: Jun. 27, 2024

(65) Prior Publication Data

US 2024/0357256 A1 Oct. 24, 2024

Related U.S. Application Data

(63) Continuation of application No. 17/940,955, filed on Sep. 8, 2022, now Pat. No. 12,028,638.

(51) Int. Cl.
*H04N 25/771* (2023.01)
*G06N 3/08* (2023.01)
(Continued)

(52) U.S. Cl.
CPC ............ *H04N 25/771* (2023.01); *G06N 3/08* (2013.01); *G06V 10/764* (2022.01); *G06V 10/82* (2022.01); *G06V 10/945* (2022.01); *G11C 7/1096* (2013.01); *G11C 11/54* (2013.01); *G06V 2201/10* (2022.01)

(58) Field of Classification Search
CPC ...... H04N 25/771; G06N 3/08; G06V 10/764; G06V 10/82; G06V 10/945; G06V 2201/10; G11C 7/1096; G11C 11/54
See application file for complete search history.

(56) References Cited

U.S. PATENT DOCUMENTS 12,028,638 B2 * 7/2024 Kale ........................ G11C 11/54
2014/0036106 A1 * 2/2014 Ouchi .................... H04N 23/88 348/224.1

(Continued)

OTHER PUBLICATIONS

U.S. Appl. No. 17/940,855, filed Sep. 8, 2022, Jun. 12, 2024, Patented Case, Poorna Kale.

*Primary Examiner* — Sinh Tran
(74) *Attorney, Agent, or Firm* — Greenberg Traurig

(57) ABSTRACT

A method for a digital camera adaptable to monitor a scene to detect a condition of interest to a user. The digital camera can program, in a first mode, first memory cells according to first weight matrices to classify images captured by the digital camera. Second memory cells are programmed in a second mode to store data representative of the images. The digital camera can perform operations of multiplication and accumulation using the first memory cells to compute first classifications of the images. In response to mismatches between the first classifications and second classifications identified by the user for the images, the digital camera can execute instructions to determine second weight matrices and program, in the first mode, third memory cells, according to the second weight matrices for improved capability in detecting the condition represented by image classifications in a predetermined category.

18 Claims, 22 Drawing Sheets

(51) Int. Cl.

| | |
|---|---|
| ***G06V 10/764*** | (2022.01) |
| ***G06V 10/82*** | (2022.01) |
| ***G06V 10/94*** | (2022.01) |
| ***G11C 7/10*** | (2006.01) |
| ***G11C 11/54*** | (2006.01) |

(56) References Cited

U.S. PATENT DOCUMENTS

| | | | | |
|---|---|---|---|---|
| 2020/0034686 | A1 | 1/2020 | Chiu et al. | |
| 2020/0349216 | A1 * | 11/2020 | Das Sarma | G06F 7/5443 |
| 2021/0150323 | A1 * | 5/2021 | Turek | G06N 3/063 |
| 2021/0256376 | A1 * | 8/2021 | Vogel | G06N 3/063 |
| 2024/0089634 | A1 | 3/2024 | Kale | |

* cited by examiner

MONITORING OF USER-SELECTED CONDITIONS

RELATED APPLICATIONS

The present application is a continuation application of U.S. patent application Ser. No. 17/940,955 filed Sep. 8, 2022 and issued as U.S. Pat. No. 12,028,638 on Jul. 2, 2024, the entire disclosures of which application are hereby incorporated herein by reference.

TECHNICAL FIELD

At least some embodiments disclosed herein relate to monitoring using digital cameras in general and more particularly, but not limited to, using cameras having multiplication and accumulation circuits.

BACKGROUND

Image sensors can generate large amounts of data. It is inefficient to transmit image data from the image sensors to general-purpose microprocessors (e.g., central processing units (CPU)) for processing for some applications, such as image segmentation, object recognition, feature extraction, etc.

Some image processing can include intensive computations involving multiplications of columns or matrices of elements for accumulation. Some specialized circuits have been developed for the acceleration of multiplication and accumulation operations. For example, a multiplier-accumulator (MAC unit) can be implemented using a set of parallel computing logic circuits to achieve a computation performance higher than general-purpose microprocessors. For example, a multiplier-accumulator (MAC unit) can be implemented using a memristor crossbar.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
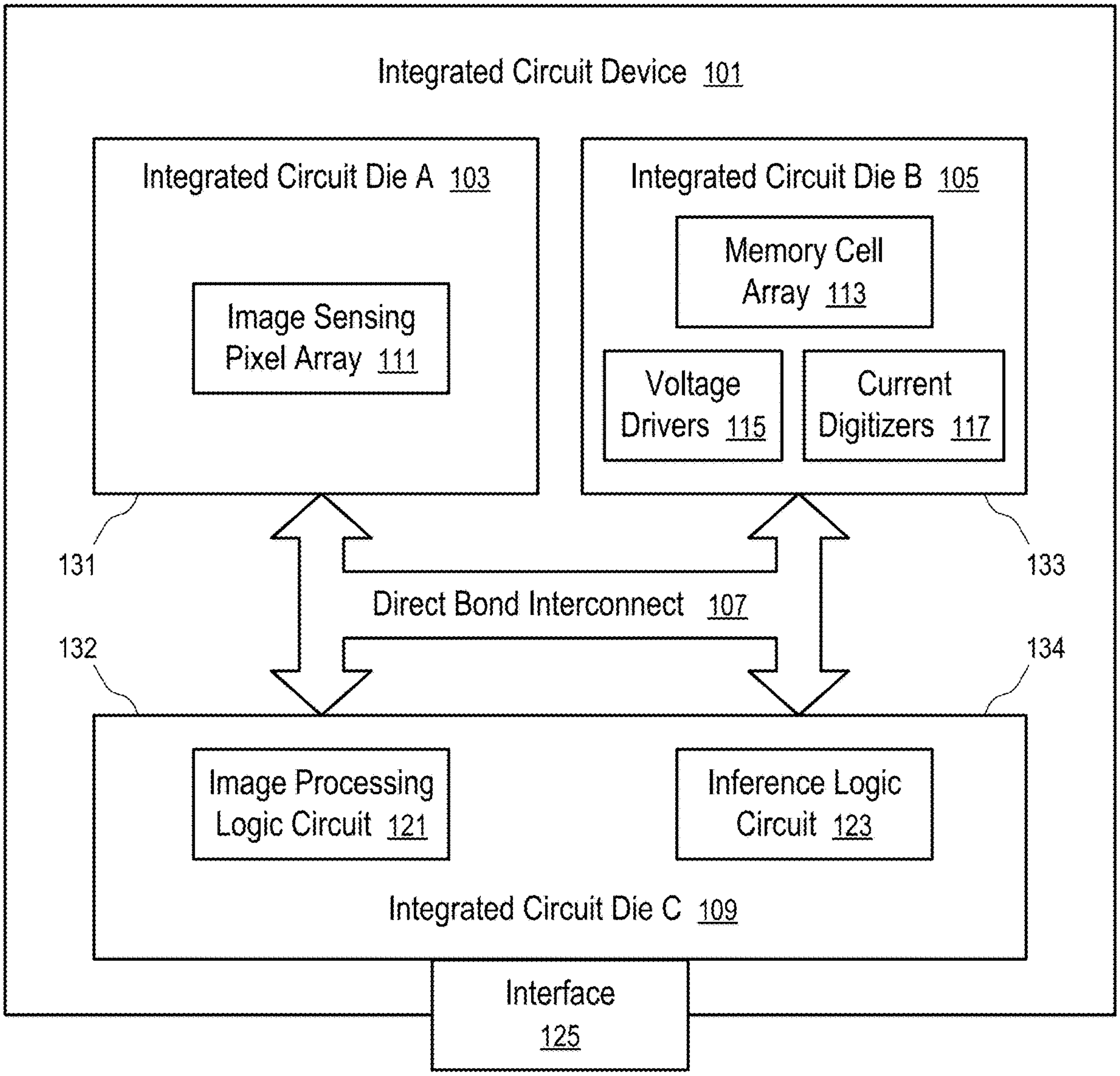
FIG. 1 shows an integrated circuit device having an image sensing pixel array, a memory cell array, and circuits to perform inference computations according to one embodiment.

At least some embodiments disclosed herein provide techniques of implementing computations of artificial neural networks to process images using integrated circuit devices. Such integrated circuit devices can have image sensing pixel arrays, memory cell arrays, and circuits to use the memory cell arrays to perform inference computation on image data from the image sensing pixel arrays.

For example, an image sensor can be configured with an analog capability to support inference computations, such as computations of an artificial neural network. Such an image sensor can be implemented as an integrated circuit device having an image sensor chip and a memory chip bonded to a logic wafer. The memory chip can have a 3D memory array configured to support multiplication and accumulation operations.

The memory chip can be connected directly to a portion of the logic wafer via heterogeneous direct bonding, also known as hybrid bonding or copper hybrid bonding.

Direct bonding is a type of chemical bonding between two surfaces of material meeting various requirements. Direct bonding of wafers typically includes pre-processing wafers, pre-bonding the wafers at room temperature, and annealing at elevated temperatures. For example, direct bonding can be used to join two wafers of a same material (e.g., silicon); anodic bonding can be used to join two wafers of different materials (e.g., silicon and borosilicate glass); eutectic bonding can be used to form a bonding layer of eutectic alloy based on silicon combining with metal to form a eutectic alloy.

Hybrid bonding can be used to join two surfaces having metal and dielectric material to form a dielectric bond with an embedded metal interconnect from the two surfaces. The hybrid bonding can be based on adhesives, direct bonding of a same dielectric material, anodic bonding of different dielectric materials, eutectic bonding, thermocompression bonding of materials, or other techniques, or any combination thereof.

Copper microbump is a traditional technique to connect dies at packaging level. Tiny metal bumps can be formed on dies as microbumps and connected for assembling into an integrated circuit package. It is difficult to use microbumps for high density connections at a small pitch (e.g., 10 micrometers). Hybrid bonding can be used to implement connections at such a small pitch not feasible via microbumps.

The image sensor chip can be configured on another portion of the logic wafer and connected via hybrid bonding (or a more conventional approach, such as microbumps).

In one configuration, the image sensor chip and the memory chip are placed side by side on the top of the logic wafer. Alternatively, the image sensor chip is connected to one side of the logic wafer (e.g., top surface); and the memory chip is connected to the other side of the logic wafer (e.g., bottom surface).

The logic wafer has a logic circuit configured to process images from the image sensor chip, and another logic circuit configured to operate the memory cells in the memory chip to perform multiplications and accumulation operations.

The memory chip can have multiple layers of memory cells. Each memory cell can be programmed to store a bit of a binary representation of an integer weight. Each input line can be applied a voltage according to a bit of an integer. Columns of memory cells can be used to store bits of a weight matrix; and a set of input lines can be used to control voltage drivers to apply read voltages on rows of memory cells according to bits of an input vector.

The threshold voltage of a memory cell used for multiplication and accumulation operations can be programmed such that the current going through the memory cell subjecting to a predetermined read voltage is either a predetermined amount representing a value of one stored in the memory cell, or negligible to represent a value of zero stored in the memory cell. When the predetermined read voltage is not applied, the current going through the memory cell is negligible regardless of the value stored in the memory cell. As a result of the configuration, the current going through the memory cell corresponds to the result of 1-bit weight, as stored in the memory cell, multiplied by 1-bit input, corresponding to the presence or the absence of the predetermined read voltage driven by a voltage driver controlled by the 1-bit input. Output currents of the memory cells, representing the results of a column of 1-bit weights stored in the memory cells and multiplied by a column of 1-bit inputs respective, are connected to a common line for summation. The summed current in the common line is a multiple of the predetermined amount; and the multiples can be digitized and determined using an analog to digital converter. Such results of 1-bit to 1-bit multiplications and accumulations can be performed for different significant bits of weights and different significant bits of inputs. The results for different significant bits can be shifted to apply the weights of the respective significant bits for summation to obtain the results of multiplications of multi-bit weights and multi-bit inputs with accumulation, as further discussed below.

Using the capability of performing multiplication and accumulation operations implemented via memory cell arrays, the logic circuit in the logic wafer can be configured to perform inference computations, such as the computation of an artificial neural network.

FIG. 1 shows an integrated circuit device 101 having an image sensing pixel array 111, a memory cell array 113, and circuits to perform inference computations according to one embodiment.

In FIG. 1, the integrated circuit device 101 has an integrated circuit die 109 having logic circuits 121 and 123, an integrated circuit die 103 having the image sensing pixel array 111, and an integrated circuit die 105 having a memory cell array 113.

The integrated circuit die 109 having logic circuits 121 and 123 can be considered a logic chip; the integrated circuit die 103 having the image sensing pixel array 111 can be considered an image sensor chip; and the integrated circuit die 105 having the memory cell array 113 can be considered a memory chip.

Figure 4:
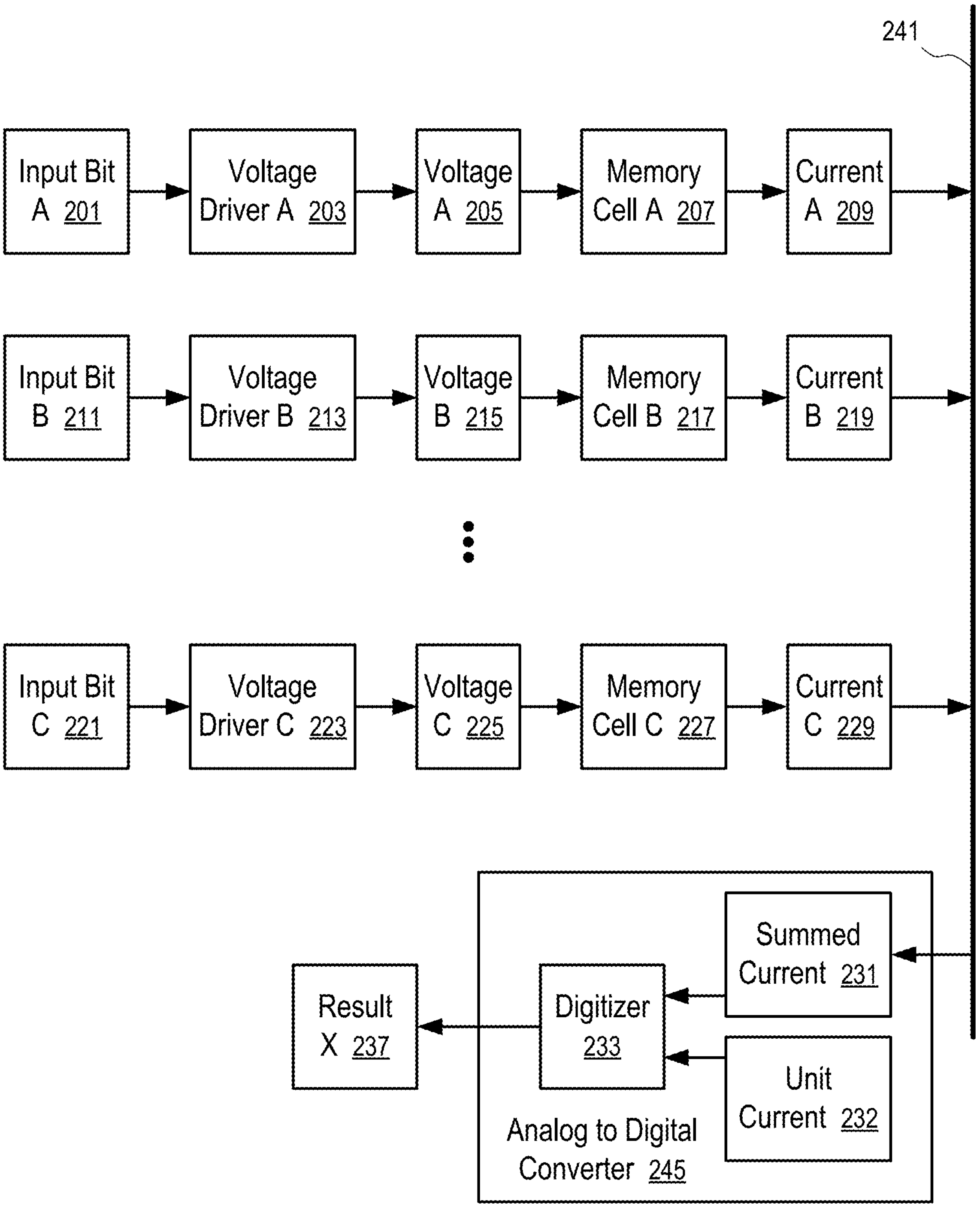
FIG. 4 shows the computation of a column of weight bits multiplied by a column of input bits to provide an accumulation result according to one embodiment.
Figure 5:
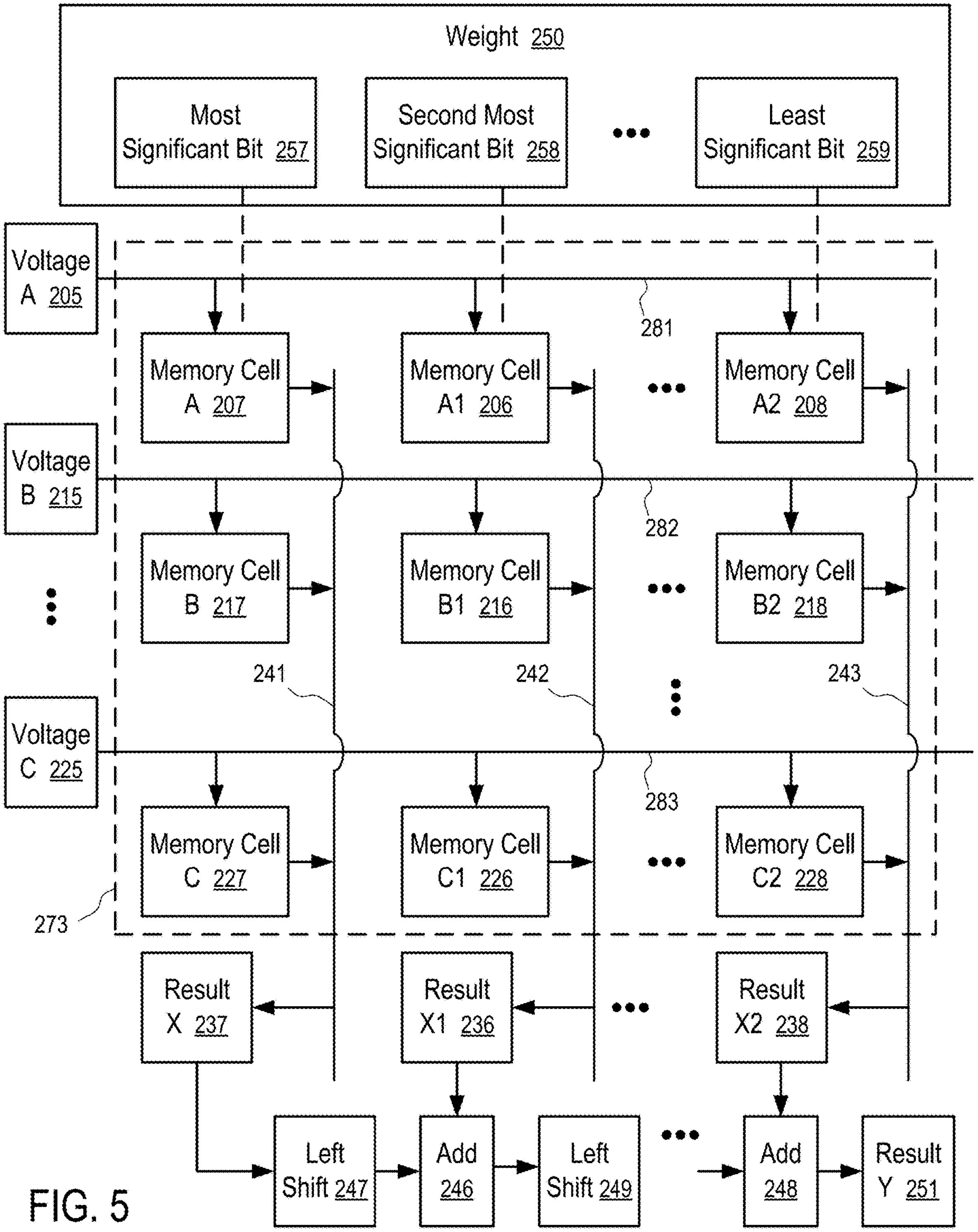
FIG. 5 shows the computation of a column of multi-bit weights multiplied by a column of input bits to provide an accumulation result according to one embodiment.

In FIG. 1, the integrated circuit die 105 having the memory cell array 113 further includes voltage drivers 115 and current digitizers 117. The memory cell array 113 are connected such that currents generated by the memory cells in response to voltages applied by the voltage drivers 115 are summed in the array 113 for columns of memory cells (e.g., as illustrated in FIG. 4 and FIG. 5); and the summed currents are digitized to generate the sum of bit-wise multiplications. The inference logic circuit 123 can be configured to instruct the voltage drivers 115 to apply read voltages according to a column of inputs, perform shifts and summations to generate the results of a column or matrix of weights multiplied by the column of inputs with accumulation.

The inference logic circuit 123 can be further configured to perform inference computations according to weights stored in the memory cell array 113 (e.g., the computation of an artificial neural network) and inputs derived from the image data generated by the image sensing pixel array 111. Optionally, the inference logic circuit 123 can include a programmable processor that can execute a set of instructions to control the inference computation. Alternatively, the inference computation is configured for a particular artificial neural network with certain aspects adjustable via weights stored in the memory cell array 113. Optionally, the inference logic circuit 123 is implemented via an application-specific integrated circuit (ASIC), a field-programmable gate array (FPGA), or a core of a programmable microprocessor.

In FIG. 1, the integrated circuit die 105 having the memory cell array 113 has a bottom surface 133; and the integrated circuit die 109 having the inference logic circuit 123 has a portion of a top surface 134. The two surfaces 133 and 134 can be connected via hybrid bonding to provide a portion of a direct bond interconnect 107 between the metal portions on the surfaces 133 and 134.

Similarly, the integrated circuit die 103 having the image sensing pixel array 111 has a bottom surface 131; and the integrated circuit die 109 having the inference logic circuit 123 has another portion of its top surface 132. The two surfaces 131 and 132 can be connected via hybrid bonding to provide a portion of the direct bond interconnect 107 between the metal portions on the surfaces 131 and 132.

An image sensing pixel in the array 111 can include a light sensitive element configured to generate a signal responsive to intensity of light received in the element. For example, an image sensing pixel implemented using a complementary metal-oxide-semiconductor (CMOS) technique or a charge-coupled device (CCD) technique can be used.

In some implementations, the image processing logic circuit 121 is configured to pre-process an image from the image sensing pixel array 111 to provide a processed image as an input to the inference computation controlled by the inference logic circuit 123.

Optionally, the image processing logic circuit 121 can also use the multiplication and accumulation function provided via the memory cell array 113.

In some implementations, the direct bond interconnect 107 includes wires for writing image data from the image sensing pixel array 111 to a portion of the memory cell array 113 for further processing by the image processing logic circuit 121 or the inference logic circuit 123, or for retrieval via an interface 125.

The inference logic circuit 123 can buffer the result of inference computations in a portion of the memory cell array 113.

The interface 125 of the integrated circuit device 101 can be configured to support a memory access protocol, or a storage access protocol or any combination thereof. Thus, an external device (e.g., a processor, a central processing unit) can send commands to the interface 125 to access the storage capacity provided by the memory cell array 113.

For example, the interface 125 can be configured to support a connection and communication protocol on a computer bus, such as a peripheral component interconnect express (PCIe) bus, a serial advanced technology attachment (SATA) bus, a universal serial bus (USB) bus, a compute express link, etc. In some embodiments, the interface 125 can be configured to include an interface of a solid-state drive (SSD), such as a ball grid array (BGA) SSD. In some embodiments, the interface 125 is configured to include an interface of a memory module, such as a double data rate (DDR) memory module, a dual in-line memory module, etc. The interface 125 can be configured to support a communication protocol such as a protocol according to non-volatile memory express (NVMe), non-volatile memory host controller interface specification (NVMHCIS), etc.

The integrated circuit device 101 can appear to be a memory sub-system from the point of view of a device in communication with the interface 125. Through the interface 125 an external device (e.g., a processor, a central processing unit) can access the storage capacity of the memory cell array 113. For example, the external device can store and update weight matrices and instructions for the inference logic circuit 123, retrieve images generated by the image sensing pixel array 111 and processed by the image processing logic circuit 121, and retrieve results of inference computations controlled by the inference logic circuit 123.

Figure 2:
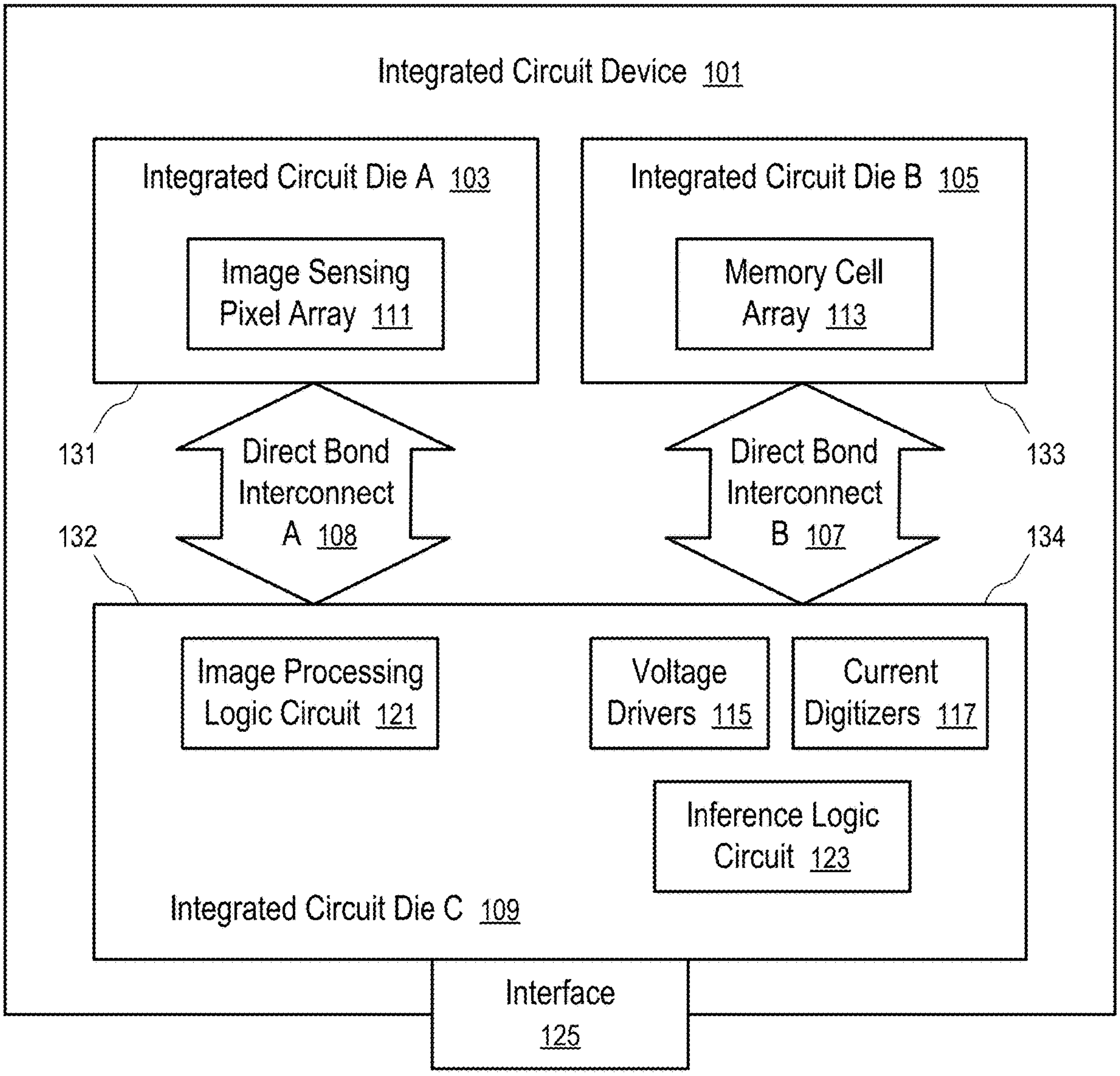
FIG. 2 and FIG. 3 illustrate different configurations of integrated imaging and inference devices according to some embodiments.

In some implementations, some of the circuits (e.g., voltage drivers 115, or current digitizers 117, or both) are implemented in the integrated circuit die 109 having the inference logic circuit 123, as illustrated in FIG. 2.

In FIG. 1, the image sensor chip and the memory chip are placed side by side on the same side (e.g., top side) of the logic chip. Alternatively, the image sensor chip and the memory chip can be placed on different sides (e.g., top surface and bottom surface) of the logic chip, as illustrated in FIG. 3.

Figure 3:
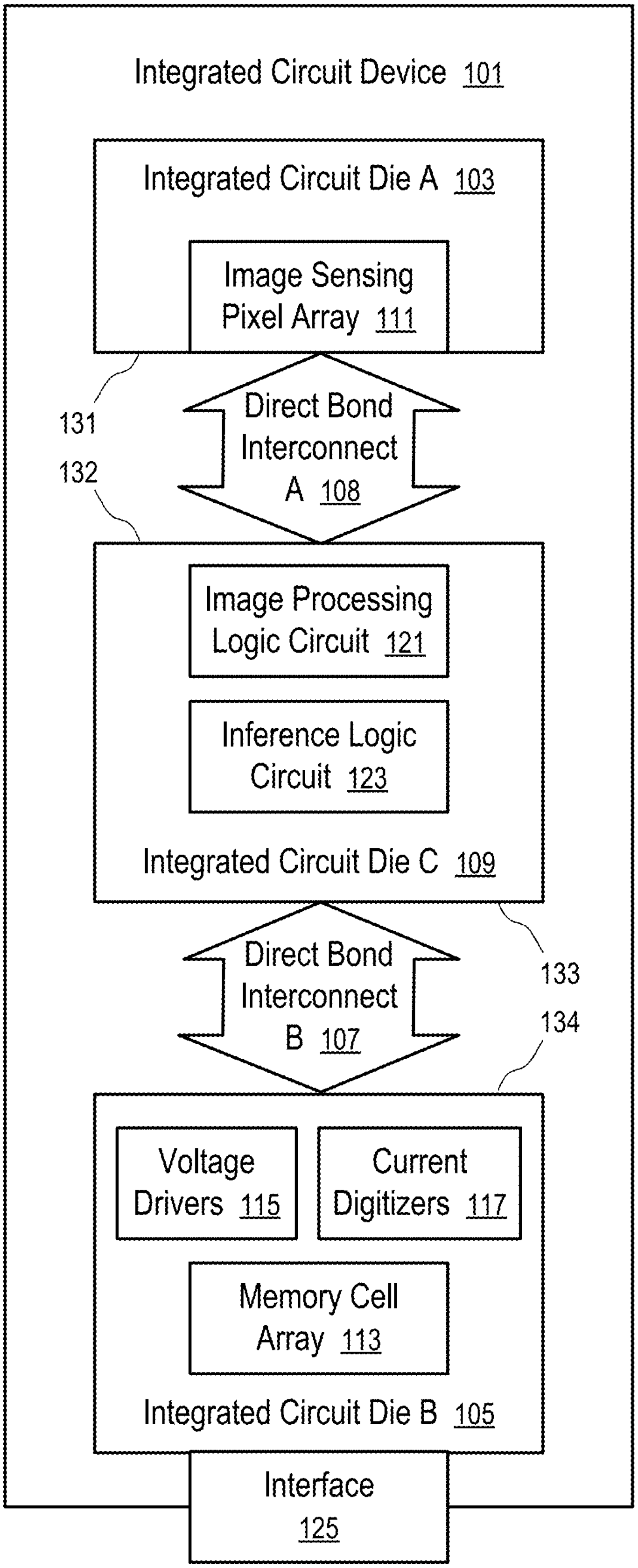

FIG. 2 and FIG. 3 illustrate different configurations of integrated imaging and inference devices according to some embodiments.

Similar to the integrated circuit device 101 of FIG. 1, the device 101 in FIG. 2 and FIG. 3 can also have an integrated circuit die 109 having image processing logic circuits 121 and inference logic circuit 123, an integrated circuit die 103 having an image sensing pixel array 111, and an integrated circuit die 105 having a memory cell array 113.

However, in FIG. 2, the voltage drivers 115 and current digitizers 117 are configured in the integrated circuit die 109 having the inference logic circuit 123. Thus, the integrated circuit die 105 of the memory cell array 113 can be manufactured to contain memory cells and wire connections without added complications of voltage drivers 115 and current digitizers 117.

In FIG. 2, a direct bond interconnect 108 connects the image sensing pixel array 111 to the image processing logic circuit 121. Alternatively, microbumps can be used to connect the image sensing pixel array 111 to the image processing logic circuit 121.

In FIG. 2, another direct bond interconnect 107 connects the memory cell array 113 to the voltage drivers 115 and the current digitizers 117. Since the direct bond interconnects 107 and 108 are separate from each other, the image sensor chip may not write image data directly into the memory chip without going through the logic circuits in the logic chip. Alternatively, a direct bond interconnect 107 as illustrated in FIG. 1 can be configured to allow the image sensor chip to write image data directly into the memory chip without going through the logic circuits in the logic chip.

Optionally, some of the voltage drivers 115, the current digitizers 117, and the inference logic circuits 123 can be configured in the memory chip, while the remaining portion is configured in the logic chip.

FIG. 1 and FIG. 2 illustrate configurations where the memory chip and the image sensor chip are placed side-by-side on the logic chip. During manufacturing of the integrated circuit devices 101, memory chips and image sensor chips can be placed on a surface of a logic wafer containing the circuits of the logic chips to apply hybrid bonding. The memory chips and image sensor chips can be combined to the logic wafer at the same time. Subsequently, the logic wafer having the attached memory chips and image sensor chips can be divided into chips of the integrated circuit devices (e.g., 101).

Alternatively, as in FIG. 3, the image sensor chip and the memory chip are placed on different sides of the logic chip.

In FIG. 3, the image sensor chip is connected to the logic chip via a direct bond interconnect 108 on the top surface 132 of the logic chip. Alternatively, microbumps can be used to connect the image sensor chip to the logic chip. The memory chip is connected to the logic chip via a direct bond interconnect 107 on the bottom surface 133 of the logic chip. During the manufacturing of the integrated circuit devices 101, an image sensor wafer can be attached to, bonded to, or combined with the top surface of the logic wafer in a process/operation; and the memory wafer can be attached to, bonded to, or combined with the bottom side of the logic wafer in another process. The combined wafers can be divided into chips of the integrated circuit devices 101.

FIG. 3 illustrates a configuration in which the voltage drivers 115 and current digitizers 117 are configured in the memory chip having the memory cell array 113. Alternatively, some of the voltage drivers 115, the current digitizers 117, and the inference logic circuit 123 are configured in the memory chip, while the remaining portion is configured in the logic chip disposed between the image sensor chip and the memory chip. In other implementations, the voltage drivers 115, the current digitizers 117, and the inference logic circuit 123 are configured in the logic chip, in a way similar to the configuration illustrated in FIG. 2.

In FIG. 1, FIG. 2, and FIG. 3, the interface 125 is positioned at the bottom side of the integrated circuit device 101, while the image sensor chip is positioned at the top side of the integrated device 101 to receive incident light for generating images.

The voltage drivers 115 in FIG. 1, FIG. 2, and FIG. 3 can be controlled to apply voltages to program the threshold voltages of memory cells in the array 113. Data stored in the memory cells can be represented by the levels of the programmed threshold voltages of the memory cells.

A typical memory cell in the array 113 has a nonlinear current to voltage curve. When the threshold voltage of the memory cell is programmed to a first level to represent a stored value of one, the memory cell allows a predetermined amount of current to go through when a predetermined read voltage higher than the first level is applied to the memory cell. When the predetermined read voltage is not applied (e.g., the applied voltage is zero), the memory cell allows a negligible amount of current to go through, when compared to the predetermined amount of current. On the other hand, when the threshold voltage of the memory cell is programmed to a second level higher than the predetermined read voltage to represent a stored value of zero, the memory cell allows a negligible amount of current to go through, regardless of whether the predetermined read voltage is applied. Thus, when a bit of weight is stored in the memory as discussed above, and a bit of input is used to control whether to apply the predetermined read voltage, the amount of current going through the memory cell as a multiple of the predetermined amount of current corresponds to the digital result of the stored bit of weight multiplied by the bit of input. Currents representative of the results of 1-bit by 1-bit multiplications can be summed in an analog form before digitized for shifting and summing to perform multiplication and accumulation of multi-bit weights against multi-bit inputs, as further discussed below.

FIG. 4 shows the computation of a column of weight bits multiplied by a column of input bits to provide an accumulation result according to one embodiment.

In FIG. 4, a column of memory cells 207, 217, . . . , 227 (e.g., in the memory cell array 113 of an integrated circuit device 101) can be programmed to have threshold voltages at levels representative of weights stored one bit per memory cell.

Voltage drivers 203, 213, . . . , 223 (e.g., in the voltage drivers 115 of an integrated circuit device 101) are configured to apply voltages 205, 215, . . . , 225 to the memory cells 207, 217, . . . , 227 respectively according to their received input bits 201, 211, . . . , 221.

For example, when the input bit 201 has a value of one, the voltage driver 203 applies the predetermined read voltage as the voltage 205, causing the memory cell 207 to output the predetermined amount of current as its output current 209 if the memory cell 207 has a threshold voltage programmed at a lower level, which is lower than the predetermined read voltage, to represent a stored weight of one, or to output a negligible amount of current as its output current 209 if the memory cell 207 has a threshold voltage programmed at a higher level, which is higher than the predetermined read voltage, to represent a stored weight of zero. However, when the input bit 201 has a value of zero, the voltage driver 203 applies a voltage (e.g., zero) lower than the lower level of threshold voltage as the voltage 205 (e.g., does not apply the predetermined read voltage), causing the memory cell 207 to output a negligible amount of current at its output current 209 regardless of the weight stored in the memory cell 207. Thus, the output current 209 as a multiple of the predetermined amount of current is representative of the result of the weight bit, stored in the memory cell 207, multiplied by the input bit 201.

Similarly, the current 219 going through the memory cell 217 as a multiple of the predetermined amount of current is representative of the result of the weight bit, stored in the memory cell 217, multiplied by the input bit 211; and the current 229 going through the memory cell 227 as a multiple of the predetermined amount of current is representative of the result of the weight bit, stored in the memory cell 227, multiplied by the input bit 221.

The output currents 209, 219, . . . , and 229 of the memory cells 207, 217, . . . , 227 are connected to a common line 241 for summation. The summed current 231 is compared to the unit current 232, which is equal to the predetermined amount of current, by a digitizer 233 of an analog to digital converter 245 to determine the digital result 237 of the column of weight bits, stored in the memory cells 207, 217, . . . , 227 respectively, multiplied by the column of input bits 201, 211, . . . , 221 respectively with the summation of the results of multiplications.

The sum of negligible amounts of currents from memory cells connected to the line 241 is small when compared to the unit current 232 (e.g., the predetermined amount of current). Thus, the presence of the negligible amounts of currents from memory cells does not alter the result 237 and is negligible in the operation of the analog to digital converter 245.

In FIG. 4, the voltages 205, 215, . . . , 225 applied to the memory cells 207, 217, . . . , 227 are representative of digitized input bits 201, 211, . . . , 221; the memory cells 207, 217, . . . , 227 are programmed to store digitized weight bits; and the currents 209, 219, . . . , 229 are representative of digitized results. Thus, the memory cells 207, 217, . . . , 227 do not function as memristors that convert analog voltages to analog currents based on their linear resistances over a voltage range; and the operating principle of the memory cells in computing the multiplication is fundamentally different from the operating principle of a memristor crossbar. When a memristor crossbar is used, conventional digital to analog converters are used to generate an input voltage proportional to inputs to be applied to the rows of memristor crossbar. When the technique of FIG. 4 is used, such digital to analog converters can be eliminated; and the operation of the digitizer 233 to generate the result 237 can be greatly simplified. The result 237 is an integer that is no larger than the count of memory cells 207, 217, . . . , 227 connected to the line 241. The digitized form of the output currents 209, 219, . . . , 229 can increase the accuracy and reliability of the computation implemented using the memory cells 207, 217, . . . , 227.

In general, a weight involving a multiplication and accumulation operation can be more than one bit. Multiple columns of memory cells can be used to store the different significant bits of weights, as illustrated in FIG. 5 to perform multiplication and accumulation operations.

The circuit illustrated in FIG. 4 can be considered a multiplier-accumulator unit configured to operate on a column of 1-bit weights and a column of 1-bit inputs. Multiple such a circuit can be connected in parallel to implement a multiplier-accumulator unit to operate on a column of multi-bit weights and a column of 1-bit inputs, as illustrated in FIG. 5.

The circuit illustrated in FIG. 4 can also be used to read the data stored in the memory cells 207, 217, . . . , 227. For example, to read the data or weight stored in the memory cell 207, the input bits 211, . . . , 221 can be set to zero to cause the memory cells 217, . . . , 227 to output negligible amount of currents into the line 241 (e.g., as a bitline). The input bit 201 is set to one to cause the voltage driver 203 to apply the predetermined read voltage. Thus, the result 237 from the digitizer 233 provides the data or weight stored in the memory cell 207. Similarly, the data or weight stored in the memory cell 217 can be read via applying one as the input bit 211 and zeros as the remaining input bits in the column;

and data or weight stored in the memory cell 227 can be read via applying one as the input bit 221 and zeros as the other input bits in the column.

In general, the circuit illustrated in FIG. 4 can be used to select any of the memory cells 207, 217, . . . , 227 for read or write. A voltage driver (e.g., 203) can apply a programming voltage pulse to adjust the threshold voltage of a respective memory cell (e.g., 207) to erase data, to store data or weigh, etc.

FIG. 5 shows the computation of a column of multi-bit weights multiplied by a column of input bits to provide an accumulation result according to one embodiment.

In FIG. 5, a weight 250 in a binary form has a most significant bit 257, a second most significant bit 258, . . . , a least significant bit 259. The significant bits 257, 258, . . . , 259 can be stored in memory cells 207, 206, . . . , 208 in a number of columns respectively in an array 273. The significant bits 257, 258, . . . , 259 of the weight 250 are to be multiplied by the input bit 201 represented by the voltage 205 applied on a line 281 (e.g., a wordline) by a voltage driver 203 (e.g., as in FIG. 4).

Similarly, memory cells 217, 216, . . . , 218 can be used to store the corresponding significant bits of a next weight to be multiplied by a next input bit 211 represented by the voltage 215 applied on a line 282 (e.g., a wordline) by a voltage driver 213 (e.g., as in FIG. 4); and memory cells 227, 226, . . . , 228 can be used to store corresponding of a weight to be multiplied by the input bit 221 represented by the voltage 225 applied on a line 283 (e.g., a wordline) by a voltage driver 223 (e.g., as in FIG. 4).

The most significant bits (e.g., 257) of the weights (e.g., 250) stored in the respective rows of memory cells in the array 273 are multiplied by the input bits 201, 211, . . . , 221 represented by the voltages 205, 215, . . . , 225 and then summed as the current 231 in a line 241 and digitized using a digitizer 233, as in FIG. 4, to generate a result 237 corresponding to the most significant bits of the weights.

Similarly, the second most significant bits (e.g., 258) of the weights (e.g., 250) stored in the respective rows of memory cells in the array 273 are multiplied by the input bits 201, 211, . . . , 221 represented by the voltages 205, 215, . . . , 225 and then summed as a current in a line 242 and digitized to generate a result 236 corresponding to the second most significant bits.

Similarly, the least most significant bits (e.g., 259) of the weights (e.g., 250) stored in the respective rows of memory cells in the array 273 are multiplied by the input bits 201, 211, . . . , 221 represented by the voltages 205, 215, . . . , 225 and then summed as a current in a line 243 and digitized to generate a result 238 corresponding to the least significant bit.

The most significant bit can be left shifted by one bit to have the same weight as the second significant bit, which can be further left shifted by one bit to have the same weight as the next significant bit. Thus, the result 237 generated from multiplication and summation of the most significant bits (e.g., 257) of the weights (e.g., 250) can be applied an operation of left shift 247 by one bit; and the operation of add 246 can be applied to the result of the operation of left shift 247 and the result 236 generated from multiplication and summation of the second most significant bits (e.g., 258) of the weights (e.g., 250). The operations of left shift (e.g., 247, 249) can be used to apply weights of the bits (e.g., 257, 258, . . . ) for summation using the operations of add (e.g., 246, . . . , 248) to generate a result 251. Thus, the result 251 is equal to the column of weights in the array 273 of memory cells multiplied by the column of input bits 201, 211, . . . , 221 with multiplication results accumulated.

In general, an input involving a multiplication and accumulation operation can be more than 1 bit. Columns of input bits can be applied one column at a time to the weights stored in the array 273 of memory cells to obtain the result of a column of weights multiplied by a column of inputs with results accumulated as illustrated in FIG. 6.

The circuit illustrated in FIG. 5 can be used to read the data stored in the array 273 of memory cells. For example, to read the data or weight 250 stored in the memory cells 207, 206, . . . , 208, the input bits 211, . . . , 221 can be set to zero to cause the memory cells 217, 216, . . . 218, . . . , 227, 226, . . . , 228 to output negligible amount of currents into the line 241, 242, . . . , 243 (e.g., as bitlines). The input bit 201 is set to one to cause the voltage driver 203 to apply the predetermined read voltage as the voltage 205. Thus, the results 237, 236, . . . 238 from the digitizers (e.g., 233) connected to the lines 241, 242, . . . , 243 provide the bits 257, 258, . . . , 259 of the data or weight 250 stored in the row of memory cells 207, 206, . . . , 208. Further, the result 251 computed from the operations of shift 247, 249, . . . and operations of add 246, . . . , 248 provides the weight 250 in a binary form.

In general, the circuit illustrated in FIG. 5 can be used to select any row of the memory cell array 273 for read. Optionally, different columns of the memory cell array 273 can be driven by different voltage drivers. Thus, the memory cells (e.g., 207, 206, . . . 208) in a row can be programmed to write data in parallel (e.g., to store the bits 257, 258, . . . , 259) of the weight 250.

Figure 6:
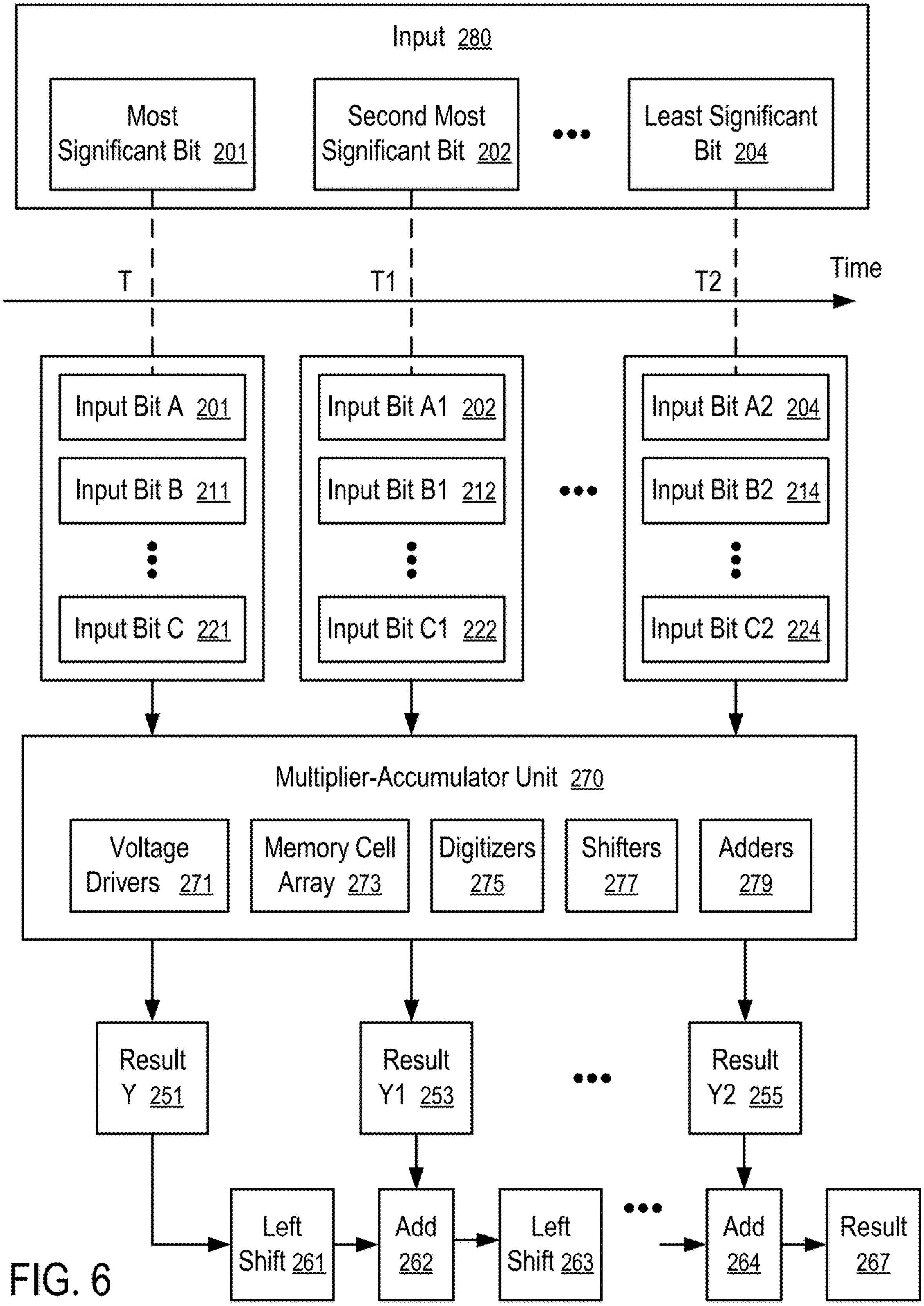
FIG. 6 shows the computation of a column of multi-bit weights multiplied by a column of multi-bit inputs to provide an accumulation result according to one embodiment.

FIG. 6 shows the computation of a column of multi-bit weights multiplied by a column of multi-bit inputs to provide an accumulation result according to one embodiment.

In FIG. 6, the significant bits of inputs (e.g., 280) are applied to a multiplier-accumulator unit 270 at a plurality of time instances T, T1, . . . , T2.

For example, a multi-bit input 280 can have a most significant bit 201, a second most significant bit 202, . . . , a least significant bit 204.

At time T, the most significant bits 201, 211, . . . , 221 of the inputs (e.g., 280) are applied to the multiplier-accumulator unit 270 to obtain a result 251 of weights (e.g., 250), stored in the memory cell array 273, multiplied by the column of bits 201, 211, . . . , 221 with summation of the multiplication results.

For example, the multiplier-accumulator unit 270 can be implemented in a way as illustrated in FIG. 5. The multiplier-accumulator unit 270 has voltage drivers 271 connected to apply voltages 205, 215, . . . , 225 representative of the input bits 201, 211, . . . , 221. The multiplier-accumulator unit 270 has a memory cell array 273 storing bits of weights as in FIG. 5. The multiplier-accumulator unit 270 has digitizers 275 to convert currents summed on lines 241, 242, . . . , 243 for columns of memory cells in the array 273 to output results 237, 236, . . . , 238. The multiplier-accumulator unit 270 has shifters 277 and adders 279 connected to combine the column result 237, 236, . . . , 238 to provide a result 251 as in FIG. 5.

Similarly, at time T1, the second most significant bits 202, 212, . . . , 222 of the inputs (e.g., 280) are applied to the multiplier-accumulator unit 270 to obtain a result 253 of weights (e.g., 250) stored in the memory cell array 273 and multiplied by the vector of bits 202, 212, . . . , 222 with summation of the multiplication results.

Similarly, at time T2, the least significant bits 204, 214, . . . , 224 of the inputs (e.g., 280) are applied to the multiplier-accumulator unit 270 to obtain a result 255 of weights (e.g., 250), stored in the memory cell array 273, multiplied by the vector of bits 202, 212, . . . , 222 with summation of the multiplication results.

The result 251 generated from multiplication and summation of the most significant bits 201, 211, . . . , 221 of the inputs (e.g., 280) can be applied an operation of left shift 261 by one bit; and the operation of add 262 can be applied to the result of the operation of left shift 261 and the result 253 generated from multiplication and summation of the second most significant bits 202, 212, . . . , 222 of the inputs (e.g., 280). The operations of left shift (e.g., 261, 263) can be used to apply weights of the bits (e.g., 201, 202, . . . ) for summation using the operations of add (e.g., 262, . . . , 264) to generate a result 267. Thus, the result 267 is equal to the weights (e.g., 250) in the array 273 of memory cells multiplied by the column of inputs (e.g., 280) respectively and then summed.

A plurality of multiplier-accumulator unit 270 can be connected in parallel to operate on a matrix of weights multiplied by a column of multi-bit inputs over a series of time instances T, T1, . . . , T2.

The multiplier-accumulator units (e.g., 270) illustrated in FIG. 4, FIG. 5, and FIG. 6 can be implemented in integrated circuit devices 101 in FIG. 1, FIG. 2, and FIG. 3.

Figure 7:
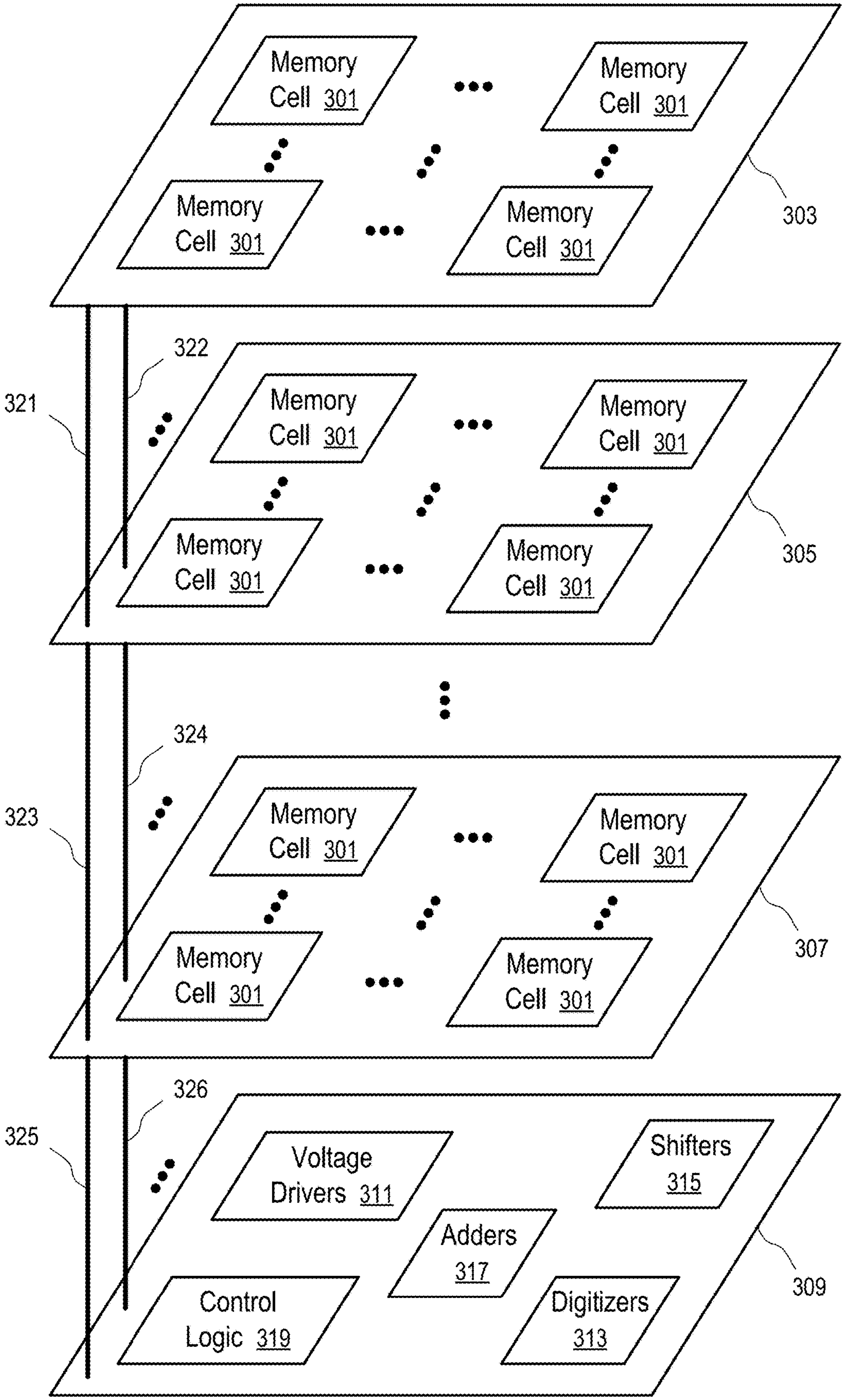
FIG. 7 shows a three-dimensional array of memory cells and circuits to facilitate inference according to one embodiment.

In some implementations, the memory cell array 113 in the integrated circuit devices 101 in FIG. 1, FIG. 2, and FIG. 3 has multiple layers of memory cell arrays as illustrated in FIG. 7.

FIG. 7 shows a three-dimensional array of memory cells and circuits to facilitate inference according to one embodiment.

In FIG. 7, a memory chip (e.g., configured on an integrated circuit die 105 of an integrated circuit device 101 in FIG. 1, FIG. 2, or FIG. 3) is manufactured to have multiple layers 303, 305, . . . , 307 of memory cells 301.

The current outputs of memory cells 301 in a layer (e.g., 303, 305, or 307) can be connected in columns. Each column (e.g., memory cells 207, 217, . . . , 227 as in FIG. 4) is configured for multiplication with a column of input bits (e.g., 201, 211, . . . , 221).

In one implementation, multiple columns configured to store bits of a column of multi-bit weights are configured in a same layer. For example, the memory cells of the array 273 in FIG. 5 can be configured in a layer 303 (or 305). Further, a layer (e.g., 303 or 305) can have multiple memory cell arrays (e.g., 273) to store multiple columns of weights. Thus, the layers 303, 305, . . . , 307 of the memory cells 301 can be used one layer at a time for multiplications and accumulation involving one or more columns of multi-bit weights.

In another implementation, multiple columns configured to store bits of a column of multi-bit weights are distributed into more than one layer. For example, the column of memory cells 207, 217, . . . , 227 for storing the most significant bit 257 of a column of weights can be configured on the layer 303; and the column of memory cells 207, 217, . . . , 227 for storing the least significant bit 259 of the column of weights can be configured on the layer 305 (or layer 307); etc. For example, each significant bit (e.g., 257, 258, or 259) of a weight 250 can be stored in a separate layer from other bits of the weight 250. The layers 303, 305, etc. storing the bits of the weights (e.g., 250) can operate in parallel to perform the multiplication and accumulation computation as in FIG. 5. Optionally, the significant bits (e.g., 257, 258, . . . , 259) of a weight (e.g., 250) can be divided into multiple groups, with each group being stored in a same layer and different groups being stored in different layers. For example, some significant bits (e.g., 257, 258, . . . ) of the weight 250 are stored in a layer 303; and some significant bits (e.g., 259, . . . ) of the weight 250 are stored in another layer 305; etc.

Optionally, the count of layers 303, . . . , 305 in the memory chip can include a multiple of a count of bits (e.g., 257, 258, . . . , 259) in a weight (e.g., 250). Thus, the layers 303, . . . , 305 can be partitioned into multiple subsets. Each of the subsets includes one layer to store one significant bit, or a subset of significant bits, of a weight column. The subsets of the layers 303, . . . , 305 can be used to perform multiplication accumulation operations one subset at a time; and the different subsets can share a set of voltage drivers 271, digitizers 275, shifters 277, and adders 279. Alternatively, the subsets can operation in parallel to perform multiplication and accumulation operations for multiple input bits in parallel; and each subset can have a separate set of voltage drivers 271, digitizers 275, shifters 277, and adders 279.

The memory cells 301 in a layer (e.g., 303) (or a subset of layers) can have sufficient number of columns to store bits for multiple columns of weights. Multiple columns of weights can be stored in one layer, or across multiple layers, for parallel operations with a column of input bits.

Optionally, the columns of memory cells 301 in one or more layers are configured for parallel operation with multiple columns of input bits. For example, a column of memory cells 301 in the layer can have multiple segments; and each segment is configured to store a significant bit of weights to be multiplied by input bits of a respective input vector.

In one implementation, the memory chip (e.g., integrated circuit die 105) includes a layer 309 containing circuits of voltage drivers 311, digitizers 313, shifters 315, and adders 317 to perform the operations of multiplication and accumulation as in FIG. 5. The layer 309 can further include control logic 319 configured to control the operations of the drivers 311, digitizers 313, shifters 315, and adders 317 to perform the operations as in FIG. 5 and FIG. 6. Metal connections 321, 322, . . . , 323, 324, . . . , 325, 326, etc. are configured using metal lines routed within the layers 303, 305, . . . , 307 and 309 and vias through the layers to the voltage drivers 311 and the digitizers 313 in the bottom layer 309. The metal parts in the bottom layer 309 can be connected to the metal parts in the top surface 134 of the integrated circuit die 109 via hybrid bonding to provide a direct bond interconnect 107 to the inference logic circuit 123.

The inference logic circuit 123 can be configured to use the computation capability of the memory chip (e.g., integrated circuit die 105) to perform inference computations of an application, such as the inference computation of an artificial neural network. The inference results can be stored in a portion of the memory cell array 113 for retrieval by an external device via the interface 125 of the integrated circuit device 101.

Optionally, at least a portion of the voltage drivers 311, the digitizers 313, the shifters 315, the adders 317, and the control logic 319 can be configured in the integrated circuit die 109 for the logic chip.

In one implementation, the voltage drivers 311, the digitizers 313, the shifters 315, the adders 317, and the control logic 319 are configured in the integrated circuit die 109. The bottom layer 309 is configured with metal lines to form a direct bond interconnect (e.g., 107 or 108) to the circuits in the logic chip via hybrid bonding.

The memory cells 301 can include volatile memory, or non-volatile memory, or both. Examples of non-volatile memory include flash memory, memory units formed based on negative-and (NAND) logic gates, negative-or (NOR) logic gates, phase-change memory (PCM), magnetic memory (MRAM), resistive random-access memory, cross point storage and memory devices. A cross point memory device can use transistor-less memory elements, each of which has a memory cell and a selector that are stacked together as a column. Memory element columns are connected via two layers of wires running in perpendicular directions, where wires of one layer run in one direction in the layer is located above the memory element columns, and wires of the other layer is in another direction and in the layer located below the memory element columns. Each memory element can be individually selected at a cross point of one wire on each of the two layers. Cross point memory devices are fast and non-volatile and can be used as a unified memory pool for processing and storage. Further examples of non-volatile memory include read-only memory (ROM), programmable read-only memory (PROM), erasable programmable read-only memory (EPROM) and electronically erasable programmable read-only memory (EEPROM) memory, etc. Examples of volatile memory include dynamic random-access memory (DRAM) and static random-access memory (SRAM).

Optionally, the different types of memory cells can be configured on different layers to provide different functions, such as multiplication accumulation computation with weight storage, buffering of intermediate results, and storing results of inference computation for retrieval by an external device via the interface 125.

The integrated circuit die 105 and the integrated circuit die 109 can include circuits to address memory cells 301 in the memory cell array 113, such as a row decoder and a column decoder to convert a physical address into control signals to select a portion of the memory cells 301 for read and write. Thus, an external device can send commands to the interface 125 to write weights (e.g., 250) into the memory cell array 113 and to read results from the memory cell array 113.

In some implementations, the image processing logic circuit 121 can also send commands to the interface 125 to write images into the memory cell array 113 for processing.

Figure 8:
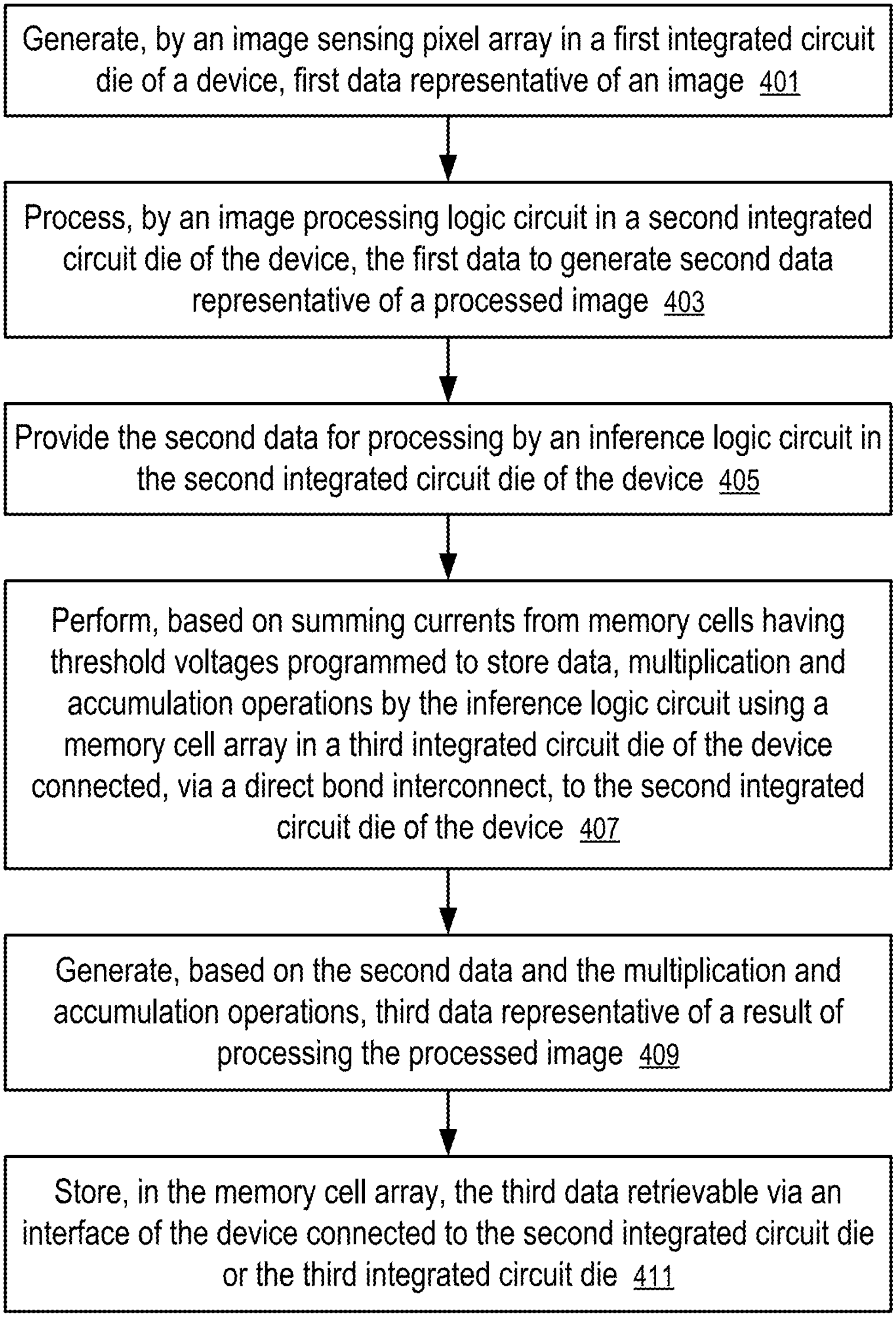
FIG. 8 shows a method of computation in an integrated circuit device according to one embodiment.

FIG. 8 shows a method of computation in an integrated circuit device according to one embodiment. For example, the method of FIG. 8 can be performed in an integrated circuit device 101 of FIG. 1, FIG. 2, or FIG. 3 using multiplication and accumulation techniques of FIG. 4, FIG. 5, and FIG. 6 and memory cells 301 configured in layers as in FIG. 7.

At block 401, an image sensing pixel array 111 in a first integrated circuit die 103 of a device 101 generates first data representative of an image.

At block 403, an image processing logic circuit 121 in a second integrated circuit die 109 of the device 101 processes the first data to generate second data representative of a processed image.

At block 405, the second data is provided within the device 101 as an input for processing by an inference logic circuit 123 in the second integrated circuit die 109 of the device 101.

At block 407, the inference logic circuit 123 performs multiplication and accumulation operations, based on summing currents from memory cells 301 having threshold voltages programmed to store data, using a memory cell array 113 in a third integrated circuit die 105 of the device 101 connected, via a direct bond interconnect 107, to the second integrated circuit die 105 of the device 101.

For example, the device 101 can have a single integrated circuit package configured to enclose the first integrated circuit die 103, the second integrated circuit die 109, and the third integrated circuit die 105.

At block 409, based on the second data and the multiplication and accumulation operations, the inference logic circuit 123 generates third data representative of a result of processing the processed image.

For example, the image processing logic circuit 121 can be configured to write second data into the memory cell array 113 as an input to the artificial neural network; and the inference logic circuit 123 is configured to perform the computations of an artificial neural network using the multiplication and accumulation capability provided via the columns of memory cells in the memory cell array 113.

For example, a column of memory cells 207, 217, . . . , 227 in the memory cell array 113 can have threshold voltages programmed to store a column of weight bits. A column of voltage drivers 203, 213, . . . , 223 can apply, according to a column of input bits 201, 211, . . . , 221, voltages 205, 215, . . . , 225 to the column of memory cells 207, 217, . . . , 227 respectively. Output currents 209, 219, . . . , 229 from the column of memory cells 207, 217, . . . , 227 are summed in an analog form in a line 241. A digitizer 233 converts the summed current 231 in the line 241 as a multiple of a predetermined amount of current 232.

For example, each respective memory cell (e.g., 207, 217, . . . , or 227) in the column of memory cells 207, 217, . . . , 227 can be programmed to have a threshold voltage at: a first level to represent a first value of one; and a second level, higher than the first level, to represent a second value of zero. When applied a predetermined read voltage between the first level and the second level, the respective memory cell (e.g., 207, 217, . . . , or 227) is configured to output the predetermined amount of current 232 when storing the first value of one or to output a negligible amount of current when storing the second value of zero. The resistance of the memory cell (e.g., 207, 217, . . . , or 227) is nonlinear in a voltage range including its threshold voltage.

When a respective input bit (e.g., 201, 211, . . . , or 221) corresponding to the respective memory cell (e.g., 207, 217, . . . , or 227) is zero, the voltage driver 203 connected to the respective memory cell (e.g., 207, 217, . . . , or 227) applies a voltage lower than the first level to the respective memory cell (e.g., 207, 217, . . . , or 227), resulting a negligible amount of current (e.g., 209, 219, . . . , or 229) from the respective memory cell (e.g., 207, 217, . . . , or 227). When the respective input bit (e.g., 201, 211, . . . , or 221) corresponding to the respective memory cell (e.g., 207, 217, . . . , or 227) is one, the predetermined read voltage between the first level and the second level is applied to the respective memory cell (e.g., 207, 217, . . . , or 227), resulting the predetermined amount of current 232 from the respective memory cell (e.g., 207, 217, . . . , or 227) when the respective memory cell (e.g., 207, 217, . . . , or 227) is storing the first value of one, or negligible amount of current when the respective memory cell (e.g., 207, 217, . . . , or 227) is storing the second value of one.

Optionally, the third integrated circuit die 105 has a plurality of layers 303, 305, . . . , 307, each containing an array of memory cells 301.

The integrated circuit device 101 can have voltage drivers 311, digitizers 313, shifters 315, adders 317, and control logic 319 to perform the multiplication and accumulation operations. In one implementation, the voltage drivers 311, digitizers 313, shifters 315, adders 317, and control logic 319 are configured in a layer 309 of the third integrated circuit die 105. In other implementations, a first portion of the voltage drivers 311, digitizers 313, shifters 315, adders 317, and control logic 319 is configured in a layer 309 of the third integrated circuit die 105; and a second portion of the voltage drivers 311, digitizers 313, shifters 315, adders 317, and control logic 319 is configured in the second integrated circuit die 109. Alternatively, the voltage drivers 311, digitizers 313, shifters 315, adders 317, and control logic 319 are configured in the second integrated circuit die 109.

In some implementations, a subset of the layers 303, 305, . . . , 307 can be used together concurrently to perform multiplication and accumulation operations.

For example, most significant bits (e.g., 257) of a column of weights (e.g., 250) are stored in a first column of memory cells 207, 217, . . . , 227 in a first layer 303 among the plurality of layers 303, 305, . . . , 307; least significant bits (e.g., 259) of the column of weights (e.g., 250) are stored in a second column of memory cells 208, 218, . . . , 228 in a second layer 305 (or 307), different from the first layer 303, among the plurality of layers 303, 305, . . . , 307; a column of voltage drivers 203, 213, . . . , 223 are configured to apply voltages 205, 215, . . . , 225 according to a column of input bits 201, 211, . . . , 221 to the first column of memory cells 207, 217, . . . , 227 and the second column of memory cells 208, 218, . . . , 228; a first line 241 is connected to the first column of memory cells 207, 217, . . . , 227 to sum output currents 209, 219, . . . , 229 from the first column of memory cells 207, 217, . . . , 227; a second line 243 is connected to the second column of memory cells 208, 218, . . . , 228 to sum output currents from the second column of memory cells 208, 218, . . . , 228; a first digitizer 233 is configured to determine a first result 237 from a current 231 in the first line 241 as a multiple of a predetermined amount of current 232; a second digitizer is configured to determine a second result 255 from a current in the second line 243 as a multiple of the predetermined amount of current 232; a shifter 315 is configured to left shift 261 the first result for summation with the second result 255 using an adder 264.

At block 411, the inference logic circuit 123 stores, in the memory cell array 113, the third data retrievable via an interface 125 of the device 101 connected to the second integrated circuit die 109 or the third integrated circuit die 105.

For example, the interface 125 can be operable for a host system to write data into the memory cell array 113 and to read data from the memory cell array 113. For example, the host system can send commands to the interface 125 to write the weight matrices of the artificial neural network into the memory cell array 113 and read the output of the artificial neural network, the raw image data from the image sensing pixel array 111, or the processed image data from the image processing logic circuit 121, or any combination thereof.

In some implementations, both the first integrated circuit die 103 and the third integrated circuit die 105 are connected to the second integrated circuit die 109 via hybrid bonding. Alternatively, the first integrated circuit die 103 can be connected to the second integrated circuit die 109 via microbumps.

The inference logic circuit 123 can be programmable and include a programmable processor, an application-specific integrated circuit (ASIC), or a field-programmable gate array (FPGA), or any combination thereof. Instructions for implementing the computations of the artificial neural network can also be written via the interface 125 into the memory cell array 113 for execution by the inference logic circuit 123.

In one implementation, the second integrated circuit die 109 has an upper surface and a lower surface opposite to the upper surface; the upper surface having a first portion (e.g., surface 132) and a second portion (e.g., surface 134); the first integrated circuit die 103 is configured, attached, or bonded to the second integrated circuit die 109 on the first portion; the third integrated circuit die 105 is configured, attached, or bonded to the second integrated circuit die 109 on the second portion; and the interface 125 is connected to the lower surface of the second integrated circuit die 109, as illustrated in FIG. 1 and FIG. 2.

In another implementation, the second integrated circuit die 109 has an upper surface 132 and a lower surface 133, as illustrated in FIG. 3; the first integrated circuit die 103 is configured, attached, or bonded to the second integrated circuit die 109 on the upper surface 132 (e.g., via microbumps or hybrid bonding); the third integrated circuit die 105 is configured, attached, or bonded to the second integrated circuit die 109 on the lower surface 133 (e.g., via microbumps or hybrid bonding); and the interface 125 is connected to the third integrated circuit die 105, as illustrated in FIG. 3.

In at least some embodiments, the inference capability of the integrated circuit devices 101 is used to perform artificial neural network computations on still images, or video images, or both.

In general, the computation of an artificial neural network includes multiplication and accumulation operations on columns or matrices of data elements. For example, an initial column of inputs can be based on the pixel values of the image received from an image sensor, an image sensing pixel array, an image processing circuit, or a host system. A matrix of weights of the artificial neurons does not change during the computation of the artificial neural network. Thus, such a weight matrix can be stored in one or more layers of the memory cells in the memory chip of the integrated circuit device 101. The multiplication and accumulation operations involving the weight matrix of the artificial neural network can be performed using the memory cell array 113 in the memory chip. The multiplication result can be used to generate a further column of inputs for further multiplication and accumulation with a weight matrix of further artificial neurons. Some computation operations of the artificial neural network, such as the evaluation of the activation functions of artificial neurons, can be implemented using an array of parallel logic circuits configured to operate in parallel to transform a column of weighted inputs to a column of outputs from the set of artificial neurons as a column of inputs to a next set of artificial neurons. Optionally, some activation functions can be configured as iterative or repeated application of one or more weight matrices. The inference logic circuit 123 can be configured to schedule data flow among the logic circuits and multiplier-accumulator units 270 implemented using the memory chip.

Figure 9:
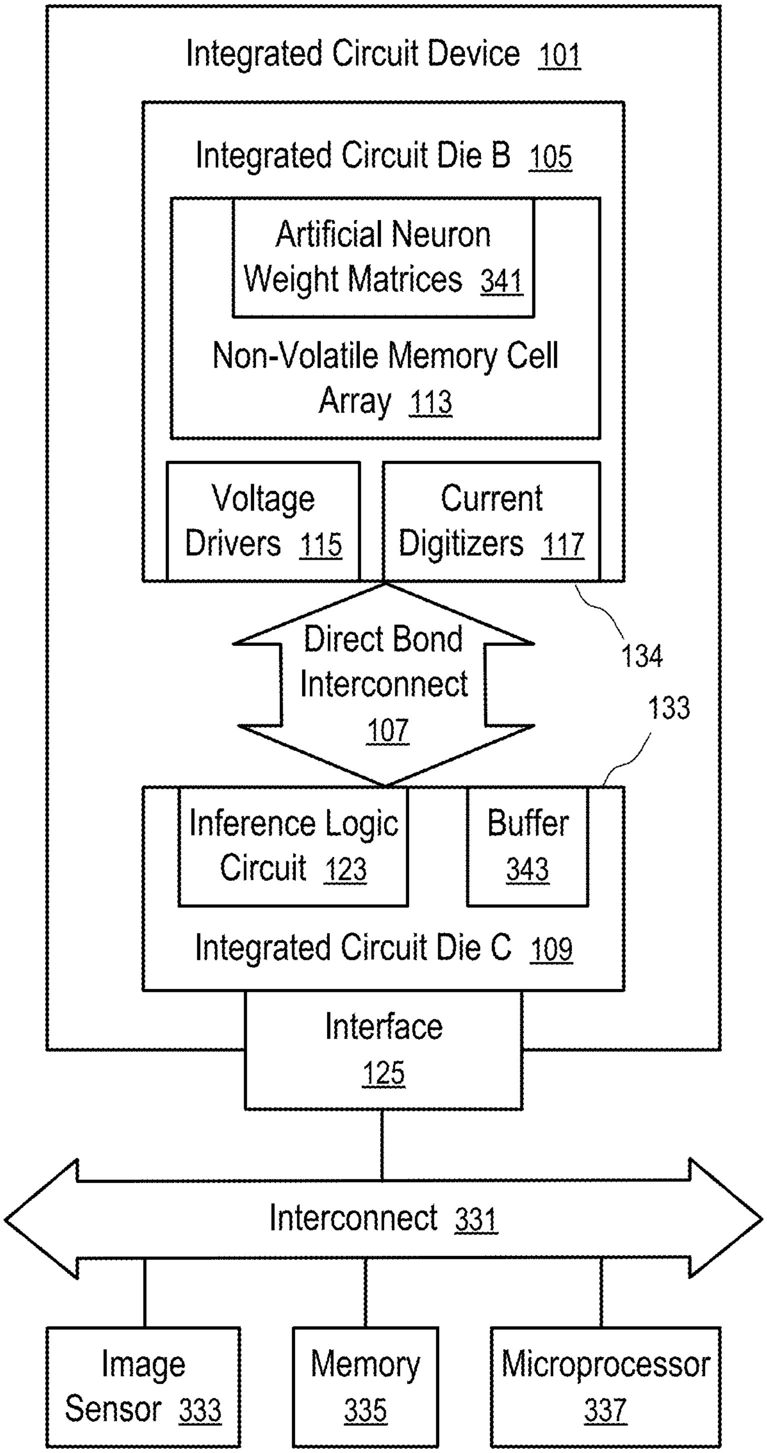
FIG. 9 shows a computing system configured to process an image using an integrated circuit device and an artificial neural network according to one embodiment.

FIG. 9 shows a computing system configured to process an image using an integrated circuit device and an artificial neural network according to one embodiment.

In FIG. 9, an integrated circuit device 101 has a memory chip (e.g., integrated circuit die 105) and a logic chip (e.g., integrated circuit die 109) with variations similar to the integrated circuit devices 101 of FIG. 1, FIG. 2, and FIG. 3. Optionally, the integrated circuit device 101 of FIG. 9 can have an image chip (e.g., integrated circuit die 103) as in FIG. 1, FIG. 2, or FIG. 3. Alternatively, the integrated circuit device 101 of FIG. 9 can be manufactured to have no image chip.

In FIG. 9, the interface 125 of the integrated circuit device 101 can receive commands to write an image into the integrated circuit device 101 as a memory device, or a storage device, or both.

For example, the image sensor 333 can write an image through the interconnect 331 (e.g., one or more computer buses) into the interface 125. Alternatively, a microprocessor 337 can function as a host system to retrieve an image from the image sensor 333, optionally buffer the image in the memory 335, and write the image to the interface 125. The interface 125 can place the image data in the buffer 343 as an input to the inference logic circuit 123.

In some implementations, when the integrated circuit device 101 has an image sensing pixel array 111 (e.g., as in FIG. 1, FIG. 2, and FIG. 3), the image chip or the image processing logic circuit 121 can send image data to the buffer 343 directly, or through the interface 125.

In response to the image data in the buffer 343, the inference logic circuit 123 can generate a column of inputs. The memory cell array 113 in the memory chip (e.g., integrated circuit die 105) can store an artificial neuron weight matrix 341 configured to weight on the inputs to an artificial neural network. The inference logic circuit 123 can instruct the voltage drivers 115 to apply a column of significant bits of the inputs a time to an array of memory cells storing the artificial neuron weight matrix 341 to obtain a column of results (e.g., 251) using the technique of FIG. 5 and FIG. 6. The inference logic circuit 123 can transform the column of results (e.g., according to activation functions of artificial neurons) to generate a next column of inputs to be further weighted on using a further artificial neuron weight matrix 341. The process can continue until a last artificial neuron weight matrix 341 is applied to produce the output of the artificial neural network.

The inference logic circuit 123 can be configured to place the output of the artificial neural network into the buffer 343 for retrieval as a response to, or replacement of, the image written to the interface 125. Optionally, the inference logic circuit 123 can be configured to write the output of the artificial neural network into the memory cell array 113 in the memory chip. In some implementations, an external device (e.g., the image sensor, the microprocessor 337) writes an image into the interface 125; and in response to the integrated circuit device 101 generates the output of the artificial neural network in response to the image and write the output as a replacement of the image into the memory chip.

The memory cells 301 in the memory cell array 113 can be non-volatile. Thus, once the weight matrices 341 are written into the memory cell array 113, the integrated circuit device 101 has the computation capability of the artificial neural network without further configuration or assistance from an external device (e.g., a host system). The computation capability can be used immediately upon supplying power to the integrated circuit device 101 without the need to boot up and configure the integrated circuit device 101 by a host system (e.g., microprocessor 337 running an operating system). The power to the integrated circuit device 101 (or a portion of it) can be turned off when the integrated circuit device 101 is not used in computing an output of an artificial neural network, and not used in reading or write data to the memory chip. Thus, the energy consumption of the computing system can be reduced.

In some implementations, the inference logic circuit 123 is programmable to perform operations of forming columns of inputs, applying the weights stored in the memory chip, and transforming columns of data (e.g., according to activation functions of artificial neurons). The instructions can also be stored in the non-volatile memory cell array 113 in the memory chip.

In some implementations, the inference logic circuit 123 includes an array of identical logic circuits configured to perform the computation of some types of activation functions, such as step activation function, rectified linear unit (ReLU) activation function, heaviside activation function, logistic activation function, gaussian activation function, multiquadratics activation function, inverse multiquadratics activation function, polyharmonic splines activation function, folding activation functions, ridge activation functions, radial activation functions, etc.

In some implementations, the multiplication and accumulation operations in an activation function are performed using multiplier-accumulator units 270 implemented using memory cells in the array 113.

Some activation functions can be implemented via multiplication and accumulation operations with fixed weights.

Figure 10:
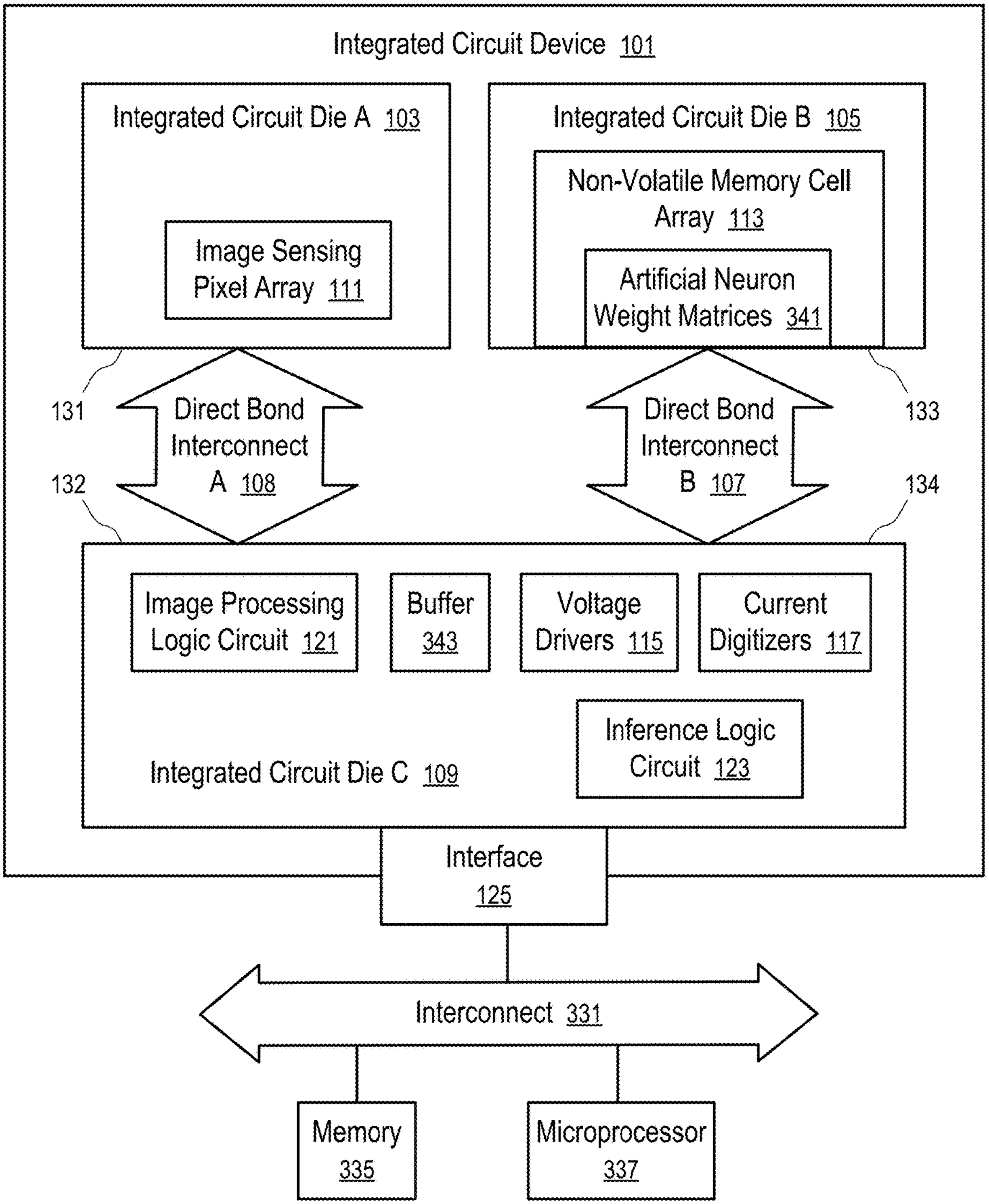
FIG. 10 shows another computing system according to one embodiment.

FIG. 10 shows another computing system according to one embodiment.

The integrated circuit device 101 in FIG. 10 has an integrated circuit die 109 with an inference logic circuit 123 and a non-volatile memory cell array 113 as in FIG. 9.

In FIG. 10, the voltage drivers 115 and the current digitizers 117 are configured in the logic chip (e.g., integrated circuit die 109 having the inference logic circuit 123). Alternatively, at least a portion of the voltage drivers 115 and the current digitizers 117 can be implemented in the memory chip (e.g., integrated circuit die 105 having the memory cell array 113).

In FIG. 10, the integrated circuit device 101 includes an image chip (e.g., integrated circuit die 103 having image sensing pixel array 111).

An image processing logic circuit 121 in the logic chip can pre-process an image from the image sensing pixel array 111 as an input to the inference logic circuit 123. After the image processing logic circuit 121 stores the input into the buffer 343, the inference logic circuit 123 can perform the computation of an artificial neural network in a way similar to the integrated circuit device 101 of FIG. 9.

For example, the inference logic circuit 123 can store the output of the artificial neural network into the memory chip in response to the input in the buffer 343.

Optionally, the image processing logic circuit 121 can also store one or more version of the image captured by the image sensing pixel array 111 in the memory chip as a solid-state drive.

An application running in the microprocessor 337 can send a command to the interface 125 to read at a memory address in the memory chip. In response, the image sensing pixel array 111 can capture an image; the image processing logic circuit 121 can process the image to generate an input in the buffer; and the inference logic circuit 123 can generate an output of the artificial neural network responding to the input. The integrated circuit device 101 can provide the output as the content retrieved at the memory address; and the application running in the microprocessor 337 can determine, based on the output, whether to read further memory addresses to retrieve the image or the input generated by the image processing logic circuit 121. For example, the artificial neural network can be trained to generate a classification of whether the image captures an object of interest and if so, a bounding box of a portion of the image containing the image of the object and a classification of the object. Based on the output of the artificial neural network, the application running in the microprocessor 337 can decide whether to retrieve the image, or the image of the object in the bounding box, or both.

In some implementations, the original image, or the input generated by the image processing logic circuit 121, or both can be placed in the buffer 343 for retrieval by the microprocessor 337. If the microprocessor 337 decides not to retrieve the image data in view of the output of the artificial neural network, the image data in the buffer 343 can be discarded when the microprocessor 337 sends a command to the interface 125 to read a next image.

Optionally, the buffer 343 is configured with sufficient capacity to store data for up to a predetermined number of images. When the buffer 343 is full, the oldest image data in the buffer is erased.

When the integrated circuit device 101 is not in an active operation (e.g., capturing an image, operating the interface 125, or performing the artificial neural network computations), the integrated circuit device 101 can automatically enter a low power mode to avoid or reduce power consumption. A command to the interface 125 can wake up the integrated circuit device 101 to process the command.

Figure 11:
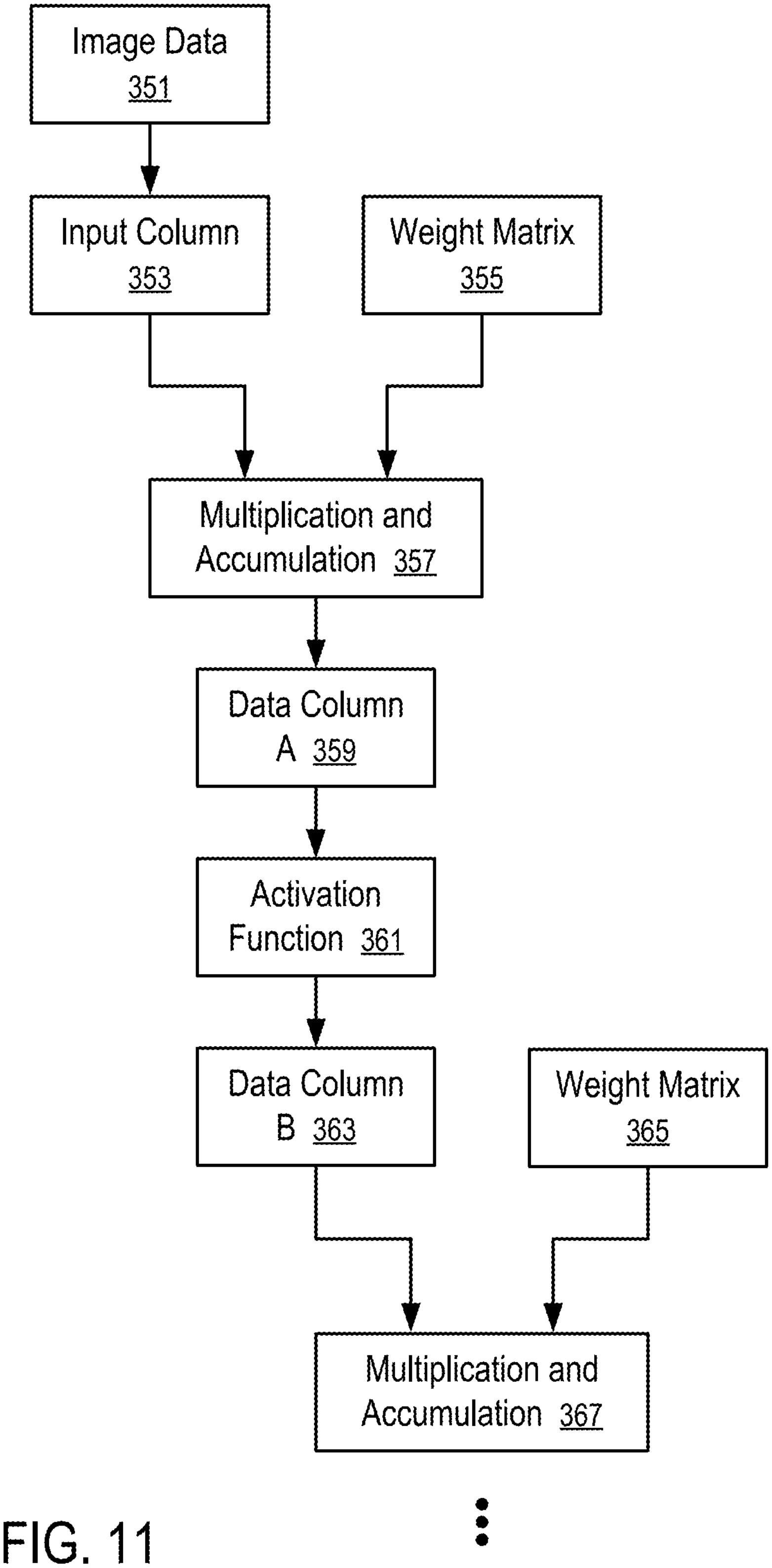
FIG. 11 shows an implementation of artificial neural network computations according to one embodiment.

FIG. 11 shows an implementation of artificial neural network computations according to one embodiment. For example, the computations of FIG. 11 can be implemented in the integrated circuit devices 101 of FIG. 1, FIG. 2, FIG. 3, FIG. 9, and FIG. 10.

In FIG. 11, image data 351 can be provided as an input to an artificial neural network from an image sensing pixel array 111, an image processing logic circuit 121, an image sensor 333, or a microprocessor 337.

An inference logic circuit 123 in an integrated circuit device 101 can arrange the pixel values from the image data 351 into a column 353 of inputs.

A weight matrix 355 is stored in one or more layers (e.g., 303, 305) of the memory cell array 113 in the memory chip of the integrated circuit device 101.

A multiplication and accumulation 357 combined the input columns 353 and the weight matrix 355. For example, the inference logic circuit 123 identifies the storage location of the weight matrix 355 in the memory chip, instructs the voltage drivers 115 to apply, according to the bits of the input column, voltages to memory cells storing the weights in the matrix 355, and retrieve the multiplication and accumulation results (e.g., 267) from the logic circuits (e.g., adder 264) of the multiplier-accumulator units 270 containing the memory cells.

The multiplication and accumulation results (e.g., 267) provide a column 359 of data representative of combined inputs to a set of input artificial neurons of the artificial neural network. The inference logic circuit 123 can use an activation function 361 to transform the data column 359 to a column 363 of data representative of outputs from the next set of artificial neurons. The outputs from the set of artificial neurons can be provided as inputs to a next set of artificial neurons. A weight matrix 365 includes weights applied to the outputs of the neurons as inputs to the next set of artificial neurons and biases for the neurons. A multiplication and accumulation 367 can be performed in a similar way as the multiplication and accumulation 357. Such operations can be repeated from multiple set of artificial neurons to generate an output of the artificial neural network.

Figure 12:
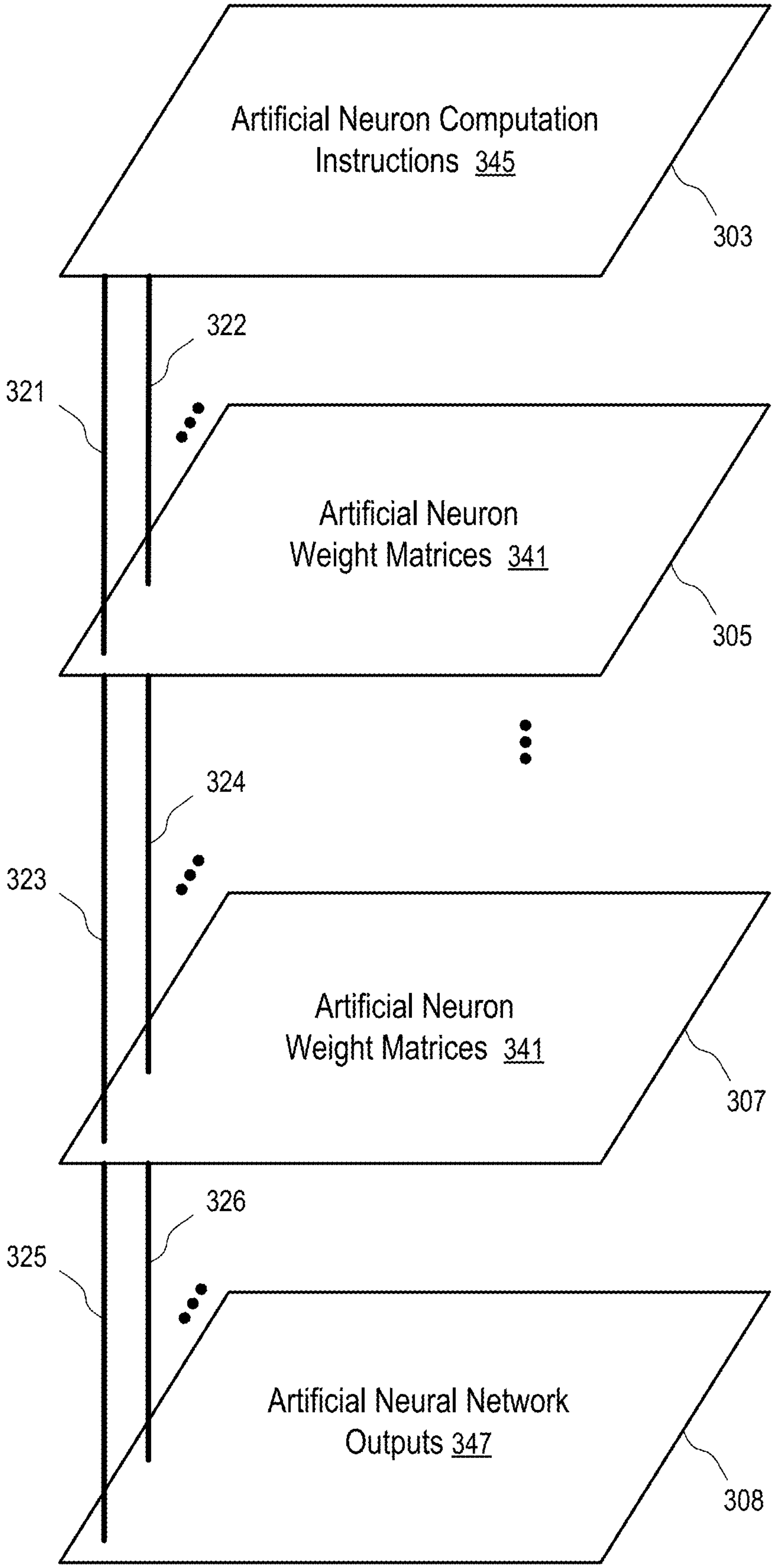
FIG. 12 shows a configuration of layers of a memory cell array in an integrated circuit device for artificial neural network computations according to one embodiment.

FIG. 12 shows a configuration of layers of a memory cell array in an integrated circuit device for artificial neural network computations according to one embodiment. For example, the configuration of FIG. 12 can be implemented in the integrated circuit devices 101 of FIG. 1, FIG. 2, FIG. 3, FIG. 9, and FIG. 10 to perform the computations in FIG. 11.

In FIG. 12, a memory cell array 113 in the memory chip of an integrated circuit device 101 has multiple layers 303, 305, . . . , 307, and 309 of memory cells 301, similar to the layers illustrated in FIG. 7.

In FIG. 12, a set of layers 303, . . . , 305 can be configured to store the weight matrices 341 (e.g., 355, 365, . . . ) of artificial neural network computations.

In one implementation, the layers 303, . . . , 305 are configured to be used together to store different significant bits of weights. For example, the layer 305 can be configured to store the most significant bits (e.g., in memory cells 207, 217, . . . , 227) of weights; and the layer 307 can be configured to store the least significant bits (e.g., in memory cells 208, 218, . . . , 228) of weights. Alternatively, the bits of each column of weights are stored in a same layer (e.g., 305 or 307).

The weight matrices 341 (e.g., 355, 365, . . . ) can have different sizes. For example, any number of weight columns under a predetermined limit can be operated together as a matrix for multiplication and accumulation with a column of input bits. The columns in the memory cell arrays in the weight layers 305, . . . , 307 can optionally be partitioned into different column lengths. Thus, one weight matrix 355 can have one count of rows; and another weight matrix 365 can have another count of rows. The weight matrices 355 and 365 can be stored in memory cells in the same columns but different portions of the columns. The layers 305, . . . , 307 can be configured to allow different portions of columns to be selected for multiplication and accumulation operations to avoid the need to read an entire column of memory cells 301 in a layer.

In FIG. 12, a layer 307 of the memory cells 301 is configured to store a sequence of instructions to perform the operations illustrated in FIG. 11. The instructions 345 can include the identifications of positions of weight matrices (e.g., 355, 365) in the weight layers 305, . . . , 307 and the sizes of the weight matrices (e.g., 355, 365) such that the inference logic circuit 123 can instruct a corresponding portion of voltage drivers 115 to apply voltages according to input bits for the weight matrices (e.g., 355, 365) to generate multiplication and accumulation results (e.g., 267).

In FIG. 12, the image chip includes a layer 308 of memory cells configured to store artificial neural network outputs 347. For example, the outputs 347 generated for a sequence of images can be placed sequentially in the storage space of the layer 308. When the storage space is full, the inference logic circuit 123 can erase the oldest outputs to store the newest outputs in a circular way.

Figure 13:
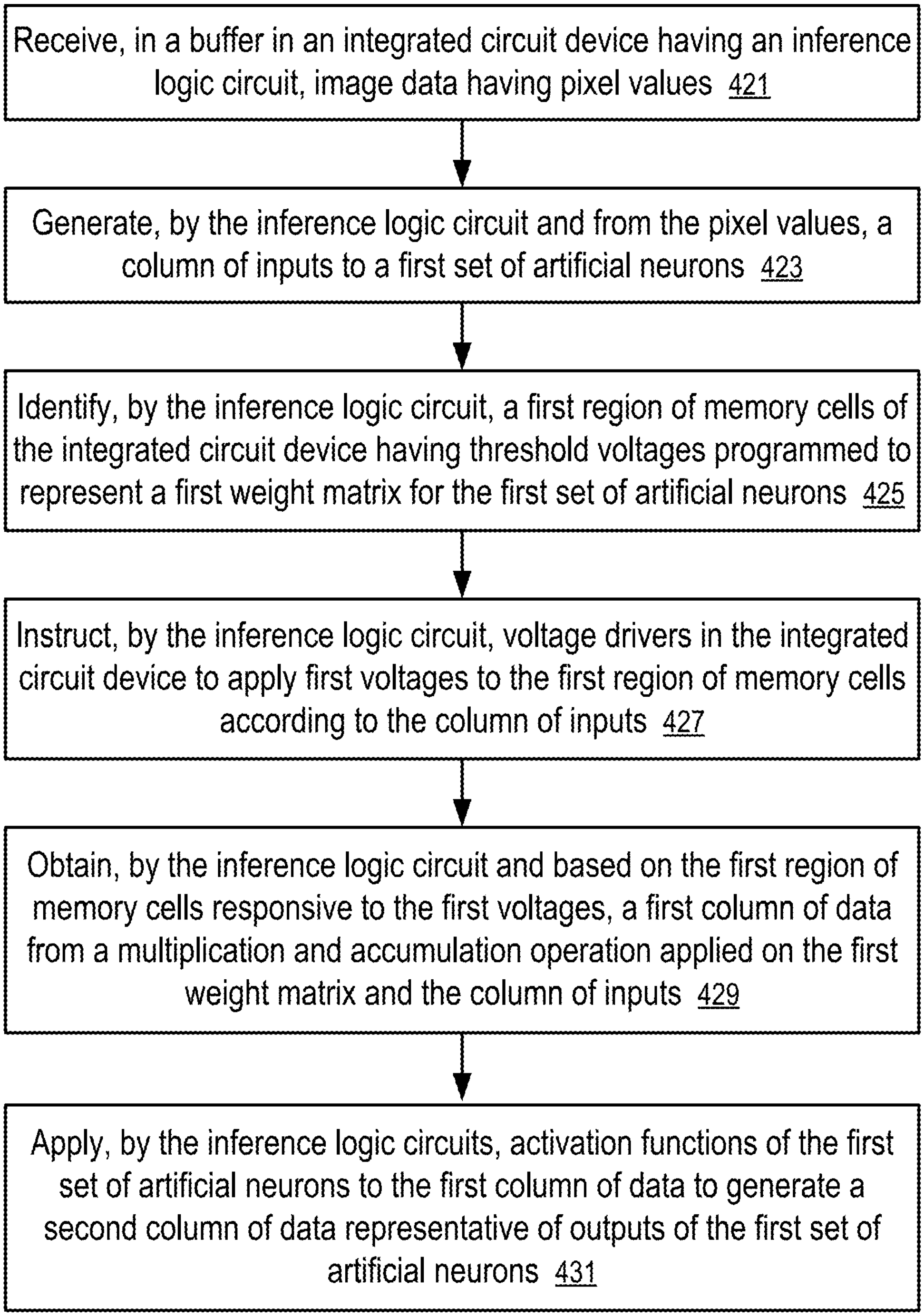
FIG. 13 shows a method of artificial neural network computation according to one embodiment.

FIG. 13 shows a method of artificial neural network computation according to one embodiment. For example, the method of FIG. 13 can be performed to implement computations in FIG. 11 in an integrated circuit device 101 of FIG. 1, FIG. 2, FIG. 3, FIG. 9, or FIG. 10 using multiplication and accumulation techniques of FIG. 4, FIG. 5, and FIG. 6 and memory cells 301 configured in layers as in FIG. 7 and FIG. 12.

At block 421, an integrated circuit device 101 receives, in a buffer 343 image data 351 having pixel values. The integrated circuit device 101 has an inference logic circuit 123 configured in a logic chip (e.g., integrated circuit die 109).

The buffer 343 can be configured in the logic chip or a memory chip (e.g., integrated circuit die 105) of the integrated circuit device 101. The buffer 343 can be implemented using a volatile memory (e.g., dynamic random-access memory (DRAM) and static random-access memory (SRAM)); and a memory cell array 113 in the memory chip can implement non-volatile memory cells 301 (e.g., NAND memory, NOR memory, flash memory, cross point memory).

Optionally, the integrated circuit device 101 can have an image sensor chip (e.g., integrated circuit die 103) having an image sensing pixel array 111. The integrated circuit device 101 can have a single integrated circuit package enclosing the logic chip, the memory chip, and the optional image sensor chip.

The integrated circuit device 101 can have an interface to receive the image data 351 from an external device (e.g., an image sensor 333, or a microprocessor 337). In some implementations, when the integrated circuit device 101 has an image sensor chip, an image processing logic circuit 121 in the logic chip can generate the image data in the buffer 343 based on an image captured by the image sensing pixel array 111.

The integrated circuit device 101 can have voltage drivers 115 configured in the logic chip or the memory chip to read data from and write data into the memory chip. The memory chip and the logic chip can be connected via heterogeneous direct bonding.

At block 423, in response to the image data 351 in the buffer 343, the inference logic circuit 123 generates, from the pixel values of the image data 351, a column 353 of inputs to a first set of artificial neurons in an artificial neural network.

At block 425, the inference logic circuit 123 identifies a first region of memory cells 301 of the integrated circuit device 101 having threshold voltages programmed to represent a first weight matrix 355 for the first set of artificial neurons.

In some implementations, the first region of memory cells 301 can be in a plurality of layers 305, . . . , 307 of the memory chip. For example, significant bits (e.g., 257, 258, . . . , 259) of a weight 250 in the first weight matrix 355 can be stored on different layers 305, . . . , 307 that are operable in parallel to perform an operation of multiplication and accumulation 357. Alternatively, the first weight matrix 355 can be stored in a single layer (e.g., 305 or 307) of the memory chip.

At block 427, the inference logic circuit 123 instructs voltage drivers 115 in the integrated circuit device 101 to apply first voltages (e.g., 205, 215, . . . , 225) to the first region of memory cells 301 according to the column 353 of inputs.

For example, the inference logic circuit 123 provides input bits 201, 211, . . . , 221 to the voltage drivers 203, 213, . . . , 223 to apply the first voltages (e.g., 205, 215, . . . 225) onto rows of memory cells in the first region. The memory chip connects output currents (e.g., 209, 219, . . . , 229) from columns of memory cells in the first region to a plurality of lines (e.g., 241, 242, . . . , 243). A set of digitizers (e.g., 233) are connected to the lines (e.g., 241) to digitize currents (e.g., 231) in the plurality of lines (e.g., 241) as multiple of a predetermined amount of current (e.g., 232) to obtain the first column 359 of data.

For example, applying the first voltages (e.g., 205, 215, . . . , 225) can include: applying a predetermined read voltage to a row of memory cells in the first region in response to a first significant bit (e.g., 201) of an input (e.g., 280) in the column 353 of inputs having a first value of one; and skipping application of the predetermined read voltage to the row of memory cells in the first region in response to a second significant bit (e.g., 202) of the input (e.g., 280) in the column 353 of inputs having a second value of zero.

For example, the applying of the predetermined read voltage is performed in a first period of time T; and the skipping of the application of the predetermined read voltage is performed in a second period of time T1 separate from the first period of time T1.

To store the weight matrix 355 in memory cells 301 in the memory chip, the voltage drivers 115 can be used to apply programming voltage pulses to adjust or program a threshold voltage of each respective memory cell 301 in the first region. The threshold voltage is programmed to a first level below or near the predetermined read voltage to store a significant bit (e.g., 257) of a weight (e.g., 250) in the first region in response to the significant bit (e.g., 257) having the first value of one, or to a second level above the predetermined read voltage to store the significant bit (e.g., 257) in response to the significant bit (e.g., 257) having the second value of zero. The respective memory cell is configured to output, when the threshold voltage of the respective memory cell is programmed to the first level, the predetermined amount of current when applied the predetermined read voltage. Each respective memory cell in the layers 305, . . . , 307 for storing the weight matrices 341 is configured to output: the predetermined amount of current in response to the predetermined read voltage when the respective memory cell has a threshold voltage programmed to represent a value of one; or a negligible amount of current in response to the predetermined read voltage when the threshold voltage is programmed to represent a value of zero or in absence of the predetermined read voltage.

At block 429, the inference logic circuit 123 obtains, based on the first region of memory cells 301 responsive to the first voltages (e.g., 205, 215, . . . , 225), a first column 359 of data from an operation of multiplication and accumulation 357 applied on the first weight matrix 355 and the column 353 of inputs.

At block 431, the inference logic circuits 123 applies activation functions 361 of the first set of artificial neurons to the first column 359 of data to generate a second column 363 of data representative of outputs of the first set of artificial neurons.

The second column 363 of data can be used as an input to a next set artificial neurons; and the operations in block 425 to 431 can be repeated to perform the computations of the next set of artificial neurons.

For example, the inference logic circuit 123 identifies a second region of memory cells 301 of the integrated circuit device 101 having threshold voltages programmed to represent a second weight matrix 365 for the second set of artificial neurons. The inference logic circuit 123 instructs voltage drivers 115 in the integrated circuit device 101 to apply second voltages to the second region of memory cells 301 according to the second column 363 of data. The inference logic circuit 123 obtains, based on the second region of memory cells responsive to the second voltages, a third column of data from an operation of multiplication and accumulation 367 applied on the second weight matrix 365 and the second column 363 of data. The inference logic circuits 123 applies activation functions of the second set of artificial neurons to the third column of data to generate a fourth column of data representative of outputs of the second set of artificial neuron.

After the inference logic circuit 123 obtains outputs 347 of a set of output artificial neurons of the artificial neural network, the inference logic circuit 123 can store the outputs 347 in the buffer or in a layer 308 of memory cells 301 in the memory chip as a result of the artificial neural network responding to the pixel values of the image data 351 as an input.

Optionally, the inference logic circuit 123 is programmable. The inference logic circuit 123 can read a region of memory cells 301 of the integrated circuit device 101 to retrieve instructions 345 to process the image data 351 using the memory cells 301 storing the weight matrices 341 of the artificial neural network, including the first region of memory cells storing the first weight matrix 355 and the second region of memory cells storing the second weight matrix 365.

In some implementations, a portion of the instructions 345 is configured to instruct the inference logic circuit 123 to perform the computations of the activation functions 361, and determine the sizes and storage locations of the weight matrices (e.g., 355, 365) for various operations of multiplication and accumulation (e.g., 357, 367).

Optionally, the inference logic circuit 123 can be configured to perform at least a portion of computations of the activation functions 361 of the first set of artificial neurons using a third weight matrix stored in a region of memory cells 301 of the integrated circuit device 101.

Optionally, the inference logic circuit 123 is configured to perform computations of the activation functions 361 of the first set of artificial neurons using a plurality of parallel sets of logic circuits of the inference logic circuit 123.

In at least some embodiments, the inference capability of the integrated circuit devices 101 is used by the image processing logic circuit 121 to compress images.

Image data coming from the image sensing pixel array 111 of the integrated circuit device 101 (or an external image sensor 333) can be compressed to reduce the size of the image data for storage and to optimize the performance and communications bandwidth usage in transmitting the image data (e.g., over a computer network, or the internet, or both).

Computations for image compression can include, or be formulated to use, operations of multiplication and accumulation. Such operations can be performed more efficiently and quickly using the inference logic circuit 123 and the memory cell array 113.

For example, the computations of image compression can include the computation of transform coefficients of pixel values. For example, some image compression techniques use a discrete cosine transform (DCT) to convert a spatial distribution of pixel values as the sum of cosine functions of different magnitudes and predetermined frequencies, where the sum of the cosine functions at respective spatial locations has the pixel values. Image compression can be achieved at least in part by selectively removing some frequency components represented by the cosine functions. For example, high frequency components that are less visible/sensitive to a viewer; and thus, removing such high frequency components can have less visible degradation in the quality of an image reconstructed from the remaining components. The magnitudes of the cosine functions can be represented by coefficients of the discrete cosine transform. The conversion between the pixel values and the transform coefficients can be computed via an operation of multiplication and accumulation applied via a predetermined weight matrix. For example, the transform coefficients can be obtained by multiplying a predetermined weight matrix by the column of pixel values. Thus, instead of implementing the computing logic to obtain the transform coefficients as part of the image processing logic circuit 121, the image processing logic circuit 121 can be configured to provide input data to the inference logic circuit 123 and to request the inference logic circuit 123 to apply operations of multiplication and accumulation to the input data and the weight matrix stored in the memory cell array 113 to speed up computation, to reduce the complexity of the image processing logic circuit 121, and to reduce the energy consumption of the computations. The remaining computation of the image compression computation can be performed using the image processing logic circuit 121.

For example, the computations of image compression can involve scaling up a list of pixel values by a factor and applying an offset to the scaled values. Such a computation can be formulated as a multiplication and accumulation operation applied on a column of data having the pixel values and the offset and on a matrix of weights, including the factor.

For example, the computations of image compression can involve the use of an artificial neural network. For example, the artificial neural network can be used to identify segments of the image that are of interest. When a lossy compression technique is used (e.g., compression via discarding certain high frequency components resulting from a discrete cosine transform), the image processing logic circuit 121 can compress the segments of interest less aggressively than regions outside the segments. In some implementations, the image processing logic circuit 121 can crop the images to extract the segments identified using the artificial neural network and discard the images outside of the segments. In some compression techniques, a compressed image can be generated using an artificial neural network receiving the original image as an input.

When an artificial neural network is used in image compression, the inference logic circuit 123 can be used to perform the computation of the artificial neural network using weight matrices 341 of the artificial neurons stored in the memory cell array 113. The image processing logic circuit 121 can use the outputs of the artificial neural network, computed by the inference logic circuit 123, to generate a compressed image.

Figure 14:
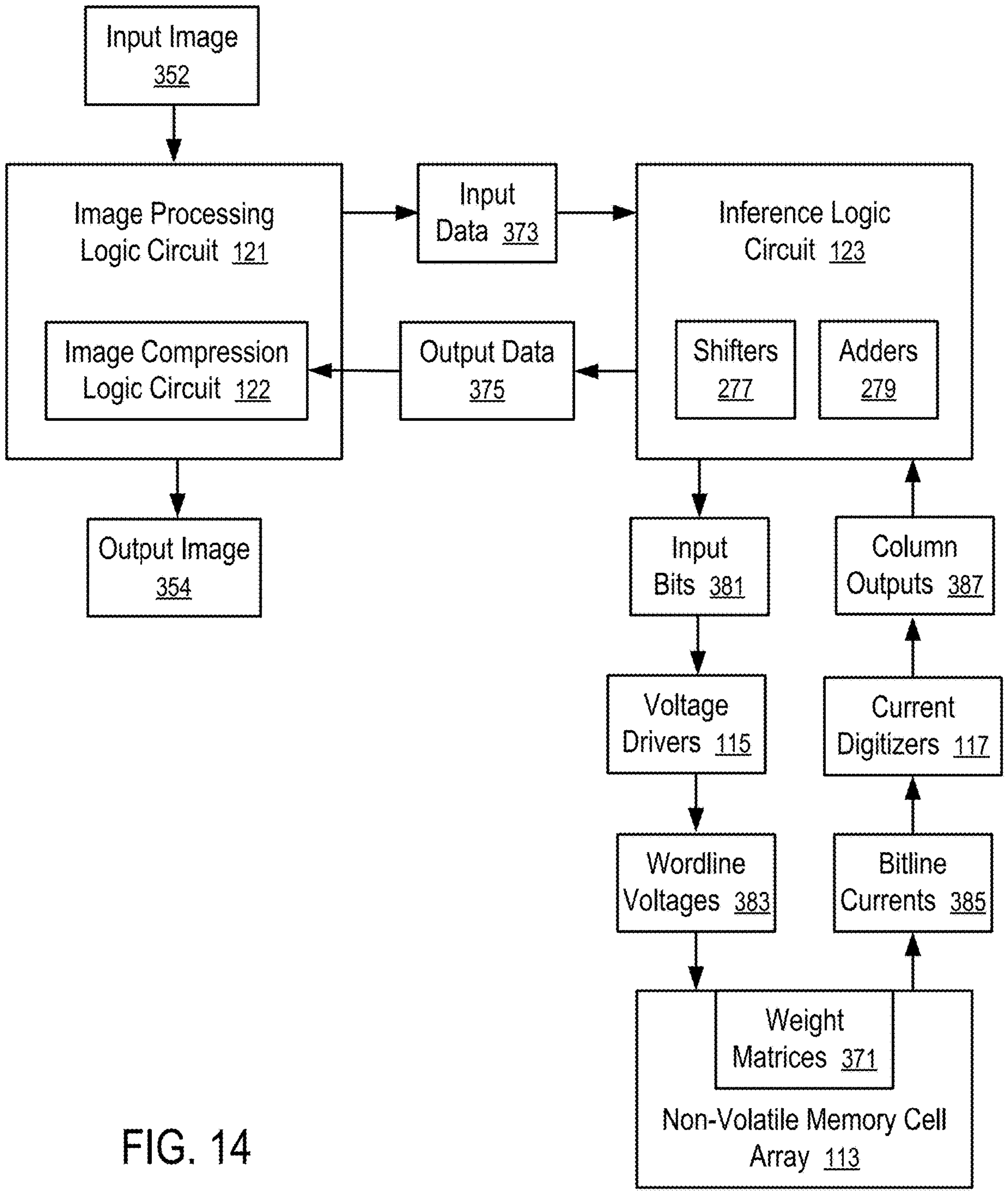
FIG. 14 shows an image processing logic circuit using an inference logic circuit in image compression according to one embodiment.

FIG. 14 shows an image processing logic circuit using an inference logic circuit in image compression according to one embodiment. For example, the technique of FIG. 14 can be implemented in integrated circuit devices 101 of FIG. 1, FIG. 2, FIG. 3, FIG. 9, and FIG. 10.

In FIG. 14, an image processing logic circuit 121 in a logic chip (e.g., integrated circuit die 109) in an integrated circuit device 101 is configured to compress an input image 352 to generate an output image 354. The image compression can include lossy compression, lossless compression, image trimming, etc.

The image compression computation can include, or formulated to include, multiplication and accumulation operations based on weight matrices 371 stored in a memory chip (e.g., integrated circuit die 105) in the integrated circuit devices 101. Preferably, the weight matrices 371 do not change for typical image compression such that the weight matrices 371 can be written into the non-volatile memory cell array 113 without repeatedly erasing and programming so that the useful life of the non-volatile memory cell array 113 can be extended. Some types of non-volatile memory cells (e.g., cross point memory) can have a high budget for erasing and programming. When the memory cells in the array 113 can tolerate a high number of erasing and programming cycles, the image compression computation can also be formulated to use weight matrices 371 that change during the computations of image compression.

The image processing logic circuit 121 can include an image compression logic circuit 122 configured to generate input data 373 for the inference logic circuit 123 to apply operations of multiplication and accumulation on weight matrices 371 to generate output data 375. The input data 373 can include, for example, pixel values of the input image 352, an identification/address of a weight matrix 371 stored in the memory cell array 113, or other data derived from the pixel values, or any combination thereof. After the operations of the multiplication and accumulation, the image processing logic circuit 121 can use the output data 375 received from the inference logic circuit 123 in compressing the input image 352 into the output image 354.

The input data 373 identifies a matrix 371 stored in the memory cell array 113 and a column of inputs (e.g., 280). In response, the inference logic circuit 123 uses a column of input bits 381 to control voltage drivers 115 to apply wordline voltages 383 onto rows of memory cells storing the weights of a matrix 371 identified by the input data 373. The voltage drivers 115 apply voltages of predetermined magnitudes on wordlines to represent the input bits 381. The memory cells 301 in the memory cell array 113 are configured to output currents that are negligible or multiples of a predetermined amount of current 232. Thus, the combination of the voltage drivers 115 and the memory cells 301 storing the weight matrices 371 functions as digital to analog converters configured to convert the results of bits of weights (e.g., 250) multiplied by the bits of inputs (e.g., 280) into output currents (e.g., 209, 219, . . . , 229). Bitlines (e.g., lines 241, 242, . . . , 243) in the memory cell array 113 sum the currents in an analog form. The summed currents (e.g., 231) in the bitlines (e.g., line 241) are digitized as column outputs 387 by the current digitizers 117 for further processing in a digital form (e.g., using shifters 277 and adders 279 in the inference logic circuit 123) to obtain the output data 375.

As illustrated in FIG. 4 and FIG. 5, the wordline voltages 383 (e.g., 205, 215, . . . 225) are representative of the applied input bits 381 (e.g., 201, 211, . . . , 221) and cause the memory cells in the array 113 to generate output currents (e.g., 209, 21, . . . , 229). The memory cell array 113 connects output currents from each column of memory cells to a respective line (e.g., 241, 242, . . . , or 243) to sum the output currents for a respective column. Current digitizers 117 can determine the bitline currents 385 in the lines (e.g., bitlines) in the array 113 as multiples of a predetermined amount of current 232 to provide the summation results (e.g., 237, 236, . . . , 238) as the column outputs 387. Shifters 277 and adders 279 of the inference logic circuit 123 (or in the memory chip) can be used to combine the column outputs 387 with corresponding weights for different significant bits of weights (e.g., 250) as in FIG. 5 and with corresponding weights (e.g., 250) for the different significant bits of the inputs (e.g., 280) as in FIG. 6 to generate results of multiplication and accumulation.

The inference logic circuit 123 can provide the results of multiplication and accumulation as the output data 375. In response, the image compression logic circuit 122 can provide further input data 373 to obtain further output data 375 by combining the input data 373 with a weight matrix 371 in the memory cell array 113 through operations of multiplication and accumulation. Based on output data 375 generated by the inference logic circuit 123, the image compression logic circuit 122 converts the input image 352 into the output image 354.

For example, the input data 373 can be the pixel values of the input image 352 and an offset; and the weight matrix 371 can be applied to scale the pixel values and apply the offset.

For example, the input data 373 can be the pixel values of the input image 352; and the weight matrix 371 can be configured to compute transform coefficients of predetermined functions (e.g., cosine functions) having a sum representative of the pixel values, such as coefficients of discrete cosine transform of a spatial distribution of the pixel values. For example, the image compression logic circuit 122 can be configured to perform the computations of color space transformation, request the inference logic circuit 123 to compute the coefficients for discrete cosine transform (DCT), perform quantization of the DCT coefficients, and encode the results of quantization to generate the output image 354 (e.g., in a joint photographic experts group (JPEG or JPG) format).

For example, the input data 373 can be the pixel values of the input image 352; and the computation of an artificial neural network having the weight matrices 371 can be performed by the inference logic circuit 123 to identify one or more segments of the input image 352 containing content of interest. The image compression logic circuit 122 can adjust compression ratios for different segments of input image 352 to preserve more details in segments of interest and to compress more aggressively in other segments. Optionally, regions outside of the segments of interest can be deleted.

For example, an artificial neural network can be trained to rank the levels of interest in different segments of the input image 352. After the inference logic circuit 123 identifies the levels of interest in the output data 375 based on the computation of the artificial neural network responsive to the pixel values of the input image 352, the image compression logic circuit 122 can adjust compression ratios for different segments according to the ranked levels of interest of the segments. Optionally, the artificial neural network can be trained to predict the desired compression ratios of different segments of the input image 352.

In some implementations, a compression technique formulated using an artificial neural network is used. The output data 375 includes data representative of a compressed image; and the image compression logic circuit 122 can encode the output data 375 to provide the output image 354 according to a predetermined format.

Figure 15:
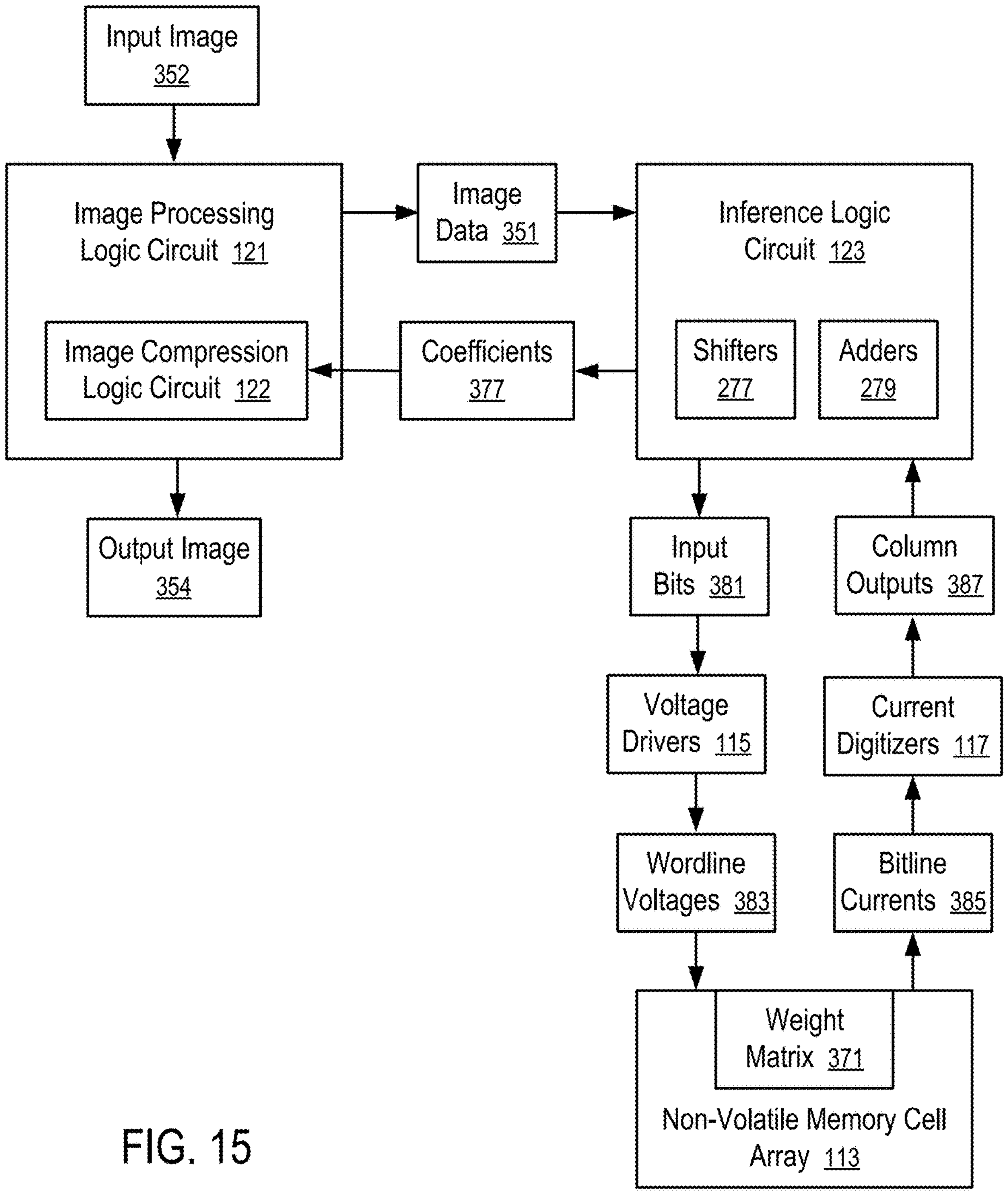
FIG. 15 and FIG. 16 illustrates examples of an image processing logic circuit using an inference logic circuit in image compression according to one embodiment.
Figure 16:
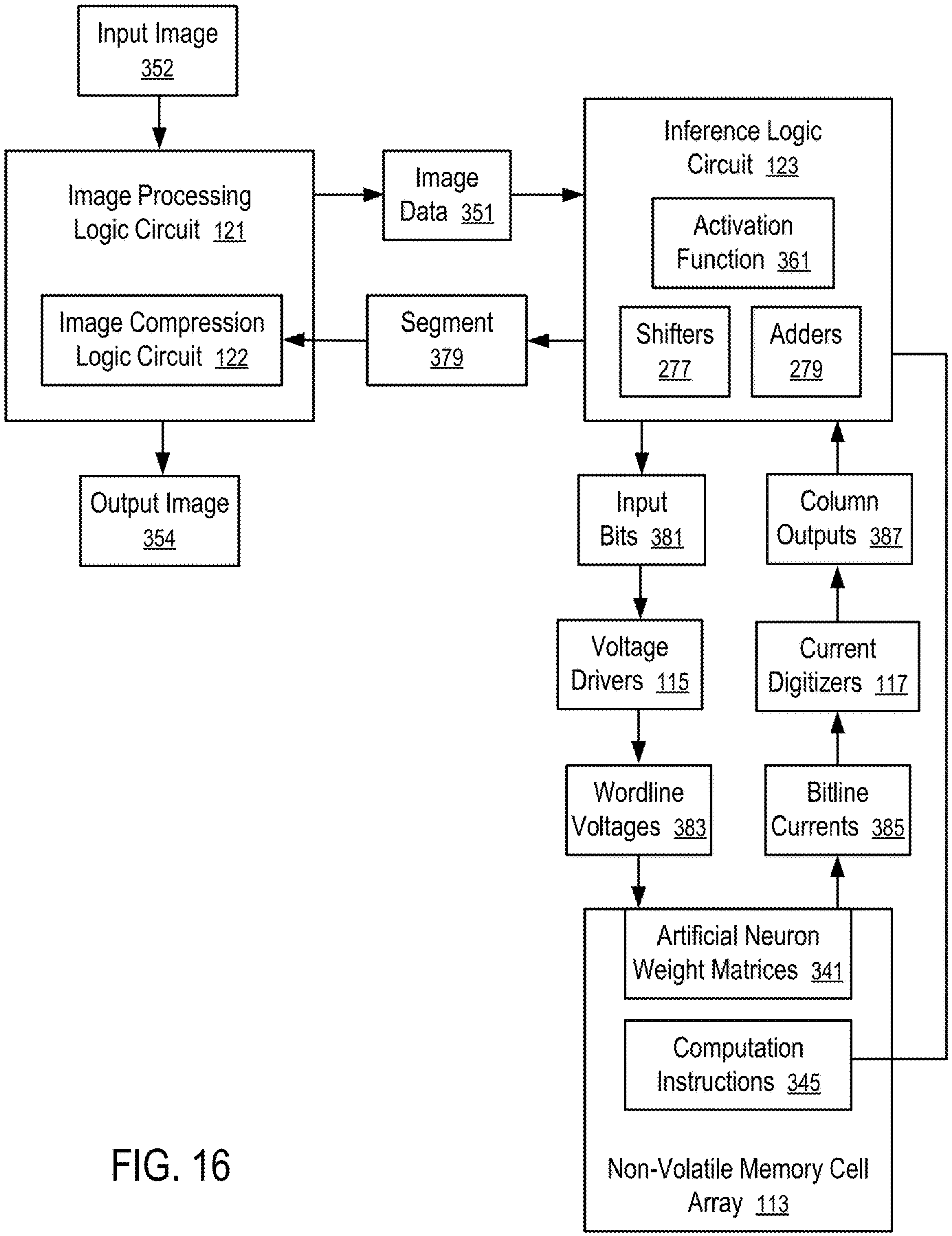

FIG. 15 and FIG. 16 illustrates examples of an image processing logic circuit using an inference logic circuit in image compression according to one embodiment.

Similar to FIG. 14, the image processing logic circuit 121 in FIGS. 15 and 16 has an image compression logic circuit 122 configured to compress an input image 352 to generate an output image 354 using the computations performed by the inference logic circuit 123.

In FIG. 15, the image processing logic circuit 121 provides image data 351 representative of a column of pixel values as an input to the inference logic circuit 123 to obtain transform coefficients 377. The image processing logic circuit 121 can have an image compression logic circuit 122 configured to use the transform coefficients 377 to convert the input image 352 to the output image 354.

For example, the image compression logic circuit 122 can perform a color space transformation to convert the colors in the input image 352 from a source color space (e.g., intensity levels in red, green, blue) to a target color space more suitable for compression (e.g., intensity levels in luma or luminance, blue-difference chroma, and red-difference chroma).

After the color space transformation, the image compression logic circuit 122 provides a block of pixels based on pixel values in the target color space as the image data 351 to request the inference logic circuit 123 to convert the image data 351 into coefficients of functions such that the sum of the functions provides the pixel values at predetermines space locations. The inference logic circuit 123 can generate the coefficients 377 by multiplying a predetermined weight matrix 371 by a column of inputs representative of the pixel values received from the image compression logic circuit 122.

Similar to FIG. 14, the inference logic circuit 123 can use the voltage drivers 115 and current digitizers 117 to read the weight matrix 371 according to input bits 381 representative of the pixel values provided in the image data 351 to generate column outputs 387. When an input bit (e.g., 201) has a value of zero, a row of memory cells (e.g., 207, 206, . . . , 208) connected to a wordline driven by the voltage driver (e.g., 203) controlled by the input bit (e.g., 201) are not read; and thus the memory cells connected to the wordline output negligible amount of currents into bitlines (e.g., lines 241, 242, . . . , 243). When an input bit (e.g., 201) has a value of one, a row of memory cells (e.g., 207, 206, . . . , 208) connected to a wordline driven by the voltage driver (e.g., 203) controlled by the input bit (e.g., 201) are read; and thus each of the memory cells connected to the wordline outputs a predetermined amount of current 232 into bitlines (e.g., lines 241, 242, . . . , 243). The input bits 381 can have multiple bits that have values of one, which can cause multiple rows/wordlines to be read concurrently at the same time for summing as output currents in bitlines to obtain the column outputs 387 through the current digitizers 117. The shifters 277 and the adders 279 can combine column outputs 387 for different significant bits of inputs (e.g., 280) and weights (e.g., 250), as in FIG. 5 and FIG. 6, to generate, as the transform coefficients 377, the results of multiplication and accumulation operations.

Optionally, the image compression logic circuit 122 provides one block of image data 351 a time to the inference logic circuit 123 to obtain corresponding transform coefficients 377 (e.g., DCT coefficients) of the block. Alternatively, the image compression logic circuit 122 provides multiple block of image data 351 a time to the inference logic circuit 123; and the memory cell array 113 can store multiple copies of the weight matrix 371 to compute the coefficients 377 for the multiple blocks at the same time to speed up the computation.

After the conversion of a spatial distribution of pixel values for a block (e.g., 8×8 pixels), the image compression logic circuit 122 can perform quantization to discard some less visible components and encode the results of quantization to generate the output image 354.

In some implementations, the color space transformation can be performed via multiplying a color matrix by the column of color components. Such multiplication and accumulation operations can also be performed by the inference logic circuit 123. For example, the memory cell array 113 can include multiple copies of the color matrix; and a column of color components of multiple pixels can be used as an input for multiplication and accumulation with the color matrices to obtain the color components in the target color space.

In FIG. 16, the image processing logic circuit 121 provides image data 351 representative of a column of pixel values as an input to the inference logic circuit 123 to perform the computation of an artificial neural network trained to identify image segments 379 in the image data 351 that are of interest. For example, the segments 379 can be classified to contain images of objects of interest and in one or more predefined categories. In some implementations, the artificial neural network is trained to rank regions of the input image 352 to identify levels of interest in the regions. Segments having levels of interest above a threshold can be classified as segments of interest.

Based on the segments 379 identified as being of interest, or based on rankings of interest levels of different segments in the input image 352, the image compression logic circuit 122 can apply different compression strategies.

For example, the image compression logic circuit 122 can apply a first compression ratio to the segments 379 of interest in the input image 352 and apply a second compression ratio, higher than the first compression ratio to the remaining portion of the input image 352.

For example, the image compression logic circuit 122 can map the levels of interest for different segments of the input image 352 inversely to their compression ratios. A segment having a higher level of interest is compressed with a lower compression ratio than a segment having a lower level of interest. Thus, more details are preserved for segments of high levels of interest.

For example, the artificial neural network can be trained to predict the desirable compression ratios for different segments of the input image 352; and the image compression logic circuit 122 can be configured to compress different segments of the input images 352 according to the compression ratios predicted by the artificial neural network.

For example, the image compression logic circuit 122 can extract, from the input image 352, segments 379 of interest identified by the artificial neural network, compress the extracted segments 379, and discard the remaining portion of the input image 352.

In some implementations, the artificial neural network is trained to predict a compressed version of the input image 352.

The inference logic circuit 123 can perform the computation of the artificial neural network (e.g., as in FIG. 11). The inference logic circuit 123 executes the instructions to apply the artificial neuron weight matrices 341 to provide the image segments 379, predicted levels of interest, a predicted compressed image, or any combination thereof, according to the outputs of output neurons in the artificial neural network.

Similar to FIG. 14, the inference logic circuit 123 can use the voltage drivers 115 and current digitizers 117 to read an artificial neuron weight matrix 341 according to input bits 381 representative of the image data 351 to generate column outputs 387. The shifters 277 and the adders 279 combine column outputs 387 for different significant bits of inputs and weights, as in FIG. 5 and FIG. 6, to generate the results of multiplication and accumulation operations. The inference logic circuit 123 can include a number of parallel logic circuits to preform activation functions 361 of artificial neurons. As in FIG. 11, the inference logic circuit 123 can use the results of the activation functions 361 to determine the outputs of a set of artificial neuron and apply a next artificial neuron weight matrix 341 according to the computation instructions 345 to determine a column (e.g., 363) of combined inputs to a next set of artificial neurons. The process as controlled by the computation instructions 345 continues until the last set of artificial neurons provides, as the image segments 379, levels of interest, or predicted compressed image, or any combination thereof, the result of the artificial neural network responsive to the image data 351.

The computation of the image compression logic circuit 122 to compress the input image 352 and generate the output image 354 can include the determination of transform coefficients 377. Thus, the techniques of FIG. 15 and FIG. 16 can be used together. In general, the image processing logic circuit 121 can call or request the inference logic circuit 123 multiple times to perform various multiplication and accumulation operations in generating the compressed output image 354.

Figure 17:
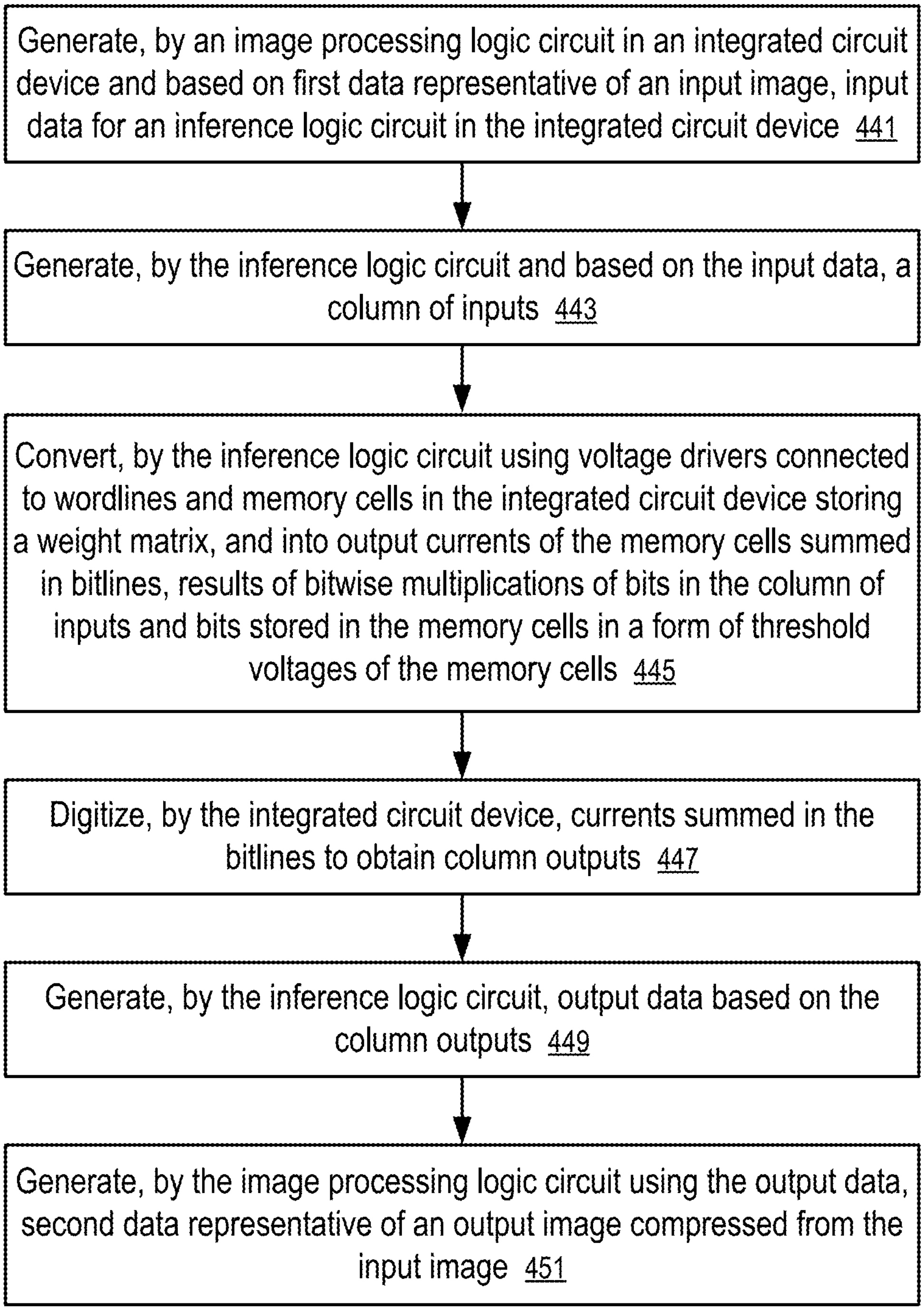
FIG. 17 shows a method of image compression computation according to one embodiment.

FIG. 17 shows a method of image compression computation according to one embodiment. For example, the method of FIG. 17 can be performed in an integrated circuit device 101 of FIG. 1, FIG. 2, FIG. 3, FIG. 9, or FIG. 10 using the image compression computations illustrated in FIG. 14, 15, and FIG. 16, using the multiplication and accumulation techniques of FIG. 4, FIG. 5, and FIG. 6, and using memory cells 301 configured in layers as in FIG. 7 and FIG. 12.

At block 441, an image processing logic circuit 121 in an integrated circuit device 101 generates, based on first data representative of an input image 352, input data 373 for an inference logic circuit 123 in the integrated circuit device 101.

For example, the integrated circuit device 101 can have an image sensing pixel array 111 on a first integrated circuit die 103 to capture the input image 352, or an interface 125 to receive the input image 352 from an external device (e.g., an image sensor 333 or a microprocessor 337), or both the array 111 and the interface 125. The integrated circuit device 101 can have an image processing logic circuit 121 and an inference logic circuit 123 on a second integrated circuit die 109. The integrated circuit device 101 can further include an array 113 of memory cells 301 on a third integrated circuit die 105. The integrated circuit device 101 can have voltage drivers 115 and current digitizers 117 on the second integrated circuit die 109, or the third integrated circuit die 105, or both. The integrated circuit device 101 can have a single integrated circuit package configured to enclose at least the second integrated circuit die 109 and the third integrated circuit die 105.

For example, the input data 373 can include image data 351 specifying pixel values of the input image 352 and an indication of a location of the weight matrix (e.g., 371 or 341) in a memory cell array 113 in the integrated circuit device 101.

For example, the input data 373 can include image data 351 specifying pixel values of the input image 352 and an indication of a location of computation instructions 345 configured to implement the computations of an artificial neural network having weight matrices 341 stored in the memory cell array 113.

At block 443, the inference logic circuit 123 generates, based on the input data 373, a column of inputs (e.g., 280).

For example, the column of inputs (e.g., 280) can include pixel values of the input image 352. The inference logic circuit 123 can use the weight matrices (e.g., 371, 341) to transform the column of inputs (e.g., 280) to perform color space transformation, to perform discrete cosine transform, to generate an output of an artificial neural network, etc.

At block 445, the inference logic circuit 123 converts, using voltage drivers 115 connected to wordlines (e.g., lines 281, 282, . . . , 283) and memory cells 301 in the integrated circuit device 101 storing a weight matrix (e.g., 371 or 341), bitwise multiplication results into output currents (e.g., 209, 219, . . . , 229) of the memory cells (e.g., 207, 217, . . . , 227) summed in bitlines (e.g., lines 241, 242, . . . , 243). The output currents (e.g., 209, 219, . . . , 229) are representative of the results of bitwise multiplications of bits (e.g., 201, 211, . . . , 221) in the column of inputs (e.g., 280) and bits (e.g., 257) stored in the memory cells 301 in a form of levels of programmed threshold voltages of the memory cells 301.

For example, the inference logic circuit 123 can apply one column of significant bits of a predetermined weight in inputs (e.g., 280) to a weight matrix (e.g., 341 or 371) to obtain a column of multiplication and accumulation results; and the results for different significant bits can be combined via shifting and adding as in FIG. 5 and FIG. 6 to obtain the result of applying an operation of multiplication and accumulation to the column of inputs (e.g., 280) to the weight matrix (e.g., 341 or 371).

A typically column of bits 381 selects more than one row. Thus, instead of reading one row at a time, multiple rows can be read at the same time to cause output currents to accumulate in bitlines. Thus, the memory cells 301 in the array 113 can function as digital to analog converters to generate bitwise multiplication results as currents for summing in an analog form.

For example, the inference logic circuit 123, instructs or causes voltage drivers 115 in the integrated circuit device 101 to apply wordline voltages 383 onto rows of memory cells 301 in a region of a memory cell array 113 in the memory chip (e.g., integrated circuit die 105). The memory cell array 113 connects output currents (e.g., 209, 219, . . . , 229) from columns of memory cells 301 in the region to a plurality of lines (e.g., 241, 242, . . . , 243) respectively. Current digitizers 233 connected to the lines (e.g., 241) in the integrated circuit device 101 digitize currents (e.g., 231) in the plurality of lines (e.g., 241) as multiples of a predetermined amount of current 232 to obtain a column of data.

For example, the inference logic circuit 123 can include shifters 277 to shift columns of data generated from different significant bits (e.g., 257, 258, . . . , 259) of weights (e.g., 250) and different significant bits (e.g., 201, 202, . . . , 204) of inputs (e.g., 280) to apply the weights (e.g., 250) of respective significant bits (e.g., 257, 258, . . . ; 201, 202, . . . ). The inference logic circuit 123 can include adders 279 to sum the results of the shifters 277 and generate results in a column of data resulting from an operation of multiplication and accumulation applied to a matrix of weights (e.g., 250) and a column of inputs (e.g., 280).

For example, a threshold voltage of each respective memory cell in the region can be programmed to: a first level to store a significant bit of a weight in the first region in response to the significant bit having a first value of one; or a second level above a predetermined read voltage to store the significant bit in response to the significant bit having a second value of zero. The respective memory cell is configured to output, when the threshold voltage of the respective memory cell is programmed to the first level, the predetermined amount of current 232 when read using the predetermined read voltage. The respective memory cell is configured to output a negligible amount of current when the respective memory is not read.

When an input bit 381 has the first value of one, the inference logic circuit 123 uses a voltage driver 115 to apply the predetermined read voltage to a wordline connected to a row of memory cells in the region to read first memory cells in the row. When the input bit 381 has the second value of zero, the inference logic circuit 123 causes the voltage driver 115 to skip reading the row of memory cells (e.g., by applying a voltage that causes negligible output currents from the row of memory cells).

At block 447, current digitizers 117 of the integrated circuit device 101 digitize currents (e.g., 231) summed in the bitlines (e.g., 241, 242, . . . , 243) to obtain column outputs 387.

At block 449, the inference logic circuit 123 generates output data 375 based on the column outputs 387 (e.g., using shifters 277 and adders 279).

For example, the output data 375 can include coefficients 377 to represent a spatial distribution of the pixel values, identified in the input data 373, by a sum of predetermined functions of magnitudes corresponding to, or specified by, the coefficients such that the sum of the predetermined functions has the pixel values at a plurality of locations. For example, the predetermined functions can be cosine functions for a discrete cosine transform.

For example, the weight matrices 371 stored in the memory cell array 113 can include a color matrix; the input data 373 specifies pixel values specified in a first color space (e.g., red, green, blue); and the output data 375 can include pixel values in a second color space (e.g., luma, blue-difference chroma, and red-difference chroma; or luminance, blue-difference chroma, and red-difference chroma).

For example, the output data 375 can include an identification of a segment 379 in the input image 352, where the segment 379 is predicted by an artificial neural network, having the weight matrices 341 stored in the memory cell array 113, to be of interest.

For example, the output data 375 can include levels of interest in segments 379 of the input image 352, where the levels of interest are ranked by an artificial neural network implemented via computation instructions 345.

For example, the output data 375 can include desired compression ratios predicted by an artificial neural network for segments 379 of the input image 352.

For example, the output data 375 can include a compressed image predicted by an artificial neural network; and the inference logic circuit 123 is configured to execute the computation instructions 345 to apply the weight matrices 341 to generate the output data.

At block 451, the image processing logic circuit 121 generates, using the output data 375, second data representative of an output image 354 compressed from the input image 352.

For example, an image compression logic circuit 122 in the image processing logic circuit 121 can be configured to perform quantization of the coefficients 377 provided in the output data 375 to reduce image information for compression, and encode a result of the quantization to generate the second data.

For example, the image compression logic circuit 122 can be configured to apply compression ratios according to the output data 375.

For example, when the output data 375 identifies a segment 379 as being of interest, the image compression logic circuit 122 can compress the segment at a first compression ratio, and compress a region of the input image 352 outside of the segment 379 at a second compression ratio higher than the first compression ratio. Optionally, the image compression logic circuit 122 can discard the image data outside of segments 379 of interest.

For example, when the output data 375 identifies different ranked levels of interest for different segments 379, the image compression logic circuit 122 can compress the segments 379 of the input images at compression ratios according to the levels of interest. For example, compression ratios can decrease for segments of increased levels of interest.

Optionally, the inference logic circuit 123 can include a plurality of parallel logic circuits configured to evaluate an activation function 361 for a column of combined inputs to a set of artificial neurons to generate a column of outputs of the set of artificial neurons.

In at least some embodiments, a device is manufactured to have the capability of learning to monitor a condition of interest to a user. For example, such a device can be configured with an image sensor to generate image data suitable for monitoring different conditions. Different users can use the device to monitor different conditions which may not be known at the time of the manufacturing of the device. For example, a user may want to use the device to monitor a condition of the presence of water at a location. In response to the presence of water at the location, the device can generate an alert or notification to the user. The device can be implemented using an integrated circuit device 101 discussed above. The user can train the device to tell apart instances of absence of the condition and instances of presence of the condition, by showing different conditions to the device. An artificial neural network implemented in the integrated circuit device can be trained to classify the images captured during the training period to reduce or minimize the differences between the classifications identified by the user and the classifications generated by the artificial neural network. Subsequently, the device can periodically capture an image of the scene at the location and perform the computations of the artificial neural network responding to the captured image. When the classification identified by the artificial neural network is associated with the presence of the condition, the device can generate a notification or alert to the user.

In some implementations, the device can be configured to monitor variations of conditions at a location that are considered normal. The device is thus trained to detect an abnormal condition that is substantially different from the normal conditions. In response to detecting an abnormal condition, the device generates a communication, an alert, a report, a notification to a mobile device (e.g., smartphone) of the user or an administrator. Optionally, the device can include an alarm device which when activated can generate alarms in sound, or light, or both.

For example, such a device can include a digital camera implemented using integrated circuit devices 101 with memory chips to provide both storage services and services for multiplication and accumulation.

The digital camera can be configured to record images in one portion of the memory cells 301 in a memory cell array 113 in the integrated circuit device 101, while another portion of the memory cells 301 is used to store weight matrices 371 and 341 in a way as illustrated in FIG. 4 and FIG. 5 to facilitate operations of multiplication and accumulation.

The memory cell array 113 can include weight matrices 341 of an artificial neural network configured to classify the scene captured in an image recorded by the digital camera. When the classification of the recorded image of the scene is in a predetermined category, the digital camera can generate a report, an alert, a notification to the user.

During a training period, the user can arrange the digital camera to capture images of the scene of varying conditions. Some of the conditions are assigned classifications outside of the category; and other conditions are assigned classifications in the category. The digital camera can store a training data set in the memory cell array 113; and the training data set includes images of the scene captured during the training period, and the classifications of the images specified by the user. A set of computation instructions in the memory cell array 113 can be executed by the inference logic circuit 123 to perform machine learning in adjusting the weight matrices 341 to reduce or minimize the differences between the classifications generated by the artificial neural network having the weight matrices 341 and the classifications provided by the user.

After the training period, the user can configure the digital camera to periodically capture an image of a scene monitored by the digital camera, and perform the computations of the artificial neural network having the weight matrices 341 to generate a classification of the image. When the classification is in the predetermined category, the digital camera can generate a report, an alert, a notification to a communication address of the user or an administrator. Upon reviewing the image associated with the report, the user or administrator can confirm or modify the classification. In response to the user or administrator specifying a different classification for the image, the digital camera can promote the image as part of the training data set for further training and adjustment of the weight matrices 341 of the artificial neural network. Alternatively, the user or administrator can dismiss the report to cause the digital camera to erase the image when storage spaces are needed to store further images.

Periodically, the user or the administrator can review the images recorded in the memory cell array 113 that have classifications outside of the predetermined category to suppress alerts and notifications. When a classification error is discovered for an image, the user or the administrator can indicate the correction to the classification to cause the digital camera to promote the corresponding image as part of the training data set for further adjustment and training of the weight matrices 341 of the artificial neural network.

Through the initial training and the subsequent adjustments, the digital camera can adapt to the monitoring of the scene to generate reports, alerts, notifications, or alarms, or any combination thereof for conditions of interest to users.

Optionally, the training set data can be uploaded to a server computer system to determine the update weight matrices 341, which can then be downloaded into the memory cell array 113 to improve the performance of the digital camera in monitoring conditions of interest to the user.

Optionally, the server computer system can provide a database of weight matrices of artificial neural networks trained for example conditions. The user or administrator can select and download the weight matrices of an artificial neural network trained for monitoring a similar condition as a starting point to further train the downloaded weight matrices for a specific application of interest to the user.

Optionally, the digital camera can be configured to keep an older version of the weight matrices 341 for current computations of the artificial neural network and separately programming the newer version of the weight matrices 341 (e.g., obtained through further training or through downloading from the server computer system). When the newer version is ready for computations, the digital camera can switch from using the older version to the newer version. Subsequently, the older version can be erased to reclaim the memory cells for storage usages (e.g., to store image data).

The digital camera can be configured to store image data in the memory cell array 113 for retrieval by a local or remote host system. The host system can instruct the digital camera to erase image data that is no longer of interest; and the digital camera can erase image data that has been transmitted to the host system. For example, the digital camera can store video images, or still images, or both in a compressed from with meta data about the recorded images or video.

As more image data is retained in the memory cell array 113, the free, available, unused storage spaces in the memory cell array 113 can shrink and be depleted. The digital camera can use at least a portion of the memory cell array 113 previously storing weight matrices 371 and 341 to continue recording more image data. For example, the digital camera can free the layers programmed to store an older version of the weight matrices 341 configured to perform operations of multiplication and accumulation. For example, the digital camera can free more layers (e.g., 303, 305, . . . , 307) of memory cells 301 from storing weight matrices 371 and 341, stop computation services relying upon the weight matrices that have been erased to store image data, and increase the portion of storage capacity of the memory cell array 113 used to retain image data.

For example, multiple copies of a color matrix, or a direct cosine transform matrix, or both can be used to accelerate the computations of color space transformation and direct cosine transform. Some or all of the copies can be erased to store image data when an amount of free or unused memory cells 301 in the array 113 reduced to or below a threshold. Optionally, the digital camera can use an alternative method to perform the computations of color space transformation and direct cosine transform without using the services of multiplication and accumulation facilitated by stored copies of the color matrix and the direct cosine transform matrix. For example, a microprocessor of the digital camera can execute instructions to perform the computations of multiplication and accumulation. Alternatively, computations (e.g., image compression) based on the color matrix and a direct cosine transform matrix can be stopped (e.g., to store image compressed using an alternative method).

Similarly, the memory cell array 113 can store weight matrices 341 of multiple artificial neural networks trained for different types of computations (e.g., image compression, level of interest classification, object detection, object classification, etc.). Computations of some or all of the artificial neural networks can be disabled, or performed in using an alternative resource (e.g., a microprocessor of the digital camera) to free memory cells to store image data.

After transmitting image data to a host system, or in response to instructions from the host system, a portion of retained image data can be deleted. As a result, the memory cell array 113 can have free memory cells usable to store weight matrices 341 and 371 in a way that supports operations of multiplication and accumulation. Then, the weight matrices 341 and 371 previously erased to make room for storing image data can be restored in the memory cell array 113 from a backup copy retained in the memory cell array 113 or by receiving a fresh copy from the host system.

Memory cells used as part of multiplier-accumulator units 270 as illustrated in FIG. 4, FIG. 5, and FIG. 6 are typically programmed to have threshold voltages in ways different from memory cells used to store data.

For convenience, the memory cells 301 programmed to store the weight matrices 341 and 371 in a way to facilitate operations of multiplication and accumulation can be referred to as synapse memory cells; and the memory cells programmed to store data (e.g., computation instructions 345) without being used in computations of multiplication and accumulation can be referred to as storage memory cells.

Although it is possible to program the threshold voltages of storage memory cells in a same way as synapse memory cells, it is generally advantageous to program the threshold voltages of storage memory cells in alternative ways (e.g., for enlarged storage capacity, improved writing performance). For example, in FIG. 4, FIG. 5, and FIG. 6, the synapse memory cells (e.g., 207, 217, . . . , 227) in the array 273 are programmed to store one bit (e.g., 257) of a weight (e.g., 250) per memory cell (e.g., 207). However, when the memory cell 207 is used to store data without the need to support operations of multiplication and accumulation, the threshold voltage of the memory cell 207 can be programmed to represent multiple bits. For example, when used as a storage memory cell, the memory cell 207 can be programmed in a multi-level cell (MLC) mode to store two bits, a triple level cell (TLC) mode to store three bits, a quad-level cell (QLC) mode to store four bits, or a penta-level cell (PLC) mode to store five bits, to significantly increase the storage capacity of the memory cell 207. Alternatively, the memory cell 207 can be programmed in a single level cell (SLC) to store one bit to extend the budget of erasing and programming the memory cell 207 and to increase the speed in programming the memory cell 207 for storing data.

Thus, when more storage spaces are needed, the digital camera can dynamically allocate more memory cells 301 in the array 113 as storage memory cells and use fewer memory cells 301 in the array 113 as synapse memory cells. Such a change can reduce computation services and acceleration for multiplication and accumulation. When there are sufficient storage spaces for retaining image data, the digital camera can dynamically allocate more memory cells 301 in the array 113 as synapse memory cells to provide enhanced computation services and acceleration for multiplication and accumulation.

Optionally, the digital camera can use a portion of the array 113 as storage memory cells to store a backup copy of data of synapse memory cells such that when there are sufficient storage spaces, the synapse memory cells can be restored. Optionally, the backup data can be stored in a compressed form in the storage memory cells to reduce storage usage.

Optionally, the digital camera can be configured to send a text-based report to a host system, or a user, or both in response to detection of anomaly. The report can include a user interface element which when activated (e.g., via a user clicking on a portion of the text in the report), the compressed video can be transmitted from the memory cell array 113 in the digital camera to the host system or a device of the user for playing back to the user. Optionally, the report can include user interface elements selectable by the user to request a download of the video, or to delete the video from the digital camera.

Figure 18:
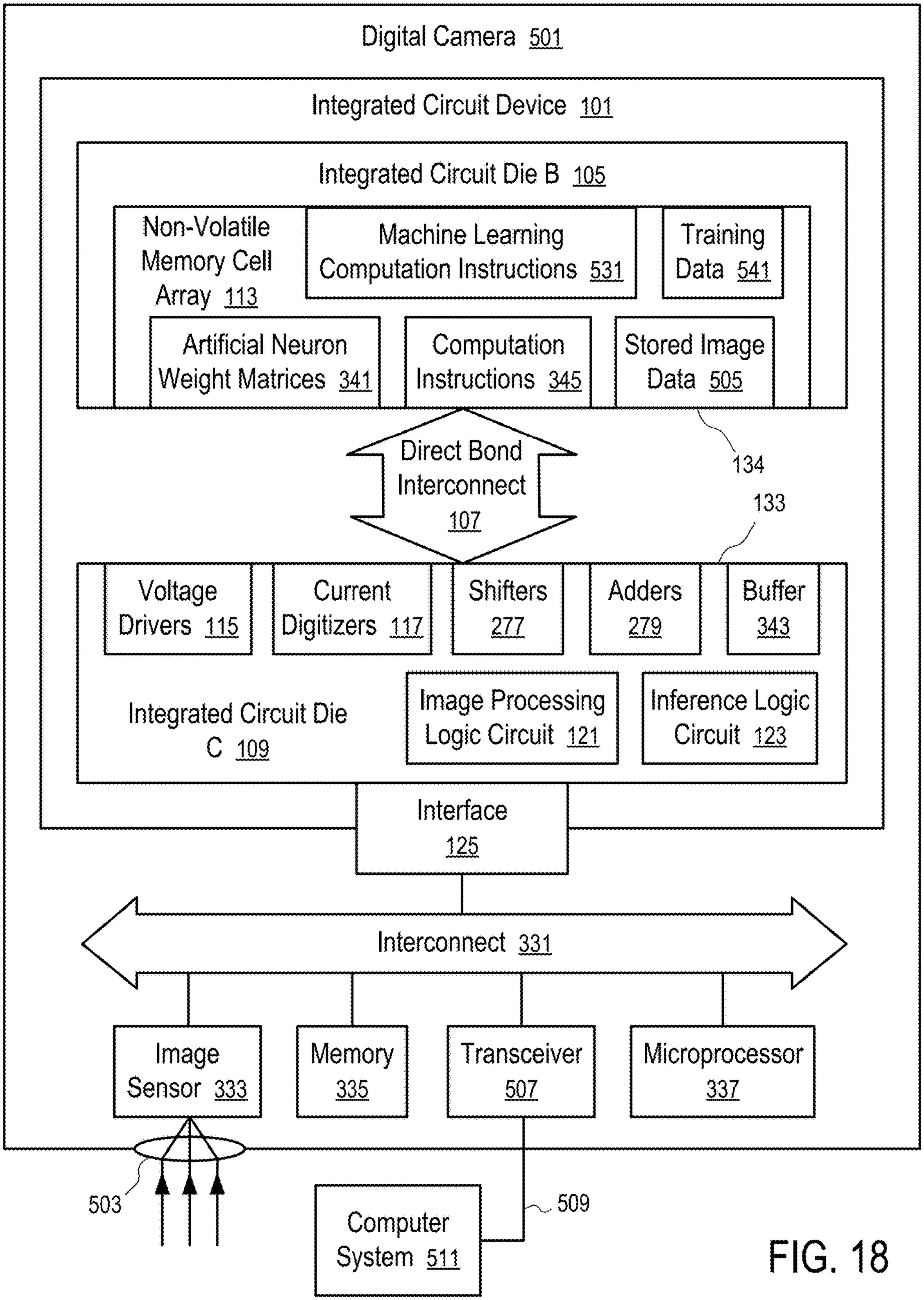
FIG. 18 shows a digital camera according to one embodiment.

FIG. 18 shows a digital camera according to one embodiment. For example, the digital camera 501 of FIG. 18 can be implemented using an integrated circuit device 101 of FIG. 1, FIG. 2, FIG. 3, FIG. 9, or FIG. 10. The integrated circuit device 101 in the digital camera 501 can be configured to perform computations of artificial neural networks as in FIG. 11 and image compression computations illustrated in FIG. 14, FIG. 15, and FIG. 16, using the multiplication and accumulation techniques of FIG. 4, FIG. 5, and FIG. 6. The integrated circuit device 101 in the digital camera 501 can have memory cells 301 configured in layers as illustrated in FIG. 7 and FIG. 12.

In FIG. 18, the digital camera 501 has an integrated circuit device 101 having an interface 125 connected to an interconnect 331. The digital camera 501 further includes an image sensor 333, a memory 335, a transceiver 507, and a microprocessor 337 (or a microcontroller, or another processor) that are connected to each other and to the integrated circuit device 101 via the interconnect 331. For example, the interconnect 331 can include one or more buses, such as a memory bus or a peripheral bus.

The digital camera 501 has a lens 503 configured to project an image on the image sensor 333. The microprocessor 337 or the image sensor 33 can write an input image 352 into the integrated circuit device 101 through its interface 125.

The integrated circuit device 101 can provide storage services to the microprocessor 337. For example, instructions executed by the microprocessor 337 and configuration data to operate the digital camera 501 can be stored in the memory chip (e.g., the integrated circuit die 105). The memory 335 can function as a main memory of the microprocessor 337.

As in FIG. 9, in response to an input image 352 being written into the integrated circuit device 101, the integrated circuit device 101 can place the input image 352 in the buffer 343 configured in the logic chip (e.g., integrated circuit die 109). Optionally, the buffer 343 can be configured in the memory chip (e.g., the integrated circuit die 105) or another chip.

The memory chip and the logic chip can be connected via heterogeneous direct bonding or hybrid bonding between surfaces 133 and 134 for improved communication bandwidth and density.

FIG. 18 illustrates an example of the memory chip connected to the interface 125 through the logic chip. Alternatively, the integrated circuit device 101 can be configured to have the logic chip connected to the interface 125 through the memory chip.

With the input image 352 in the buffer 343, the image processing logic circuit 121 can pre-process the input image 352 to generate image data 351 for processing by the inference logic circuit 123. For example, the inference logic circuit 123 can process the image data 351 to apply the computations of an artificial neural network, as in FIG. 11. For example, the image processing logic circuit 121 can use the inference logic circuit 123 to compress the input image 352 and generate an output image 354 as in FIG. 14, FIG. 15, and FIG. 16.

For example, the inference logic circuit 123 can use the voltage drivers 115 to apply voltages onto wordlines (e.g., 281, 282, . . . , 283) connected to synapse memory cells (e.g., 207, 217, . . . , 227; 206, 216, . . . , 226; . . . ; 208, 218, . . . , 228) in the array 113 to generate summed currents (e.g., 231) in bitlines (e.g., 241, 242, . . . , 243). The current digitizers 117 can convert the summed currents (e.g., 231) to column outputs 387. The shifters 277 and adders 279 can further process the column outputs 387 to generate results of multiplication and accumulation in the computation of an artificial neural network and in the computation of image compression. For example, the inference logic circuit 123 can execute computation instructions 345 stored in storage memory cells in the array 113 to perform the computations of an artificial neural network.

The integrated circuit device 101 can be configured to store the output image 354 with its meta data in storage memory cells in the memory chip (e.g., the integrated circuit die 105) as stored image data 505.

For example, based on the classification of an artificial neural network, the integrated circuit device 101 or the microprocessor 337 can decide whether to store the input image 352, or the output image 354, or both in the memory chip. For example, the meta data of the stored image data 505 can include a date and time of the input image 352, a classification of whether the image 352 captures an object of interest and if so, a bounding box of a portion of the image containing the image of the object, a classification of the object, etc.

For example, in response to a classification of the image 352 showing an object of interest, or an abnormal scene, the microprocessor 337 can generate a report including the meta data of the stored image data 505. The microprocessor 337 uses the transceiver 507 to transmit the report as an alert or notification to a computer system 511 via a wired or wireless connection 509. The report contains sufficient information for the computer system 511 to retrieve the storage image data 505, to request deletion or preservation of the storage image data 505, etc.

The memory cell array 113 can store machine learning computation instructions 531 executable by the inference logic circuit 123 to adjust artificial neuron weight matrices 341 according to training data 541 to learn how to classify an image captured by the image sensor 333 to identify a condition of interest to a user of the digital camera 501.

For example, the training data 541 can include images captured using the image sensor 333 and classifications of the images provided by the user of the digital camera 501. The classifications can be provided by the user in response to reviewing of the images. Alternatively, or in combination, the user can identify a classification and then use the digital camera to capture the images that are in the classification. In some applications, the digital camera 501 is configured to identify a condition that is illustrated via a plurality of images having the condition. In other applications, the digital camera 501 is configured to identify a condition (e.g., abnormal) that is illustrated via a plurality of images without the condition (e.g., being classified as normal); and when an image cannot be classified as being without the condition, the image is treated as having the condition (e.g., abnormal).

The machine learning computation instructions 531 can be configured to adjust, using a supervised machine learning technique or a reinforcement learning technique, the artificial neuron weight matrices 341 configured to generate a classification of an image in the training data 541 to reduce or minimize the differences between the classification determined using the artificial neuron weight matrices 341 and the classification specified in the training data 541 for the image. As a result, the artificial neuron weight matrices 341 can be used to perform classification in a way more similar to the way images are classified in the training data 541.

Optionally, the digital camera 501 can program memory cells 301 in the array 113 to store two versions of weight matrices 341 of an artificial neural network for the classification of an image. One version is programmed before the training using the training data 541. Another version is programmed as a result of the training using the training data 541. After the completion and validation of the training, the new version in the memory cell array 113 can be used for subsequent classifications of images captured by the image sensor 333; and the old version can be erased.

After more stored image data 505 and training data 541 have been added to the memory cell array 113, the memory cell array 113 may not have sufficient free storage spaces for recording further images. Before there is an indication or instruction to delete at least a portion of the stored image data 505, the integrated circuit device 101 can reconfigure some of the synapse memory cells as storage memory cells and degrade the multiplication and accumulation capability of the integrated circuit device 101 in exchange for more storage spaces.

For example, a portion of the artificial neuron weight matrices 341 and other weight matrices 371 can be erased from the memory cell array 113 to store further images.

Optionally, the integrated circuit device 101 can erase the entire artificial neural weight matrices 341 and thus stop the execution of computation instructions 345 that rely on the matrices 341. For example, the integrated circuit device 101 can store further image data without performing the computations of an artificial neural network or the computations of image compression. Optionally, the digital camera 501 can be configured to use the microprocessor 337 to perform the operations of multiplication and accumulation when the corresponding capability of the integrated circuit device 101 is degraded.

After the integrated circuit device 101 receives commands to delete sufficient spaces used by the stored image data 505, the memory cell array 113 can have free memory cells to restore the capability of performing operations of multiplication and accumulation. The integrated circuit device 101 can reconfigure some of the storage memory cells as synapse memory cells (e.g., to store artificial neuron weight matrices 341 in a way that can facilitate the computations illustrated in FIG. 4, FIG. 5, and FIG. 6). For example, the computer system 511 can provide a copy of the weight matrices 341 that have been previously erased from the memory cell array 113 to enlarge storage capacity. For example, a backup version of the erased weight matrices 341 can be recovered from a portion of the storage memory cells in the array 113.

In some implementations, the integrated circuit device 101 includes an array 111 of image sensing pixels. Thus, the digital camera 501 can be implemented without an image sensor 333 that is separate from the integrated circuit device 101, as in FIG. 19.

Figure 19:
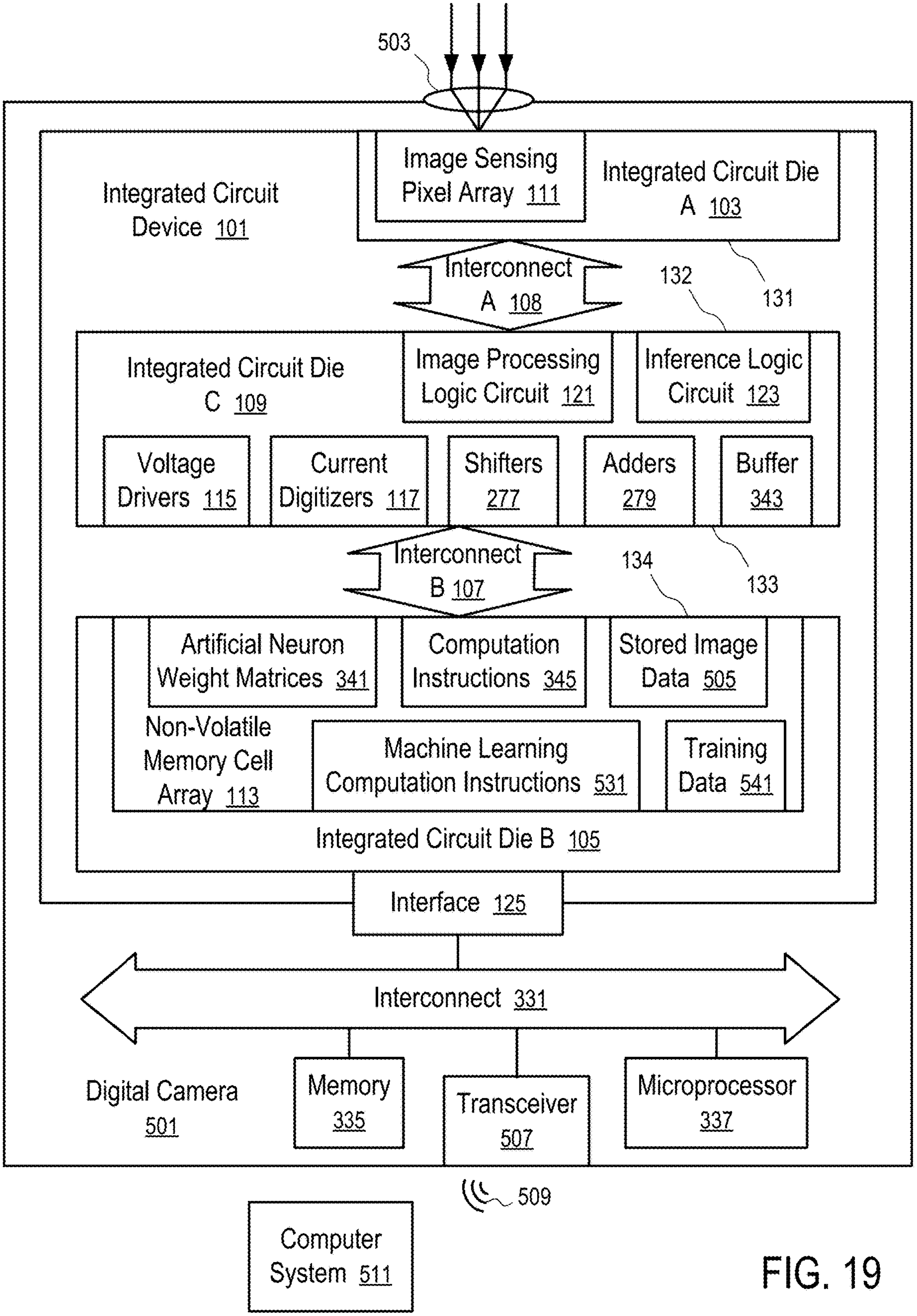
FIG. 19 shows another digital camera according to one embodiment.

FIG. 19 shows another digital camera according to one embodiment.

Similar to the digital camera 501 of FIG. 18, the digital camera 501 of FIG. 19 has an integrated circuit device 101 containing a memory chip (e.g., integrated circuit die 105), and a logic chip (e.g., integrated circuit die 109).

Further, as in FIG. 1, FIG. 2, FIG. 3, and FIG. 10, the integrated circuit device 101 in FIG. 19 has an image sensing pixel array 111 in an integrated circuit die 103.

The lens 503 of the digital camera 501 can project an image onto the image sensing pixel array 111. The image processing logic circuit 121 can use the image sensing pixel array 111 to capture an input image 352 and place the input image 352 in a buffer 343.

Once the input image 352 is in the buffer 343, the integrated circuit device 101 can process the input image 352 in a way as illustrated in connection with FIG. 18. For example, the input images 352 and their classifications specified by a user of the digital camera 501 can be used as training data 541; and the inference logic circuit 123 can execute the machine learning computation instructions 531 to adjust and update the artificial neuron weight matrices 341 for the classification of images.

In some implementations, the transceiver 507 is configured for a wireless local area network. Through the wireless connection 509, the digital camera 501 can communicate with a computer system 511 to provide a report about stored image data 505, to transmit the stored image data 505, to delete the stored image data 505. Alternatively, a wire connection 509 can be used, as in FIG. 18.

Figure 20:
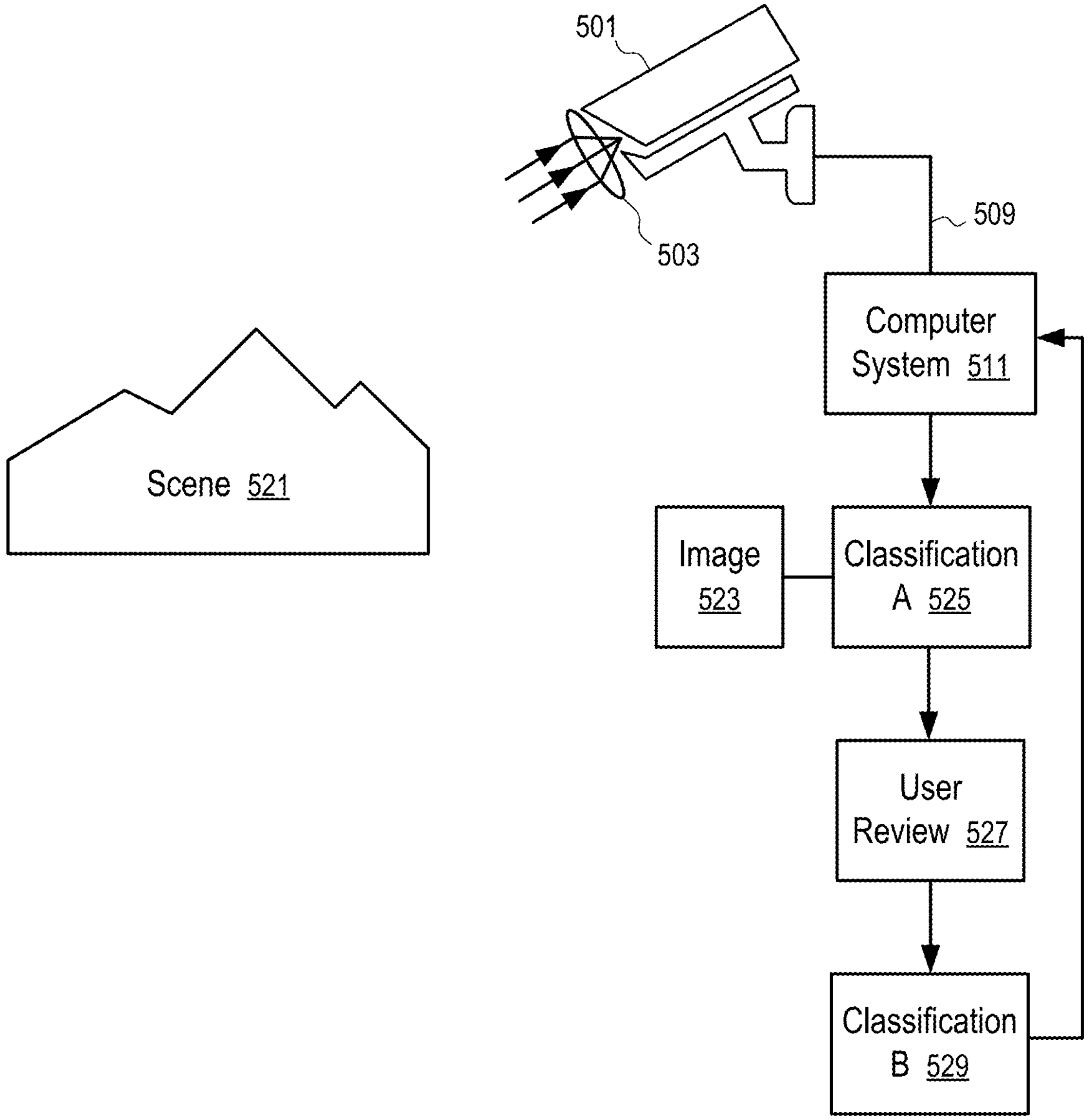
FIG. 20 illustrates the generation of training data for a digital camera according to one embodiment.

FIG. 20 illustrates the generation of training data for a digital camera according to one embodiment.

For example, the training data 541 in the digital camera 501 of FIG. 18 or FIG. 19 can be generated in a way as illustrated in FIG. 20.

In FIG. 20, a digital camera 501 is installed at a location to monitor a scene 521. The scene 521 can have one or more objects having varying states from time to time. For example, an object can enter the scene 521 at some time instances and leave the scene 521 at other time instances. A user can classify images of the scene 521 to define conditions that the digital camera 501 is to learn to monitor for the generation of reports, alerts, notifications, alarms, etc.

For accelerated training, the user of the digital camera 501 can arrange to have typical variations of the scene to occur during a training period to capture images 523 of the scene 521 in different conditions.

For a captured image 523, the weight matrices 341 in the memory cell array 113 of the digital camera 501 can be used to generate a classification 525 (e.g., as in FIG. 11). The user can perform a review 527 of the image 523 and the classification 525 using a computer system 511 connected to the digital camera 501.

For example, the computer system 511 can retrieve the image 523 and the classification 525 from the digital camera 501 for presentation to the user. If the classification 525 computed by the digital camera 501 is incorrect, the user can specify a correct classification 529 for the image 523. If the classification 525 computed by the digital camera 501 is correct, the user can accept the classification 525 as a correct classification 529 for the image 523. The computer system 511 can specify, for the image 523, the correct classification 529 using the connection 509 between the digital camera 501 and the computer system 511. The digital camera 501 can store data associating the image 523 with the correct classification 529 in the memory cell array 113 as part of training data 541.

In some implementations, the user can indicate to the computer system 511 that variations of the scene 521 of a predetermined classification 529 are to be presented to the digital camera 501 in a training session. In response, the computer system 511 identifies to the digital camera 501 the classification 529 for the session of recording images of the scene 521 as presented by the user. The user can send a signal to the computer system 511 to instruct the digital camera 501 to take an image 523, causing the digital camera 501 to generate the image 523 in association with the classification 529 without the need for presenting the image 523 to the user for a review 527 to speed up the acquisition of the training data 541.

In some implementations, the user can present the scene 521 with varying conditions for the digital camera 501 to capture images 523 of the scene 521 of different classifications 529 for the training data 541. Some of the images can be in a category that is configured to cause the digital camera 501 to generate reports, alerts, notifications, or alarms, or any combination thereof; and other images can be outside of the category.

In some implementations, the scene 521 of a classification to cause a report, alert, notification or alarm can be difficult to produce (e.g., an abnormal condition). Thus, during the training session, the user can present the scene 521 with varying conditions that are outside of the classification to show images 523 of the scene 521 that are outside of the category (e.g., the scene 521 with normal conditions). Subsequently, when an image of the scene 521 is captured and classified as dissimilar to the images that do not cause reports, alerts, notifications or alarms, the image is classified to be in the category configured to trigger a report, alert, notification, or alarm. Examples of images in the category (e.g., abnormal) can be accumulated during monitoring of the scene 521.

When there are free storage spaces in the memory cell array 113, the digital camera 501 can allocate more spaces for the storage of the training data 541. When storage spaces are needed for storing new images during monitoring of the scene 521 in a working mode, the digital camera 501 can reduce the storage spaces allocated for the training data by erasing a segment of oldest training data.

During the use of the digital camera 501 in the working mode, the digital camera 501 can generate a report, an alert, or a notification, or any combination thereof for an image 523 having a classification 525 in a predetermined category. In response to the report, alert, or notification, the user can use the computer system 511 to review 527 the image 523. If a false alarm is detected via the user review 527, the user can specify the correct classification 529 to request the addition of the image 523 and the correct classification 529 to the training data 541.

Optionally, the digital camera 501 can be configured to record at least some images 523 that have classifications 525 that do not trigger alerts or notifications. The user can optionally review the recorded such images 523 to determine whether the digital camera 501 has made errors in determining their classifications 525. If so, the user review 527 can generate the correct classifications 525 for the images 523 for addition to the training data 541.

In some applications, the scene 521 being monitored by the digital camera 501 is in a condition that does not require a report, notification, alert, or alert most of the time. Thus, the digital camera 501 can initially be configured to record images 523 with the assumption that the classifications 525 of the recorded images 523 are of the classification of normal. Periodically, the user can review the recorded images 523 and select some of the recorded images 523 as part of the training data 541. Thus, the training data 541 can be developed over a period of time; and the digital camera 501 can gradually become more accurate in reporting the scene 521 in abnormal conditions.

In some implementations, an image 523 stored in the memory cell array 113 (e.g., as part of the stored image data 505) can have meta data including the classification 525 of the image 523 computed using the weight matrices 341, an indication of whether the image 523 is part of the training data 541, and when available, the classification 529 of the image 523 identified by the user. Thus, a portion of the stored image data 505 can be identified via meta data as the training data 541.

Figure 21:
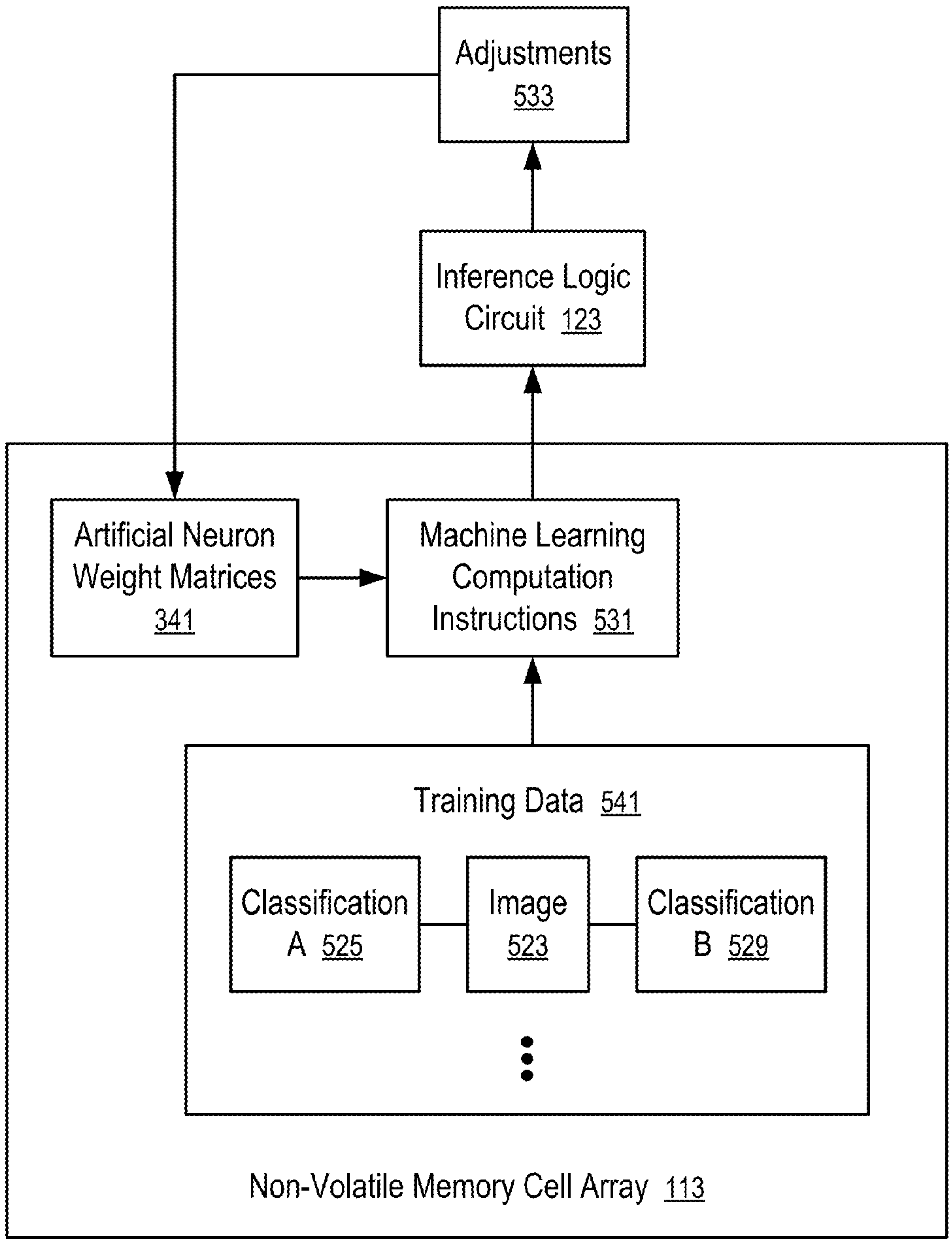
FIG. 21 shows the training of a digital camera to monitor a scene according to one embodiment.

After the updating of the training data 541 to include sample images 523 having mismatched classifications 525 generated by the digital camera 501 and the classifications 529 specified by the user, the digital camera 501 can perform computations to adjust the weight matrices 341 to reduce or eliminate the mismatches, as in FIG. 21.

FIG. 21 shows the training of a digital camera to monitor a scene according to one embodiment. For example, the training illustrated in FIG. 21 can be implemented in digital cameras 501 of FIG. 18 and FIG. 19.

In FIG. 21, the memory cell array 113 in a memory chip (e.g., integrated circuit die 105) of a digital camera 501 stores a set of training data 541. For example, the training data 541 can be a subset of stored image data 505 with meta data configured to mark the data in the subset as part of the training data 541.

In FIG. 21, an image 523 in the training data 541 has a classification 525 previously computed by the inference logic circuit 123 using the artificial neuron weight matrices 341. Further, the training data 541 includes a classification 529 identified by a user of the digital camera 501 for the image 523 (e.g., as in FIG. 20).

In general, the training data 541 can include multiple images 523. Some of the images 523 in the training data 541 can have mismatched between classifications 525 computed using the weight matrices 341 and classifications 529 identified by the user. Other images 523 can have classifications 525, computed using the weight matrices 341, that agree with the classifications 529 identified by the user.

To reduce the mismatches between the computed classifications 525 and user identified classifications 529, the inference logic circuit 123 can execute the machine learning computation instructions 531 to determine adjustments 533 to the artificial neuron weight matrices 341. For example, the computation instructions 531 can be configured according to supervised machine learning techniques, reinforcement learning techniques, etc.

In some implementations, the training data 541 is split into two subsets. One subset is used to generate the adjustments 533 to generate an updated version of the weight matrices 341; and the other subset is used for the validation of the updated version. For example, a portion of the memory cell array 113 can be programmed as synapse memory cells storing the updated version and used to determine the computed classification 525 for the images in the validation subset. When the updated version produces better agreements between computed classifications 525 and the user identified classifications 529 for the images 523 in the validation subset, the updated version can be accepted; and the digital camera 501 can switch to use the updated version in subsequent computations of classifications 525 of recorded images. Otherwise, the updated version can be rejected.

The digital camera 501 can dynamically change the allocations of memory cells for operations of multiplication and accumulation and memory cells for storing image data 505 and training data 541.

For example, a portion of the memory cell array 113 is configured as synapse memory cells that are part of multiplier-accumulator units 270. For example, to function as a synapse memory cell 207 to convert the result of a bitwise multiplication between a bit 201 of an input 280 and a bit 257 of a weight 250, the threshold voltage of the synapse memory cell 207 is programmed to a first level such that when a predetermined read voltage is applied, the memory cell 207 outputs a predetermined amount of current 232 to a bitline 241 to represent a stored weight bit 257 of one, when a predetermined read voltage is applied. To store a weight bit 257 of zero, the threshold voltage of the synapse memory cell 207 is programmed to a second level, higher than the first level, such that when the predetermined read voltage is applied, the memory cell 207 outputs a negligible amount of current into the bitline 241.

In contrast, when the memory cell 207 is used as a storage memory cell, the threshold voltage of the memory cell 207 can be programmed into one of a plurality of voltage regions, each representing one of a plurality of values. Read voltages are designed to test and determine which of the plurality of voltage regions contains the threshold voltages and thus, the value stored in the memory cell 207. For example, to store a 2-bit value in the memory cell 207, the threshold voltage can be programmed to one of four regions, designed to represent one of four possible 2-bit values. To determine the location of the threshold voltage of the memory cell 207, read voltages corresponding to boundaries among adjacent voltage regions can be applied; and the threshold voltage of the memory cell 207 is in a voltage region when the memory cell 207 is non-conductive at a lower read voltage of the voltage region and conductive at a higher read voltage of the voltage region. When the memory cell 207 is non-conductive, the memory cell 207 outputs a negligible amount of current to the bitline 241; and when the memory cell 207 is conductive, the memory cell 207 outputs more than a threshold amount of current to the bitline 241.

A synapse memory cell is programmed to store data in a way different from a storage memory cell. For example, a synapse memory cell is programmed to store one bit per cell; and a storage memory cell can be programmed to store two or more bits per cell. For example, a synapse memory cell is programmed to output a predetermined amount of current to represent a stored value of one when applied a predetermined read voltage; and a storage memory cell is programmed to output more than a threshold amount of current when applied a higher read voltage for a voltage region and to output a negligible amount of current when applied a lower read voltage for a voltage region.

The digital camera 501 can configure a portion of the memory cell array 113 as synapse memory cells storing artificial neuron weight matrices 341 for one or more artificial neural networks and other weight matrices 371 for image compression. For example, a few layers (e.g., 303, 305) of the memory cell array 113 can be used by the digital camera as synapse memory cells to store the weight matrices 341 and 371 to support multiplication and accumulation operations.

The digital camera 501 can configure the remaining portion of the memory cell array 113 as storage memory cells storing computation instructions 345 and backup data. For example, the backup data can include a compressed version of the weight matrices 341 and 371. Optionally, the backup data can include a compressed version of the computation instructions 345.

The digital camera 501 can use the portion of storage memory cells not used for the computation instructions 345 and backup data to store image data 505. As more image data 505 is stored into the memory cell array 113, the size of free space shrinks.

For example, a few layers (e.g., 303, 308) of the memory cell array 113 can be used by the digital camera 501 as storage memory cells to store image data 505, computation instructions 345 and 531, and backup data.

When the free space is reduced to a threshold (e.g., zero or an amount close to zero), the digital camera 501 can erase some of the synapse memory cells storing an out of date version of the artificial neuron weight matrices 341 for use as storage memory cells for storing further image data 505. If more storage memory cells are needed, the digital camera 501 can erase some of the synapse memory cells storing the weight matrices 371. Subsequently, if further storage memory cells are needed, the digital camera 501 can further erase a portion of the synapse memory cells storing the artificial neuron weight matrices 341 for use as storage memory cells for image data 505.

In some implementations, the digital camera 501 can erase the entire set of synapse memory cells in the memory cell array 113 and free them to store image data 505.

Optionally, the digital camera 501 can also erase the computation instructions 345 and 531 to store image data 505.

Some of the stored image data 505 can be erased after a period of time. For example, when the computer system 511 has downloaded a portion of the stored image data 505, the portion can be erased from the memory cell array 113. For example, when the computer system 511 indicates that a portion of the stored image data 505 is not of interest, the portion of no interest can be erased. For example, the computer system 511 can send an instruction to the digital camera 501 to erase a portion of, or the entire set of, the stored image data 505.

After erasing at least a portion of the image data 505, the memory cell array 113 can have sufficient free spaces to recover the erased computation instructions 345 and 531 and weight matrices 371 and 341. For example, the microprocessor 337 of the digital camera 501, or the inference logic circuit 123, can decompress the backup data to recover the weight matrices 371 and 341 and the computation instructions 345 and 531.

In some implementations, the backup data is not stored in the memory cell array 113; and the digital camera 501 can request the computer system 511 to provide a copy of the backup data for decompressing in the buffer 343 for recovery of the inference capability of the integrated circuit device 101.

Figure 22:
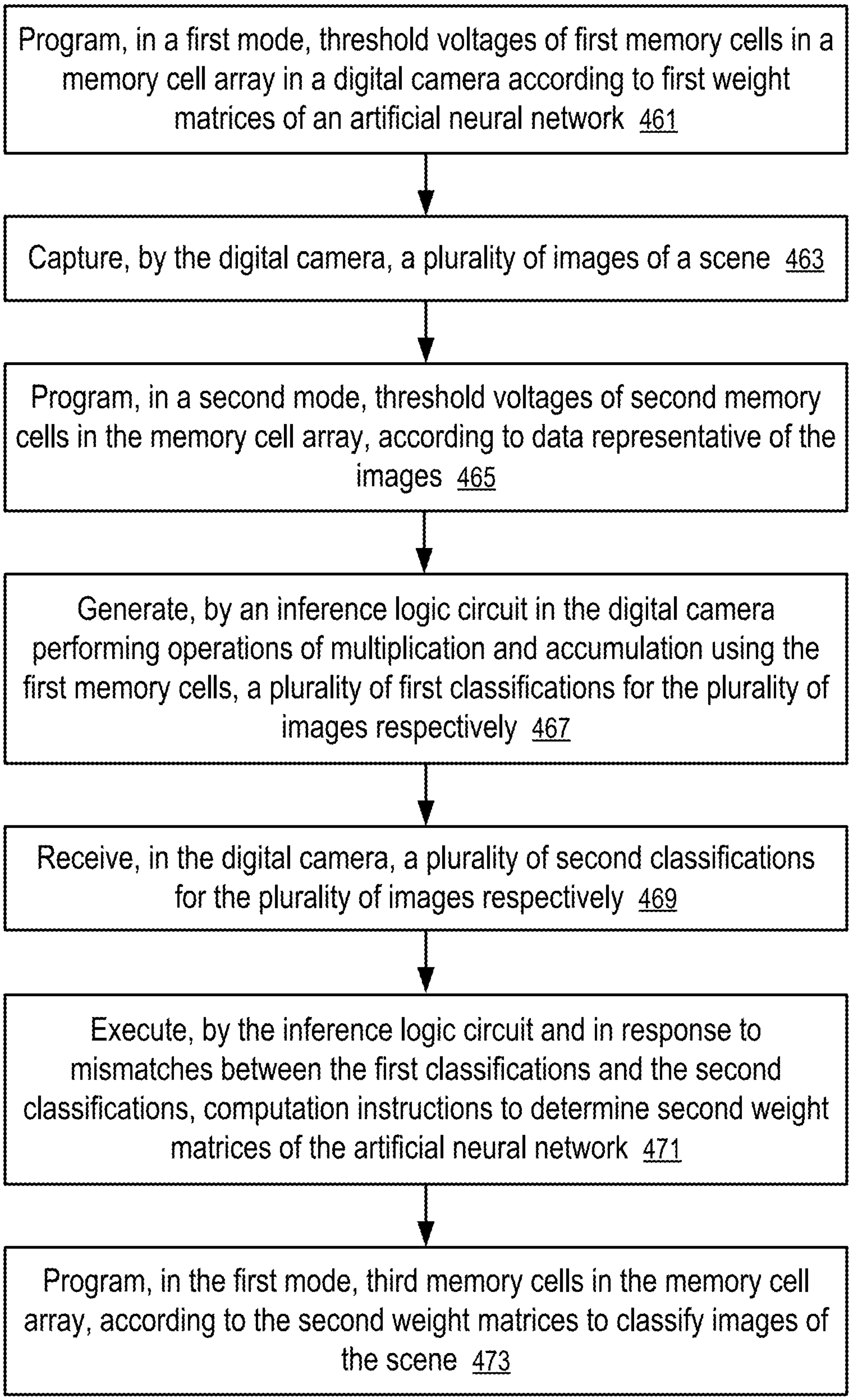
FIG. 22 shows a method in a digital camera according to one embodiment.

FIG. 22 shows a method in a digital camera according to one embodiment.

For example, the method of FIG. 22 can be implemented in the digital cameras 501 of FIG. 18 and FIG. 19, with the techniques of FIG. 20 to generate training data 541 and the techniques of FIG. 21 to update artificial neuron weight matrices 341.

At block 461, an integrated circuit device 101 of a digital camera 501 programs, in a first mode, threshold voltages of first memory cells in a memory cell array 113 in the integrated circuit device 101 according to first weight matrices 341 of an artificial neural network.

For example, the digital camera 501 can have a first integrated circuit die 103 having the image sensing pixel array 111 as part of the integrated circuit device 101 or a separate image sensor 333. The integrated circuit device 101 can have a second integrated circuit die 109 having an image processing logic circuit 121 and an inference logic circuit 123. The integrated circuit device 101 can have a third integrated circuit die 105 having a memory cell array 113 configured as a plurality of layers (e.g., 303, 305, 307, 308), each containing wordlines, bitlines, and memory cells connected to the wordlines to receive voltages and connected to bitlines to output currents. Memory cells 301 in the array 113 can be programmed in the first mode as synapse memory cells to facilitate operations of multiplication and accumulation, or programmed in a second mode as storage memory cells to store data. The second integrated circuit die 109 and the third integrated circuit die 105 can be connected via heterogeneous direct bonding or hybrid bonding. The integrated circuit device 101 can have an integrated circuit package configured to enclose at least the second integrated circuit die 109 and the third integrated circuit die 105. The integrated circuit device 101 can have an interface 125. The digital camera 501 can have an interconnect 331 connecting the transceiver 507, a microprocessor 337, a memory 335 of the microprocessor 337, and the interface 125.

For example, memory cells programmed in the first mode can be used as synapse memory cells in multiplier-accumulator units 270. An array 273 of synapse memory cells storing a weight matrix 341 or 371 can be used in the multiplier-accumulator units 270 by concurrently reading rows of memory cells connected on a plurality of wordlines 281, 282, . . . , 283 according to bits of a column of inputs (e.g., 280).

For example, a respective memory cell 301 in the memory cell array 113 is configured to store one bit per cell, when programmed in the first mode.

For example, a respective memory cell 301 in the memory cell array 113 is configured to output, when programmed in the first mode and in response to a predetermined read voltage representative of an input bit having a value of one, into a bitline either a predetermined amount of current 232 to represent a value of one stored in the respective memory cell 301, or a negligible amount of current to represent a value of zero stored in the respective memory cell 301.

In contrast, the respective memory cell 301 in the memory cell array 113 can alternatively be programmed in a second mode to function as a storage memory cell.

For example, the respective memory cell 301 in the memory cell array 113 can be configured to store more than one bit per cell, when programmed in the second mode. For example, the threshold voltage of the respective memory cell 301 can be programmed to one of a plurality of voltage regions used to represent a plurality of values respectively.

The respective memory cell 301 in the memory cell array 113 is configured to output, when programmed in the second mode and in response to a lower read voltage of a voltage region representing a value among the plurality of values, a negligible amount of current and to output, when programmed in the second mode and in response to a higher read voltage of the voltage region, more than a threshold amount of current.

At block 463, the digital camera 501 can capture a plurality of images 523 of a scene 521.

At block 465, the integrated circuit device 101 programs, in a second mode, threshold voltages of second memory cells in the memory cell array 113, according to data representative of the images 523.

In general, the images 523 stored as part of training data 541 can be a subset of images of the scene 521 recorded in the memory cell array 113.

Optionally, during a training session, the user can arrange to have the scene 521 to illustrate different conditions. During the training session, the user can use the computer system 511 to control the capture of images 523 and specify classifications 529 of the captured images 523. During the training session, reports, alerts, notifications, alarms, etc., can be suppressed.

Subsequently, the digital camera 501 can operate in a monitoring mode in which the digital camera 501 captures an image of the monitored scene 521 periodically. The user can use the computer system 511 to request images recorded during the monitoring in response to a report, an alert, a notification, or an alarm generated by the digital camera 501, or periodically, or both. During the review 527, the user can optionally select recorded images 523 as part of the training data 541 and specify classifications 529 of the selected images 523.

In general, the images 523 selected for the training data 541 can include images 523 having classifications in a predetermined category of interest to the user, and images 523 having classifications outside of the predetermined category. In some applications, when the images 523 of the scene 521 having classifications in the predetermined category are difficult to produce in a training session, the digital camera 501 can be initially trained to recognize the images of classifications outside of the predetermined category (e.g., normal conditions) so that when an image has sufficiently deviations from the training images outside of the predetermined category, the artificial neural network can classify the image as in the predetermined category (e.g., representative of abnormal conditions) to trigger a report, an alert, a notification, an alarm, etc.

At block 467, an inference logic circuit 123 in the digital camera 501 generates, via performing operations of multiplication and accumulation using the first memory cells, a plurality of first classifications 525 for the plurality of images respectively.

At block 469, the digital camera 501 receives, via the transceiver 507 from a computer system 511, a plurality of second classifications 529 for the plurality of images 523 respectively.

For example, in response to receiving the second classifications 529, the microprocessor 337 can send commands to the interface 125 of the integrated circuit device 101 to update meta data of the images 523 recorded in the memory cell array 113. The updated meta data of the images 523 identifies the second classifications for the images 523 to cause the integrated circuit device 101 to preserve the images 523 as part of training data 541.

At block 471, the inference logic circuit 123 executes, in response to mismatches between the first classifications 525 and the second classifications 529, computation instructions 531 to determine adjustments 533 to the first weight matrices 341 to generate second weight matrices 341 of the artificial neural network.

For example, the computation instructions 531 can be configured implement a supervised machine learning technique, or a reinforcement learning technique. Through the collection of training data 541 and machine learning from the training data 541, the digital camera 501 can adapt to be more precise in classifying the conditions of the scene 521 as captured in the images taken by the digital camera 501. A user can be notified when the condition of interest to the user, as represented by one or more classifications in a predetermined category, is detected by the digital camera 501.

At block 473, the integrated circuit device 101 programs, in the first mode, third memory cells in the memory cell array 113, according to the second weight matrices to classify images of the scene 521.

For example, in response to the image sensing pixel array 111 or the image sensor 333 captures an image and the inference logic circuit 123 computes, using the weight matrices 341 of the artificial neural network, a classification being in a predetermined category, the microprocessor 337 of the digital camera 501 can generate a report, an alert, a notification, or an alarm, or any combination thereof. In response, a user can use the computer system 511 to retrieve the image from the digital camera for review 527 and optionally provide a classification 529 to preserve the image as part of training data 541 stored in the memory cell array 113. Alternatively, the user can indicate that the image can be deleted.

Integrated circuit devices 101 (e.g., as in FIG. 1, FIG. 2, FIG. 3, FIG. 9, FIG. 10, FIG. 18, and FIG. 19) can be configured as a storage device, a memory module, or a hybrid of a storage device and memory module. Examples of a storage device include a solid-state drive (SSD), a flash drive, a universal serial bus (USB) flash drive, an embedded multi-media controller (eMMC) drive, a universal flash storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The integrated circuit devices 101 (e.g., as in FIG. 1, FIG. 2, FIG. 3, FIG. 9, FIG. 10, FIG. 18, and FIG. 19) can be installed in a computing system as a memory sub-system having an embedded image sensor and an inference computation capability. Such a computing system can be a computing device such as a desktop computer, a laptop computer, a network server, a mobile device, a portion of a vehicle (e.g., airplane, drone, train, automobile, or other conveyance), an internet of things (loT) enabled device, an embedded computer (e.g., one included in a vehicle, industrial equipment, or a networked commercial device), or such a computing device that includes memory and a processing device.

In general, a computing system can include a host system that is coupled to one or more memory sub-systems (e.g., integrated circuit device 101 of FIG. 1, FIG. 2, FIG. 3, FIG. 9, FIG. 10, FIG. 18, and FIG. 19). In one example, a host system is coupled to one memory sub-system. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

For example, the host system can include a processor chipset (e.g., processing device) and a software stack executed by the processor chipset. The processor chipset can include one or more cores, one or more caches, a memory controller (e.g., NVDIMM controller), and a storage protocol controller (e.g., PCIe controller, SATA controller). The host system uses the memory sub-system, for example, to write data to the memory sub-system and read data from the memory sub-system.

The host system can be coupled to the memory sub-system via a physical host interface. Examples of a physical host interface include, but are not limited to, a serial advanced technology attachment (SATA) interface, a peripheral component interconnect express (PCIe) interface, a universal serial bus (USB) interface, a fibre channel, a serial attached SCSI (SAS) interface, a double data rate (DDR) memory bus interface, a small computer system interface (SCSI), a dual in-line memory module (DIMM) interface (e.g., DIMM socket interface that supports double data rate (DDR)), an open NAND flash interface (ONFI), a double data rate (DDR) interface, a low power double data rate (LPDDR) interface, a compute express link (CXL) interface, or any other interface. The physical host interface can be used to transmit data between the host system and the memory sub-system. The host system can further utilize an NVM express (NVMe) interface to access components (e.g., memory devices) when the memory sub-system is coupled with the host system by the PCIe interface. The physical host interface can provide an interface for passing control, address, data, and other signals between the memory sub-system and the host system. In general, the host system can access multiple memory sub-systems via a same communication connection, multiple separate communication connections, or a combination of communication connections.

The processing device of the host system can be, for example, a microprocessor, a central processing unit (CPU), a processing core of a processor, an execution unit, etc. In some instances, the controller can be referred to as a memory controller, a memory management unit, or an initiator. In one example, the controller controls the communications over a bus coupled between the host system and the memory sub-system. In general, the controller can send commands or requests to the memory sub-system for desired access to memory devices. The controller can further include interface circuitry to communicate with the memory sub-system. The interface circuitry can convert responses received from the memory sub-system into information for the host system.

The controller of the host system can communicate with the controller of the memory sub-system to perform operations such as reading data, writing data, or erasing data at the memory devices, and other such operations. In some instances, the controller is integrated within the same package of the processing device. In other instances, the controller is separate from the package of the processing device. The controller or the processing device can include hardware such as one or more integrated circuits (ICs), discrete components, a buffer memory, or a cache memory, or a combination thereof. The controller or the processing device can be a microcontroller, special-purpose logic circuitry (e.g., a field programmable gate array (FPGA), an application specific integrated circuit (ASIC), etc.), or another suitable processor.

The memory devices can include any combination of the different types of non-volatile memory components and volatile memory components. The volatile memory devices can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, or a PLC portion of memory cells, or any combination thereof. The memory cells of the memory devices can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), spin transfer torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller (or controller for simplicity) can communicate with the memory devices to perform operations such as reading data, writing data, or erasing data at the memory devices and other such operations (e.g., in response to commands scheduled on a command bus by controller). The controller can include hardware such as one or more integrated circuits (ICs), discrete components, or a buffer memory, or a combination thereof. The hardware can include digital circuitry with dedicated (i.e., hard-coded) logic to perform the operations described herein. The controller can be a microcontroller, special-purpose logic circuitry (e.g., a field programmable gate array (FPGA), an application specific integrated circuit (ASIC), etc.), or another suitable processor.

The controller can include a processing device (processor) configured to execute instructions stored in a local memory. In the illustrated example, the local memory of the controller includes an embedded memory configured to store instructions for performing various processes, operations, logic flows, and routines that control operation of the memory sub-system, including handling communications between the memory sub-system and the host system.

In some embodiments, the local memory can include memory registers storing memory pointers, fetched data, etc. The local memory can also include read-only memory (ROM) for storing micro-code. While the example memory sub-system includes a controller, in another embodiment of the present disclosure, a memory sub-system does not include a controller, and can instead rely upon external control (e.g., provided by an external host, or by a processor or controller separate from the memory sub-system).

In general, the controller can receive commands or operations from the host system and can convert the commands or operations into instructions or appropriate commands to achieve the desired access to the memory devices. The controller can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices. The controller can further include host interface circuitry to communicate with the host system via the physical host interface. The host interface circuitry can convert the commands received from the host system into command instructions to access the memory devices as well as convert responses associated with the memory devices into information for the host system.

The memory sub-system can also include additional circuitry or components that are not illustrated. In some embodiments, the memory sub-system can include a cache or buffer (e.g., DRAM) and address circuitry (e.g., a row decoder and a column decoder) that can receive an address from the controller and decode the address to access the memory devices.

In some embodiments, the memory devices include local media controllers that operate in conjunction with the memory sub-system controller to execute operations on one or more memory cells of the memory devices. An external controller (e.g., memory sub-system controller) can externally manage the memory device (e.g., perform media management operations on the memory device). In some embodiments, a memory device is a managed memory device, which is a raw memory device combined with a local media controller for media management within the same memory device package. An example of a managed memory device is a managed NAND (MNAND) device.

The controller or a memory device can include a storage manager configured to implement storage functions discussed above. In some embodiments, the controller in the memory sub-system includes at least a portion of the storage manager. In other embodiments, or in combination, the controller or the processing device in the host system includes at least a portion of the storage manager. For example, the controller, the controller, or the processing device can include logic circuitry implementing the storage manager. For example, the controller, or the processing device (processor) of the host system, can be configured to execute instructions stored in memory for performing the operations of the storage manager described herein. In some embodiments, the storage manager is implemented in an integrated circuit chip disposed in the memory sub-system. In other embodiments, the storage manager can be part of firmware of the memory sub-system, an operating system of the host system, a device driver, or an application, or any combination therein.

In one embodiment, an example machine of a computer system within which a set of instructions, for causing the machine to perform any one or more of the methods discussed herein, can be executed. In some embodiments, the computer system can correspond to a host system that includes, is coupled to, or utilizes a memory sub-system or can be used to perform the operations described above. In alternative embodiments, the machine can be connected (e.g., networked) to other machines in a LAN, an intranet, an extranet, or the internet, or any combination thereof. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, a network-attached storage facility, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system includes a processing device, a main memory (e.g., read-only memory (ROM), flash memory, dynamic random access memory (DRAM) such as synchronous DRAM (SDRAM) or Rambus DRAM (RDRAM), static random access memory (SRAM), etc.), and a data storage system, which communicate with each other via a bus (which can include multiple buses).

Processing device represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device can also be one or more special-purpose processing devices such as an application specific integrated circuit (ASIC), a field programmable gate array (FPGA), a digital signal processor (DSP), network processor, or the like. The processing device is configured to execute instructions for performing the operations and steps discussed herein. The computer system can further include a network interface device to communicate over the network.

The data storage system can include a machine-readable medium (also known as a computer-readable medium) on which is stored one or more sets of instructions or software embodying any one or more of the methodologies or functions described herein. The instructions can also reside, completely or at least partially, within the main memory and within the processing device during execution thereof by the computer system, the main memory and the processing device also constituting machine-readable storage media. The machine-readable medium, data storage system, or main memory can correspond to the memory sub-system.

In one embodiment, the instructions include instructions to implement functionality corresponding to the operations described above. While the machine-readable medium is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to convey the substance of their work most effectively to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. Such a computer program can be stored in a computer readable storage medium, such as, but not limited to, any type of disk including floppy disks, optical disks, CD- ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special-purpose circuitry, with or without software instructions, such as using application-specific integrated circuit (ASIC) or field-programmable gate array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:

an integrated circuit package;

memory cells configured an array in the integrated circuit package; and a logic circuit configured in the integrated circuit package;

wherein the logic circuit is configured to program the memory cells in a first mode and program the memory cells in a second mode, different from the first mode, to store data;

wherein the logic circuit is further configured to perform operations of an artificial neural network;

wherein the logic circuit is further configured to perform operations of the artificial neural network using a first subset of the memory cells in processing an input stored in a second subset of the memory cells; and wherein the logic circuit is further configured to program, in the first mode, threshold voltages of the first subset of the memory cells according to the first weight matrices of the artificial neural network.

2. The device of claim 1, wherein the logic circuit is further configured to program, in the first mode to store a bit value of one, a respective memory cell in the array to cause the respective memory cell to output a predetermined amount of current in response to a predetermined read voltage.

3. The device of claim 2, wherein the logic circuit is further configured to program, in the first mode to store a bit value of zero, the respective memory cell in the array to cause the respective memory cell to output a negligible amount of current in response to the predetermined read voltage.

4. The device of claim 3, wherein the logic circuit is further configured to program, in the second mode to store a first value, the respective memory cell to cause the respective memory cell to output a negligible amount of current in response to a first read voltage.

5. The device of claim 4, wherein the logic circuit is further configured to program, in the second mode to store a second value, the respective memory cell to cause the respective memory cell to output more than a threshold amount of current in response to a second read voltage.

6. The device of claim 5, wherein the logic circuit is further configured to program the respective memory cell to store one bit per cell the first mode and program the respective memory cell to store more than one bit per cell in the second mode.

7. The device of claim 6, further comprising:

an image sensing pixel array configured to capture images as inputs to the artificial neural network.

8. The device of claim 7, wherein the logic circuit is further configured to use the artificial neural network to generate first classifications for the images respectively.

9. The device of claim 8, wherein the logic circuit is further configured to receive second classifications for the images respectively, determine second weight matrices of the artificial neural network based on mismatches between the first classifications and the second classifications, and program a third subset of the memory cells in the first mode according to the second weight matrices.

10. The device of claim 9, further comprising:

a transceiver, wherein the logic circuit is further configured to transmit, using the transceiver, a report, an alert, a notification, or an alarm, or any combination thereof, in response to a classification, determined by the artificial neural network, of an image captured by the image sensing pixel array being in a predetermined category.

11. A method, comprising:

programming, in a first mode, a first subset of memory cells configured as an array in an integrated circuit package;

programming, in a second mode, a second subset of the memory cells to store data representative of an input to the artificial neural network, wherein each respective memory cell in the array is programmable in the first mode and programmable in the second mode, different from the first mode, to store data;

performing operations of an artificial neural network using the first subset of the memory cells in processing the input stored in the second subset of the memory cells;

wherein when programmed in the first mode to store a bit value of one, the respective memory cell in the array outputs a predetermined amount of current in response to a predetermined read voltage.

12. The method of claim 11, wherein when programmed in the first mode to store a bit value of zero, the respective memory cell in the array outputs a negligible amount of current in response to the predetermined read voltage; and wherein when programmed in the second mode to store a first value, the respective memory cell outputs a negligible amount of current in response to a first read voltage.

13. The method of claim 12, wherein when programmed in the second mode to store a second value, the respective memory cell outputs more than a threshold amount of current in response to a second read voltage; and wherein the respective memory cell is programmed to store one bit per cell in the first mode and store more than one bit per cell in the second mode.

14. The method of claim 13, further comprising:

capturing, using an image sensing pixel array, images as inputs to the artificial neural network; and generating first classifications for the images respectively using the artificial neural network.

15. The method of claim 14, further comprising:

receiving second classifications for the images respectively;

determining second weight matrices of the artificial neural network based on mismatches between the first classifications and the second classifications; and programming a third subset of the memory cells in the first mode according to the second weight matrices.

16. A device, comprising:

an image sensing pixel array;

an array of memory cells, wherein each respective memory cell in the array has a threshold voltage programmable in a first mode and programmable in a second mode to store data;

a transceiver; and a circuit configured to:

program, in the first mode, a first subset of the memory cells;

program, in the second mode, a second subset of the memory cells to store data representative of images captured by the image sensing pixel array;

perform operations using the first subset of the memory cells in determination of first classifications for the images respectively;

receive, via the transceiver and from a computer system, second classifications for the images respectively; and reduce mismatches between classifications.

17. The device of claim 16, wherein the circuit is further configured to reduce mismatches between classifications computed using an artificial neural network for the images and the second classifications;

wherein the respective memory cell programmed in the first mode to store a value of one is configured to output, in response to a predetermined read voltage, a predetermined amount of current; and wherein the respective memory cell programmed in the second mode to store a value associated with a voltage region configured between a first voltage and a second voltage higher than the first voltage is configured to:

output, in response to the first voltage, a negligible amount of current; and output, in response to the second voltage, more than a threshold amount of current.

18. The device of claim 17, wherein the respective memory cell programmed in the first mode is configured to store one bit per cell; and wherein the respective memory cell programmed in the second mode is configured to store more than one bit per cell.

* * * * *